(12) United States Patent
Lee et al.

(10) Patent No.: US 12,362,855 B2
(45) Date of Patent: Jul. 15, 2025

(54) METHOD AND APPARATUS FOR TRANSMITTING AND RECEIVING POLAR CODE

(71) Applicants: Samsung Electronics Co., Ltd., Suwon-si (KR); Research & Business Foundation Sungkyunkwan University, Suwon-si (KR)

(72) Inventors: Donghun Lee, Suwon-si (KR); Minchul Kim, Suwon-si (KR); Sang-Hyo Kim, Suwon-si (KR); Hyosang Ju, Suwon-si (KR); Jisang Park, Suwon-si (KR)

(73) Assignees: Samsung Electronics Co., Ltd., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 129 days.

(21) Appl. No.: 18/318,245

(22) Filed: May 16, 2023

(65) Prior Publication Data
US 2024/0014931 A1    Jan. 11, 2024

(30) Foreign Application Priority Data

May 16, 2022  (KR) .................. 10-2022-0059774
May 15, 2023  (KR) .................. 10-2023-0062695

(51) Int. Cl.
*H04L 1/00* (2006.01)
(52) U.S. Cl.
CPC .......... *H04L 1/0057* (2013.01); *H04L 1/0071* (2013.01)

(58) Field of Classification Search
CPC ............... H03M 13/015; H03M 13/13; H03M 13/2792; H03M 13/611; H03M 13/6312;
(Continued)

(56) References Cited

U.S. PATENT DOCUMENTS 10,461,778 B2   10/2019  Jeong et al.
11,166,177 B2*  11/2021  Li .................. H04L 1/0041
(Continued)

FOREIGN PATENT DOCUMENTS

KR    10-2157667 B1    9/2020

OTHER PUBLICATIONS

Min Jang et al., "Rate Matching for Polar Codes Based on Binary Domination," in IEEE Transactions on Communications, vol. 67, No. 10, pp. 6668-6681, Oct. 2019. (Year: 2019).*
(Continued)

*Primary Examiner* — Albert Decady
*Assistant Examiner* — Enamul M Kabir
(74) *Attorney, Agent, or Firm* — Jefferson IP Law, LLP

(57) ABSTRACT

A 5th generation (5G) or 6th generation (6G) communication system for supporting a higher data rate than a beyond 4th generation (4G) communication system, such as long-term evolution (LTE) is provided. An electronic device performs interleaving on codeword bits, according to a polar code sequence corresponding to the codeword bits, allocates the interleaved codeword bits respectively to blocks, and transmits at least one symbol generated as a result of performing modulation on the interleaved codeword bits for each block, based on the allocation, on at least one resource block corresponding to each of the blocks.

20 Claims, 42 Drawing Sheets

(58) Field of Classification Search
CPC ............. H03M 13/6575; H04L 1/0041; H04L 1/0057; H04L 1/0068; H04L 1/0071
See application file for complete search history.

(56) References Cited

U.S. PATENT DOCUMENTS

| | | | | |
|---|---|---|---|---|
| 2016/0365977 | A1* | 12/2016 | Boutros | H04L 9/085 |
| 2017/0338996 | A1* | 11/2017 | Sankar | H04L 1/0041 |
| 2020/0287659 | A1* | 9/2020 | Ye | H03M 13/13 |
| 2020/0403638 | A1* | 12/2020 | Kamenev | H03M 13/13 |
| 2022/0278698 | A1* | 9/2022 | Koike-Akino | G06F 13/4027 |
| 2023/0034299 | A1* | 2/2023 | Jang | H03M 13/6362 |
| 2024/0007226 | A1* | 1/2024 | Wu | H04L 1/0042 |

OTHER PUBLICATIONS

M. Jang et al., "Puncturing and Shortening for Polar Codes via the Partial Order by Binary Domination," 2019 IEEE International Symposium on Information Theory (ISIT), Paris, France, 2019, pp. 1767-1771, (Year: 2019).*

M. Oda and T. Saba, "Polar Coding with Enhanced Channel Polarization under Frequency Selective Fading Channels," 2018 IEEE International Conference on Communications (ICC), Kansas City, MO, USA, 2018, pp. 1-6, (Year: 2018).*

T. Koike-Akino, Y. Wang, S. C. Draper, K. Sugihara and W. Matsumoto, "Bit-interleaved polar-coded OFDM for low-latency M2M wireless communications," 2017 IEEE International Conference on Communications (ICC), Paris, France, 2017, pp. 1-7. (Year: 2017).*

Arikan, Channel polarization: a method for constructing capacity-achieving codes for symmetric binary-input memoryless channels, IEEE, Jul. 20, 2009.

Tal et al., List decoding of polar codes,IEEE, May 31, 2012.

Niu et al., CRC-aided decoding of polar codes, IEEE, Oct. 2012.

Mori et al. Performance of polar codes with the construction using density evolution, IEEE, Jul. 2009.

Trifonov, Efficient design and decoding of polar codes,IEEE, Nov. 2012.

3GPP, NR; Multiplexing and channel coding, TS. 38.212, v 15.3.0, Sep. 2018.

Jang et al., Rate-matching for polar codes based on binary domination,IEEE, Jan. 8, 2019.

Ju et al., Diversity Guaranteeing Transmission of Polar Codes over Block Fading Channels, GLOBECOM 2022.

* cited by examiner

| Index | Stage-3 | Stage-2 | Stage-1 | Stage-0 |
|---|---|---|---|---|
| 1 | A | AB | AB·AB=AB | AB |
| 2 | A | AB | AB·AB=AB | AB |
| 3 | A | AB | | AB |
| 4 | A | AB | | AB |
| 5 | B | A+B | (A+B)(A+B)=A+B | A+B |
| 6 | B | A+B | (A+B)(A+B)=A+B | A+B |
| 7 | B | A+B | (A+B)(A+B)=A+B | A+B |
| 8 | B | A+B | (A+B)(A+B)=A+B | A+B |

FIG. 23

| 63 | 62 | 61 | 59 | 55 | 47 | 31 | 60 | 58 | 57 | 54 | 53 | 46 | 51 | 45 | 30 | 43 | 29 | 39 | 28 | 56 | 23 | 52 | 15 | 50 | 44 | 49 | 42 | 28 | 41 | 38 | 22 |
|----|----|----|----|----|----|----|----|----|----|----|----|----|----|----|----|----|----|----|----|----|----|----|----|----|----|----|----|----|----|----|----|
| 25 | 37 | 26 | 35 | 21 | 14 | 48 | 13 | 19 | 40 | 11 | 7  | 36 | 24 | 34 | 20 | 33 | 12 | 18 | 10 | 17 | 6  | 9  | 5  | 3  | 32 | 16 | 8  | 4  | 2  | 1  | 0  |

| 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 3 | 2 | 3 | 2 |
|---|---|---|---|---|---|---|---|---|---|---|---|---|---|---|---|---|---|---|---|---|---|---|---|---|---|---|---|---|---|---|---|
| 1 | 2 | 2 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |

No interleaving

| N | 32 | 64 | 128 | 256 | 512 | 1024 |
|---|---|---|---|---|---|---|
| $K_{max}$ | 6 | 8 | 12 | 17 | 26 | 41 |

Block interle.

| N | 32 | 64 | 128 | 256 | 512 | 1024 |
|---|---|---|---|---|---|---|
| $K_{max}$ | 12 | 4 | 25 | 5 | 81 | 6 |

Triangular interle.

| N | 32 | 64 | 128 | 256 | 512 | 1024 |
|---|---|---|---|---|---|---|
| $K_{max}$ | 12 | 26 | 43 | 109 | 172 | 373 |

Proposed

| N | 32 | 64 | 128 | 256 | 512 | 1024 |
|---|---|---|---|---|---|---|
| $K_{max}$ | 16 | 32 | 64 | 128 | 156 | 512 |

FIG. 36

Rate-matching X → Block (N32 (SI+Block Interleaver)) — Rate-matching

Triangular (N32 (SI+Channel Interleaver))

Proposed (N32 (Modified CCL))

FIG. 38

METHOD AND APPARATUS FOR TRANSMITTING AND RECEIVING POLAR CODE

CROSS-REFERENCE TO RELATED APPLICATION(S)

This application is based on and claims priority under 35 U.S.C. § 119(a) of a Korean patent application number 10-2022-0059774, filed on May 16, 2022, in the Korean Intellectual Property Office, and a Korean patent application number 10-2023-0062695, filed on May 15, 2023 in the Korean Intellectual Property Office, the disclosure of each of which is incorporated by reference herein in its entirety.

JOINT RESEARCH AGREEMENT

The disclosure was made by or on behalf of the below listed parties to a joint research agreement. The joint research agreement was in effect on or before the date the disclosure was made and the disclosure was made as a result of activities undertaken within the scope of the joint research agreement. The parties to the joint research agreement are 1) Samsung Electronics Co., Ltd. and 2) Research & Business Foundation Sungkyunkwan University.

BACKGROUND

1. Field

The disclosure relates to a technology for transmission and reception of a polar code. More particularly, the disclosure relates to a method and apparatus for performing interleaving and deinterleaving for transmission and reception of a polar code.

2. Description of the Related Art

Looking back on processes of development over generations of wireless communication, technologies for human-targeted services, such as voice, multimedia, and data, have been mainly developed. It is expected that connected devices, which have been explosively increasing after the commercialization of 5th generation (5G) communication systems, will be connected to communication networks. Examples of an object connected to a network may include a vehicle, a robot, a drone, a home appliance, a display, smart sensors installed in various infrastructures, a construction machine, and factory equipment. It is expected that mobile devices may evolve into various form factors, such as augmented reality glasses, an augmented reality headset, and a hologram device. In the 6th generation (6G) era, efforts are being made to develop enhanced 6G communication systems so as to provide various services by connecting hundreds of billions of devices and objects to each other. In this regard, 6G communication systems are referred to as beyond 5G communication systems.

The 6G communication systems, which are expected to be realized around 2030, have a maximum data rate of tera (i.e., 1,000 gigabytes) bps and a wireless latency time of 100 microseconds (μsec). In other words, compared to the 5G communication systems, a data rate is increased 50 times and a wireless latency time is reduced to 1/10 in the 6G communication systems.

To achieve such a high data rate and an ultra low latency time, the 6G communication systems are considered to be realized in terahertz (THz) bands (e.g., from 95 gigahertz (GHz) to 3 THz). In the THz bands, it is expected that the importance of a technology for guaranteeing a signal arrival distance, i.e., coverage, will increase due to a severer path loss and atmosphere absorption phenomenon compared to millimeter wave (mmWave) bands introduced in 5G. As a main technology for guaranteeing the coverage, a multiple antenna transmission technology, such as new waveform, beamforming, massive multiple-input and multiple-output (MIMO), full dimensional (FD) MIMO, array antenna, or large scale antenna, which is superior in terms of coverage compared to a radio frequency (RF) device, antenna, and orthogonal frequency division multiplexing (OFDM), needs to be developed. In addition, to improve the coverage of THz band signals, new technologies, such as a metamaterial-based lens and antenna, a high-dimensional space multiplexing technology using orbital angular momentum (OAM), and a reconfigurable intelligent surface (RIS), are being discussed.

Also, to enhance frequency efficiency and improve system networks, in the 6G communication systems, a full duplex technology in which an uplink and a downlink simultaneously use a same frequency resource at a same time, a network technology integrally using a satellite and high-altitude platform stations (HAPSs), a network structure innovative technology supporting a mobile base station and enabling optimization and automation of a network operation, a dynamic spectrum sharing technology through spectrum usage prediction-based collision avoidance, an artificial intelligence (AI)-based communication technology that uses AI from a design stage and realizes system optimization by including an end-to-end AI support function, and a next-generation distributed computing technology that realizes a complex service exceeding the limit of terminal computing capability by using ultra-high performance communication and computing resources (mobile edge computing (MEC), cloud, and the like) are being developed. Moreover, attempts are continued to further strengthen connectivity between devices, further optimize a network, accelerate softwarization of a network entity, and increase openness of wireless communication, through a design of a new protocol to be used in the 6G communication systems, mechanism development for implementing a hardware-based security environment and safely using data, and technology development related to privacy maintaining method.

According to studies on and development of such 6G communication systems, it is expected that a new level of the next hyper-connected experience may become possible through hyper-connectivity of the 6G communication systems including not only a connection between things, but also a connection between a person and a thing. In particular, it is expected that services, such as truly immersive extended reality (XR), high-fidelity mobile hologram, and digital replica, may be provided through the 6G communication systems. In addition, services, such as remote surgery, industrial automation, and emergency response, through security and reliability enhancement may be provided through the 6G communication systems and applied to various fields, such as industry, medical care, vehicles, and home appliances.

The above information is presented as background information only to assist with an understanding of the disclosure. No determination has been made, and no assertion is made, as to whether any of the above might be applicable as prior art with regard to the disclosure.

SUMMARY

Aspects of the disclosure are to address at least the above-mentioned problems and/or disadvantages and to provide at least the advantages described below. Accordingly, an aspect of the disclosure is to provide an interleaving method, a resource allocation method, and a code construction method, which may increase a decoding performance in a block fading channel while maintaining a decoding performance in an additive white Gaussian noise channel, with respect to a bit-interleaved coded modulation (BICM) system to which a general polar code is applied.

Additional aspects will be set forth in part in the description which follows and, in part, will be apparent from the description, or may be learned by practice of the presented embodiments.

In accordance with an aspect of the disclosure, a method, performed by a first electronic device, of transmitting a polar code is provided. The method includes performing interleaving on codeword bits, according to a polar code sequence corresponding to the codeword bits, allocating the interleaved codeword bits respectively to blocks, and transmitting at least one symbol generated as a result of performing modulation on the interleaved codeword bits for each block, based on the allocating, on at least one resource block corresponding to each of the blocks.

In accordance with another aspect of the disclosure, a method, performed by a second electronic device, of receiving a polar code is provided. The method includes obtaining codeword bits by performing demodulation on a signal received from a first electronic device on each of at least one resource block, performing deinterleaving on the codeword bits by using a polar code sequence corresponding to the codeword bits, and performing decoding on a sequence including the deinterleaved codeword bits.

In accordance with another aspect of the disclosure, a first electronic device for transmitting a polar code is provided. The first electronic device includes a transceiver, and at least one processor connected to the transceiver and configured to perform interleaving on codeword bits, according to a polar code sequence corresponding to the codeword bits, allocate the interleaved codeword bits respectively to blocks, and transmit at least one symbol generated as a result of performing modulation on the interleaved codeword bits for each block, based on the allocation, on at least one resource block corresponding to each of the blocks.

In accordance with another aspect of the disclosure, a second electronic device for receiving a polar code is provided. The second electronic device includes a transceiver, and at least one processor connected to the transceiver and configured to obtain codeword bits by performing demodulation on a signal received from a first electronic device on each of at least one resource block, perform deinterleaving on the codeword bits by using a polar code sequence corresponding to the codeword bits, and perform decoding on a sequence including the deinterleaved codeword bits.

According to an embodiment of the disclosure, a computer-readable recording medium may have recorded thereon a program for executing, on a computer, the method according to at least one embodiment of the disclosure.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 2 is a diagram for describing a sequence $Q_{1023}$ and a sequence for N=512, which are adopted in the 5th generation-new radio (5G-NR) standard according to an embodiment of the disclosure;

FIG. 17 is a diagram for describing updating of a fading stochastic variables included in source bits according to an embodiment of the disclosure;

FIG. 23 is a diagram for describing bit indexes arranged in an order of a code sequence $C_N$ and diversity values corresponding thereto according to an embodiment of the disclosure;

FIG. 24 is a diagram showing reliabilities of bits for each of an interleaver and a triangular interleaver, in a descending order, according to an embodiment of the disclosure according to an embodiment of the disclosure;

FIG. 26 is a diagram for comparing the maximum numbers $K_{max}$ of information bits guaranteeing diversity-2, according to an interleaving type and a code length according to an embodiment of the disclosure;

FIG. 36 is a diagram showing diversities included in source bits in an order of a code sequence $C_N$, according to an interleaver type and the number of punctured bits according to an embodiment of the disclosure;

FIG. 38 is a diagram showing diversities included in source bits in an order of a code sequence $C_N$, according to an interleaver type and the number of shortened bits according to an embodiment of the disclosure;

Throughout the drawings, it should be noted that like reference numbers are used to depict the same or similar elements, features, and structures.

DETAILED DESCRIPTION

Figure 1:
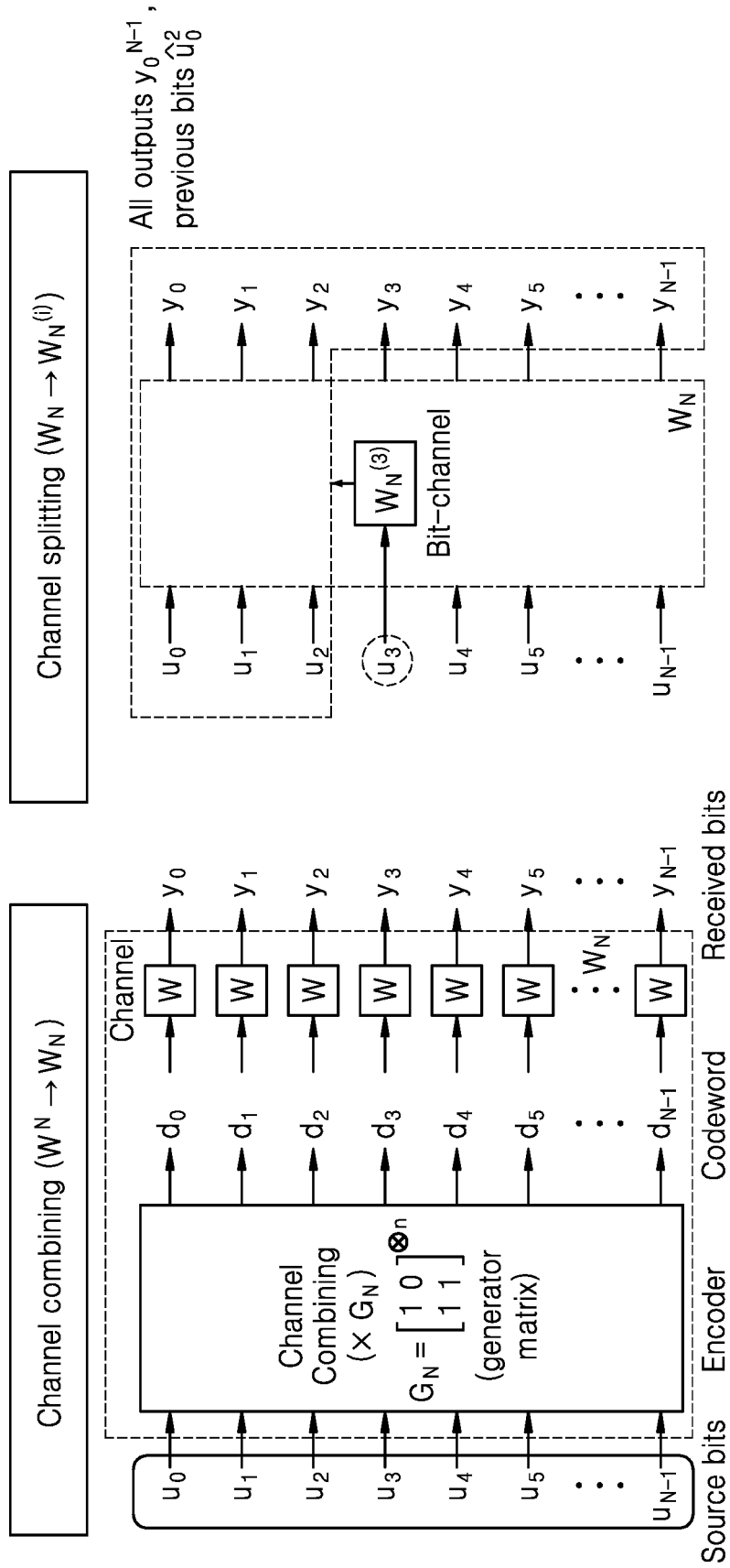
FIG. 1 is a diagram for describing channel combining and channel splitting of a polar code according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Before describing the Detailed Description, certain terms and phrases used throughout the specification will be defined. The term "couple" and the derivatives thereof refer to any direct or indirect communication between two or more elements, regardless of whether the elements physically contact each other. Not only the terms "transmit", "receive", and "communicate", but also the derivatives thereof include both direct communication and indirect communication. The terms "comprise" and "include", as well as the derivatives thereof, denote unlimited inclusion. The term "or" is inclusive and denote "and/or". Not only the phase "associated with", but also the derivatives thereof denote "include", "included in", "interconnected to", "contain", "contained in", "connect or connected to", "couple or coupled to", "able to communicate with", "cooperate with", "interleave", "juxtaposed with", "approach", "related to", "have", "characterized by", or "relevant to".

Also, in the disclosure, it will be understood that when elements are "connected" or "coupled" to each other, the elements may be directly connected or coupled to each other, but may alternatively be connected or coupled to each other with an intervening element therebetween, unless specified otherwise.

As the disclosure allows for various changes and numerous examples, particular embodiments of the disclosure will be illustrated in the drawings and described in detail in the written description. However, this is not intended to limit the embodiments of the disclosure to particular modes of practice, and it will be understood that all changes, equivalents, and substitutes that do not depart from the spirit and technical scope of the disclosure are encompassed in the embodiments of the disclosure.

In the description of embodiments of the disclosure, certain detailed explanations of related art are omitted when it is deemed that they may unnecessarily obscure the essence of the disclosure. Also, numbers (for example, a first, a second, and the like) used in the description of the specification are merely identifier codes for distinguishing one element from another.

In the disclosure, regarding an element represented as a "-er (or)", "unit", or a "module", two or more elements may be combined into one element or one element may be divided into two or more elements according to subdivided functions. In addition, each element described hereinafter may additionally perform some or all of functions performed by another element, in addition to main functions of itself, and some of the main functions of each element may be performed entirely by another component.

It will be understood that blocks in flowcharts or combinations of the flowcharts may be performed by computer program instructions. Because these computer program instructions may be loaded into a processor of a general-purpose computer, special purpose computer, or other programmable data processing apparatus, the instructions, which are executed via the processor of the computer or other programmable data processing apparatus generate means for implementing the functions specified in the flowchart block(s). The computer program instructions may be stored in a computer-executable or computer-readable memory capable of directing a computer or another programmable data processing apparatus to implement a function in a particular manner, and thus the instructions stored in the computer-executable or computer-readable memory may also be capable of producing manufacturing items containing instruction units for performing the functions described in the flowchart block(s). The computer program instructions may also be loaded into a computer or another programmable data processing apparatus, and thus, instructions for operating the computer or the other programmable data processing apparatus by generating a computer-executed process when a series of operations are performed in the computer or the other programmable data processing apparatus may provide operations for performing the functions described in the flowchart block(s).

In addition, each block may represent a portion of a module, segment, or code that includes one or more executable instructions for executing specified logical function(s). It should also be noted that in some alternative implementations, functions mentioned in blocks may occur out of order. For example, two blocks illustrated successively may actually be executed substantially concurrently, or the blocks may sometimes be performed in a reverse order according to the corresponding function.

Channel coding is a technique for transmitting a message with high reliability by using redundancy bits when transmitting data, and to this end, the use of an error correction code is important. Claude Shannon has defined a maximum information transmission amount for reliable communication as channel capacity, and since then, studies have been conducted on numerous error correction codes to approach channel capacity. Starting with classic codes, such as Hamming, Bose-Chaudhuri-Hocquenghem (BCH), and Reed-Solomon (RS) codes, various modern codes, such as turbo codes, low-density parity-check (LDPC) codes, and polar codes, have been newly proposed, wherein the LDPC codes are referred to as representative capacity-approaching codes.

Thereamong, the polar codes are error correction codes first proposed by Arikan in 2009, and are first codes that have been theoretically demonstrated that when a code length increases in various types of binary-input discrete memoryless channels (BI-DMC), channel capacity is asymptotically achieved (capacity-achieving).

In particular, the polar codes secure excellent performances by simultaneously using cyclic redundancy check (CRC) codes and parity-check (PC) codes through the 3rd generation partnership project (3GPP) 5th generation (5G) standardization process, and have been adopted as error correction codes for enhanced mobile broadband (eMBB) control channels, based thereon. In addition, the polar codes are considered as channel code candidates for beyond 5G (B5G) and 6th generation (6G) communication, based on strong decoding performances in short lengths.

Following 5G communication, B5G and 6G communication require deep studies on code constructions or coding and decoding techniques, which may guarantee excellent performances for more practical channel models. The 6G communication has high requirements, such as ultra-high bandwidth, ultra-high reliability, and ultra-low latency, and has low latency conditions and diversity of channels. Here, to secure diversity, an encoded signal may be transmitted through a non-homogeneous or non-ergodic channels and resources. For example, in the 5G communication, scenarios of frequency hopping or resource allocation type (3GPP, new radio (NR); Multiplexing and channel coding, TS 38.212, v 15.2.0, September 2018, hereinafter, 3GPP-1), which allocate a modulated codeword to two or more different resource blocks, are considered. When high diversity is securable by effectively using a given non-homogeneous channel, a further excellent decoding performance may be provided by supplementing weaknesses of a polar-coded bit-interleaved coded modulation (BICM) construction of On the other hand, in conventional codes and 5G-NR codes showing excellent performances in additive white Gaussian noise channels (AWGNCs) or flat fading channels, when certain bit patterns are simultaneously faded in non-ergodic block fading channels or multi-block fading channels, decoding performances may greatly decrease due to structural features of polar codes. Because a conventional BICM system includes a bit interleaver, codeword bits are evenly spread over fading blocks, and thus it is possible to obtain a certain degree of diversity. However, it is unable to provide a construction that consistently guarantees diversity for various code parameters during decoding.

The disclosure proposes reinforced polarized BICM construction and transmission technologies, which improve block error rate (BLER) performances in a nonergodic block fading channel transmission environment while maintaining an AWGNC performance under successive cancellation (SC) decoding, through a BICM construction that aligns high diversity to information bits of pre-constructed polar codes.

FIG. 1 is a diagram for describing channel combining and channel splitting of a polar code according to an embodiment of the disclosure.

Polar codes are error correction codes for theoretically achieving channel capacity, and obtain channels highly suitable for communication and channels unsuitable for communication due to low reliability, through a two-stage process of channel combining and channel splitting.

Referring to FIG. 1, codeword bits $x_i (i \in \mathbb{Z}_N)$ are generated through multiplication of N source bits $u_i (i \in \mathbb{Z}_N = \{0, 1, \ldots, N-1\})$ and a generator matrix $$G_N = G_2^{\otimes n}\left(G_2 = \begin{pmatrix} 1 & 0 \\ 1 & 1 \end{pmatrix}\right),$$

$(\cdot)^\otimes$ with a Kronecker product. A relationship between a codeword vector x and a source vector u may be represented as $x = uG_N$. Then, each codeword bit may go through a modulation process and then pass through an independent and identically distributed (i.i.d.) channel W, and thus a reception signal $y_i (i \in \mathbb{Z}_N)$ may be generated. Here, one large combined channel $W_N$ using a bit vector of a $u=(u_0, \ldots, u_{N-1})$ domain as an input and a reception signal y as an output may be obtained, and such a process is referred to as channel combining. Channel splitting refers to a process of obtaining virtual channels (split channels or bit channels) $W_n^{(i)}(y_0^{N-1}, u_0^{i-1}|u_i)$ ($i \in \mathbb{Z}_N = \{0, 1, \ldots, N-1\}$) experienced by each source bit, from the combined channel $W_N$. A polar code uses a one-bit sequential decoding method, and decoding may be performed with the help of all reception signals $y_0^{N-1} = (y_0, \ldots, y_{N-1})$ and values $(\hat{u}_0^{i-1})$ of previously decoded source bits, when determining a value of an ith source bit. In other words, a value of a source bit is determined according to a log-likelihood ratio (LLR) code of a probability that $y_0^{N-1}$ and $u_0^{i-1}$ may be obtained when $u_i = 1$, and a probability that $y_0^{N-1}$ and $u_0^{i-1}$ may be obtained when $u_i = 0$. $u_i = 0$ is determined when the LLR has a value greater than 0, and $u_i = 1$ is determined when the LLR has a value less than 0. As a result, N split channels generated by performing channel combining and channel splitting on i.i.d. N channel have different channel qualities, and capacities thereof are polarized and code lengths are increased, and thus a proportion of split channels converged to a mutual information amount $I(W_N^{(i)}) = 1$ becomes equal to I(W). On the other hand, a proportion of split channels converted to $I(W_N^{(i)}) = 0$ is $1 - I(W)$. Methods, such as density evolution, Gaussian approximation, polarization weight, may be used to approximate and evaluate qualities of N split channels. In addition, in the 5G-NR standard, a single sequence $Q_{N_{max}}$ for a maximum mother code length $N_{max} (=1024)$ is determined through an experiential method, based on a partial order method, and a code sequence for a smaller mother code length $N(<N_{max})$ is determined as an ordered set or sequence $Q_N = [i < N, i \in Q_{N_{max}}]$. In the disclosure, effectiveness of a technology of the disclosure is evaluated considering both a 5G-NR code sequence and a code sequence obtained through a polarization weight-based construction.

First, a polarization weight (PW) method described in "G. He et al., β-expansion: a theoretical framework for fast and recursive construction of polar codes, in Proc. Institute of Electrical and Electronics Engineers Global Communications Conference (IEEE GLOBECOM), Singapore, December 2017" will be described in detail. Polarization weight is a method of expressing a quality of each split channel in a weighted sum, and a quality of a bit channel $W_N^{(i)}$, in which a decimal index for a code length $N(=2^n)$ is i, may be represented as Equation 1.

$$P_N^{(i)} = \sum_{j=0}^{n-1} b_j \beta^j \qquad \text{Equation 1}$$

Here, $b_j (j \in _N = \{0, 1, \ldots, N-1\})$ indicates a bit value in a binary expression of an index ($i \in \mathbb{Z}_N = \{0, 1, \ldots, N-1\}$), and may be expressed as $i = (b_{n-1} b_{n-2} \ldots b_1 b_0)_2$. Here, $b_0$ is a least significant bit (LSB) and $b_{n-1}$ is a most significant bit (MSB). Also, β denotes a fitting parameter, and $\beta = 2^{1/4} \approx 1.1892$ may be finally determined by adjusting a value of β such that an AWGNC performance is remarkable. For example, when N=8, qualities of all eight split channels are $P_8^{(0)} = 0.00$, $P_8^{(1)} = 1.00$, $P_8^{(2)} = 1.19$, $P_8^{(3)} = 2.19$, $P_8^{(4)} = 1.41$, $P_8^{(5)} = 2.41$, $P_8^{(6)} = 2.60$, $P_8^{(7)} = 3.60$, and reliability is high when a value thereof is high. In a polarization weight evaluation method, the qualities of the split channels may be calculated as a simple weighted sum regardless of a channel type and a code parameter (N, K). In other words, unlike a construction based on density evolution or Gaussian approximation method, which separately constructs and uses an optimum code according to each channel code parameter, the polarization weight evaluation method may support several code rates through a single sequence.

The 5G-NR code sequence is similar to a PW-based code sequence in that the 5G-NR code sequence is constructed to support all code rates through a single sequence and is based on a partial order, but there are several differences. First, the 5G-NR code sequence stores and uses only a code sequence $Q_{1023}$ for a maximum mother code length $N_{max} (=1024)$. For example, when a sequence for a polar code, in which a code length is N=512, is to be used, an index less than 512 is selected from a code sequence $Q_{1023}$ for N=1024, and a sequence is configured by using selected indexes (subsequence; $Q_N = [i \in Q_{1023}|i<N]$). Also, a sequence $Q_0^{1023}$ adopted in the standard has been determined such that a performance is remarkable through an empirical construction.

Figure 2:
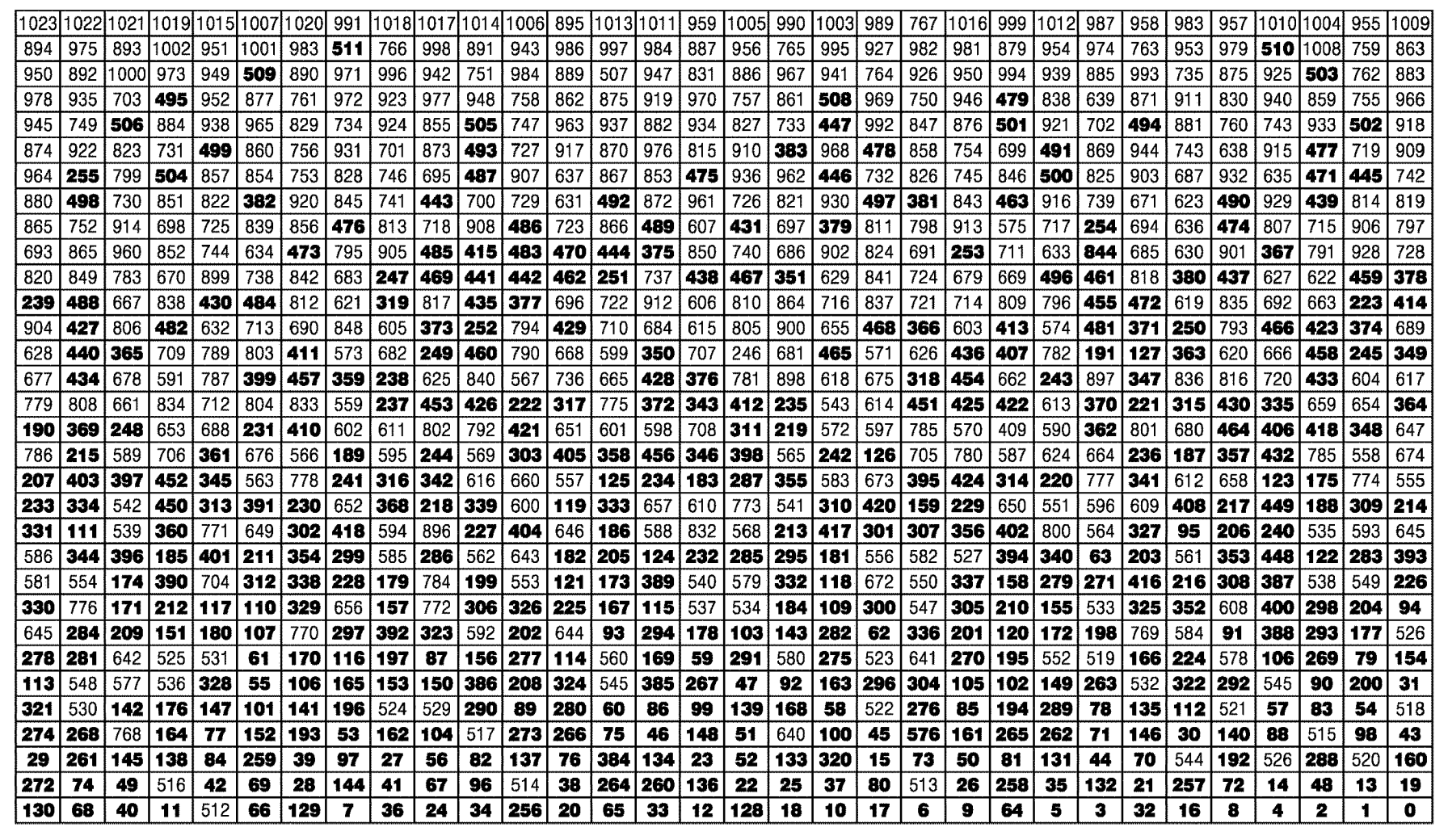

FIG. 2 is a diagram for describing a sequence $Q_{1023}$ and a sequence for N=512, which are adopted in the 5G-NR standard according to an embodiment of the disclosure.

Referring to FIG. 2, as indicated in shades, indexes less than 512 may be selected from the code sequence $Q_{1023}$, and a sequence may be configured with the selected indexes.

However, an initial construction code length is limited to $N = 2^n (n = 1, 2, \ldots)$ because a 2*2 polarization kernel matrix is used while constructing a code of conventional polar code. Various code lengths or code rates need to be supported for a polar code to be actually applied to an application, and thus a required code length needs to be achieved through various rate-matching technologies, such as puncturing, shortening, and repetition.

The puncturing is a type of a code modification method, and is a method of excluding J codeword bits in a mother code x from transmission. A receiving end including a decoder does not contain any stochastic information regarding punctured bits, and thus an LLR of the punctured bits needs to be input as 0 during decoding. When a certain codeword bit is punctured, symmetric capacity of some split channels is decreased to 0, and at this time, source bits in a u domain corresponding to the capacity-0 split channels are referred to as incapable bits. The incapable bits are selected as frozen bits in a code construction, and the frozen bit generally has a value of 0. $\mathcal{X}_p \subset \mathbb{Z}_N=\{0,1,\ldots,N-1\}$ is referred to as an index set (or a puncturing pattern) of punctured bits in an x domain, and $\mathcal{U}_p \subset \mathbb{Z}_N$ is referred to as an index set (or an incapable pattern) of incapable bits corresponding thereto in the u domain. In other words, when bits corresponding to $\mathcal{X}_p$ are punctured, bits corresponding to $\mathcal{U}_p$ become incapable, and thus become bits unavailable for data transmission.

Figure 3:
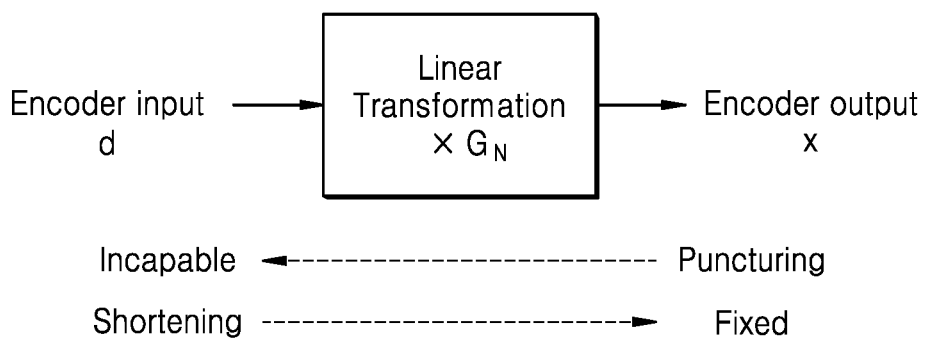
FIG. 3 is a diagram for describing puncturing and shortening of a polar code according to an embodiment of the disclosure.

FIG. 3 is a diagram for describing puncturing and shortening of a polar code according to an embodiment of the disclosure.

Referring to FIG. 3, when some output bits of an encoder are punctured, input bits of the encoder corresponding thereto become incapable bits, and when some input bits of the encoder are shortened, output bits of the encoder corresponding thereto become fixed.

Figure 4:
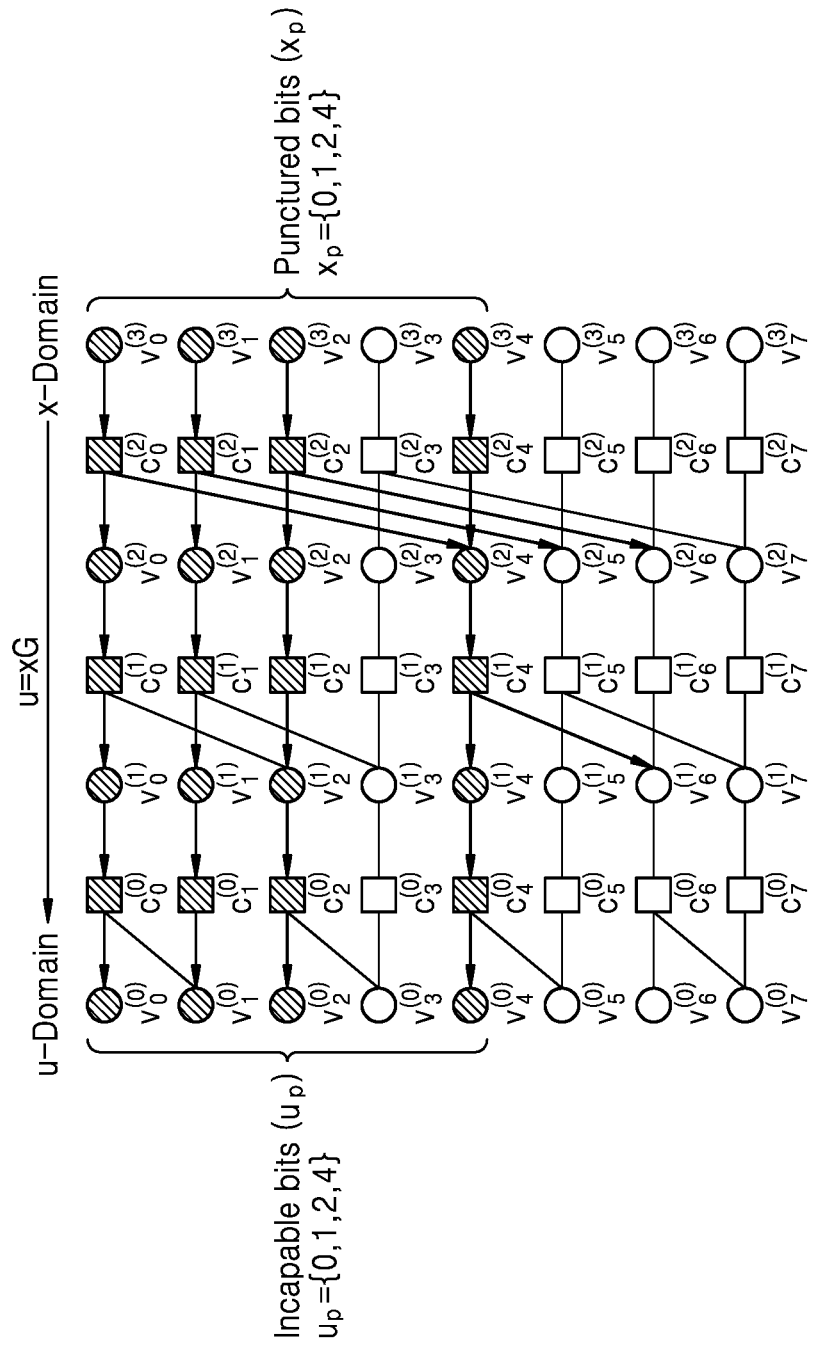
FIG. 4 is a diagram for describing a 4-bit punctured polar code when N=8 according to an embodiment of the disclosure.

FIG. 4 is a diagram for describing a 4-bit punctured polar code when N=8 according to an embodiment of the disclosure.

Referring to FIG. 4, when codeword bits having an index of $\mathcal{X}_p=\{0,1,2,4\}$ from among output bits of an encoder are punctured, input bits $\mathcal{U}_p=\{0,1,2,4\}$ of the encoder may become incapable bits.

Shortening uses features in the form of a lower triangular matrix included in a generator matrix $G_N = G_2^{\otimes n}$ of a polar code. In detail, when J bits in a u domain to be shortened during encoding are selected and values thereof are fixed to 0, values of J bits may also become 0 in an x domain. Codeword bits fixed as such are not transmitted, but a receiving end accurately contains information about the codeword bits, and thus an absolute value of LLR, i.e., reliability, is set to a high value, for example, a maximum value settable in hardware. $\mathcal{U}_s \subset \mathbb{Z}_N=\{0,1,\ldots,N-1\}$ is an index set of bits to be shortened in the u domain, and $\mathcal{X}_s \subset \mathbb{Z}_N$ is an index set of bits fixed in the x domain. In other words, when bits corresponding to $\mathcal{U}_s$ are shortened, bits corresponding to $\mathcal{X}_s$ are fixed.

Figure 5:
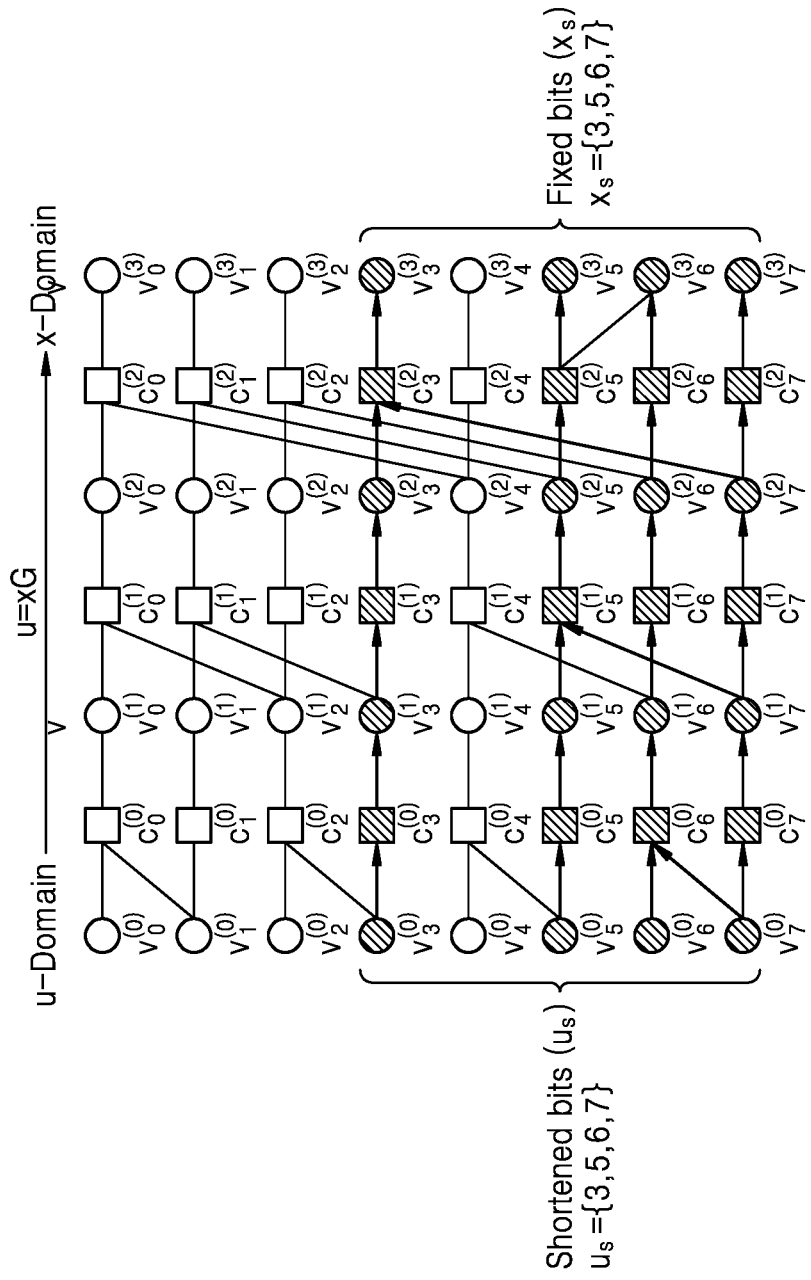
FIG. 5 is a diagram for describing a 4-bit shortened polar code when N=8 according to an embodiment of the disclosure.

FIG. 5 is a diagram for describing a 4-bit shortened polar code when N=8 according to an embodiment of the disclosure.

Referring to FIG. 5, when source bits having an index of $\mathcal{U}_s=\{3,5,6,7\}$, from among input bits of an encoder, are shortened, bits corresponding to $\mathcal{X}_s=\{3,5,6,7\}$ are fixed.

An SC decoding method may be used as a decoding method of the polar code. An SC decoding may be realized as belief-propagation (BP) considering SC decoding in a bipartite graph corresponding to a generator matrix $G_N=G_2^{\otimes n}$. All SC decodings may be completed as each node performs 2-input 1-output operation one time. An SC decoder sequentially determines bit values using a rule according to Equation 2, for an estimated source bit vector $\hat{u}_0^{N-1} = (\hat{u}_0, \hat{u}_1, \ldots \hat{u}_{N-1})$.

$$\hat{u}_i = \begin{cases} 0, & \text{if } i \in A^c \\ h_i(y_0^{N-1}, \hat{u}_0^{i-1}), & \text{otherwise} \end{cases} \quad \text{Equation 2}$$

In Equation 2, $h_i(y_0^{N-1}, \hat{u}_0^{N-1})$ is $$h_i(y_0^{N-1}, \hat{u}_0^{i-1}) = \begin{cases} 0, & \text{if } \ln \frac{w_N^{(i)}(y_0^{N-1}, \hat{u}_0^{i-1}|u_i=0)}{w_N^{(i)}(y_0^{N-1}, \hat{u}_0^{i-1}|u_i=1)} \geq 0, \\ 1, & \text{otherwise} \end{cases}$$

and the above method may be realized based on LLR-BP.

Figure 6:
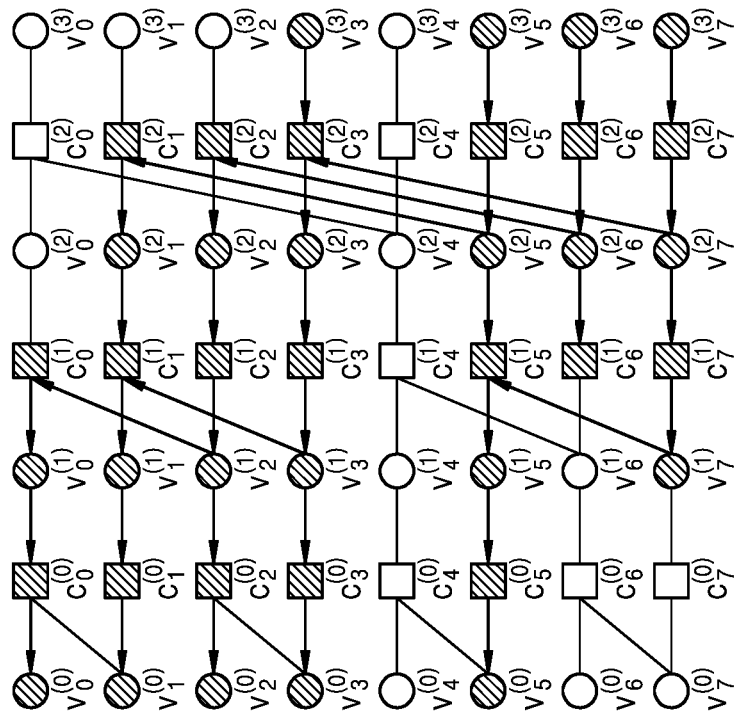
FIG. 6 is a diagram of an example of decoding a polar code in which a length is N=8 on a bipartite graph according to an embodiment of the disclosure.
Figure 6:
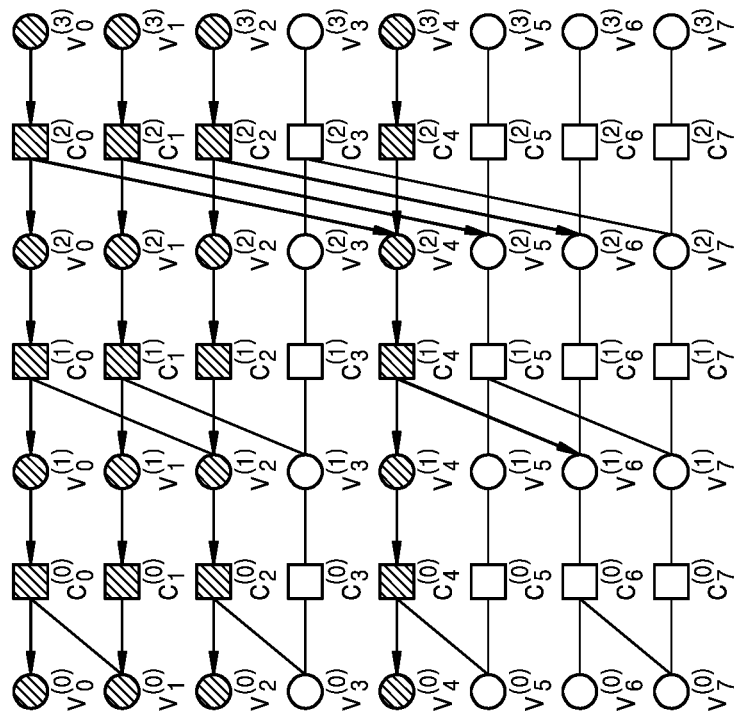

FIG. 6 is a diagram of an example of decoding a polar code in which a length is N=8 on a bipartite graph according to an embodiment of the disclosure.

The bipartite graph includes a variable node (circle), a check node (square), and edges. The variable node is a single bit whereas the check node indicates a linear constraint condition, such as a binary sum of all adjacent variable node values being 0. When $\mathbb{G}_N$ denotes a bipartite graph corresponding to a polar code having a length of $N=2^n$, the graph may be divided into (n+1) stages in which indexes are from 0 (adjacent to a u-domain) to n (adjacent to a x-domain). Also, $v_i(t)$ and $c_j(t)$ respectively indicate ith variable node and jth check node at a stage stage-t. The graph $\mathbb{G}_N$ includes a set $\mathcal{V}^{(t)}=\{v_i^{(t)}|i \in \mathbb{Z}_N\}$ of variable nodes and a set $\mathcal{C}^{(t)}=\{c_j^{(t)}|j \in \mathbb{Z}_N\}$ of check node for t=[0:n], and edges connecting such nodes. $\mathcal{V}^{(0)}$ and $\mathcal{V}^{(n)}$ respectively correspond to an input vector u and an output vector x of an encoder.

For $t \in [0:n-1]$, the variable nodes connected to $\mathcal{V}^{(t)}$ and $\mathcal{V}^{(t+1)}$ are connected to the check nodes in $\mathcal{C}^{(t)}$. On the bipartite graph, two types of information of LLR $\alpha_i^{(t)} \in \mathbb{R}$ and a hard-decision bit value $\beta_i^{(t)} \in \{0,1\}$ are exchanged for every $v_i^{(t)}$ during an SC decoding process. The LLR values are propagated from right to left on the graph, and the hard-decision bit values are propagated from left to right, based on currently estimated encoding input bits. When $l_i$ is indicated as intrinsic LLR (log p(y|x=1) log p(y|x=0)) for a codeword bit $x_i$, $l_i=0$ when $x_i$ is a puncturing bit as described above, and $l_i=\infty$ (or a large value available for implementation, for example, a maximum value $l_{max}$) when $x_i$ is a bit fixed by shortening. Intrinsic LLRs are set to $\alpha_i^{(n)}=l_i$ in a stage-n for all $i \in \mathbb{Z}_N$, and an LLR message is calculated in a direction of t=0 from a stage t=n-1. In SC decoding realized based on LLR (A. B. Stimming, M. B. Parizi, and A. Burg, "LLR-based successive cancellation list (SCL) decoding of polar codes," IEEE Trans. Signal Process., vol. 63, no. 19, pp. 5165-5179, October 2015, hereinafter, stimming 15), the LLR values are updated by two types of functions in each stage, and LLR update according to Equation 3 is performed when $i_t=0$ for $\langle i \rangle_2 = (i_{n-1} \ldots i_1 i_0)$.

$$\alpha_i^{(t)} = f(\alpha_i^{(t+1)}, \alpha_{i+h}^{(t+1)}) \approx \text{sgn}(\alpha_i^{(t+1)}) \text{sgn}(\alpha_{i+h}^{(t+1)}) \cdot \min(\alpha_i^{(t+1)}, \alpha_{i+h}^{(t+1)}) \quad \text{Equation 3}$$

Here, to $\alpha_i^{(t)}=0$ when even one of a $\alpha_i^{(t+1)}$ and $\alpha_{i+2^t}^{(t+1)}$ is 0. On the other hand, when $i_t=1$, LLR update according to Equation 4 is performed.

$$\alpha_i^{(t)} = g(\alpha_{i+h}^{(t+1)}, \alpha_i^{(t+1)}, \beta_{i=2^t}^{(t)}) \approx (1-2\beta_{i=2^t}^{(t)})\alpha_{i=2^t}^{(t)} + \beta_i^{(t)} \quad \text{Equation 4}$$

Here, to $\alpha_i^{(t)}=0$ when even one of a $\alpha_i^{(t+1)}$ and $\alpha_{i+2^t}^{(t+1)}$ is 0.

For an integer $i \in \mathbb{Z}_N(=\{0,1,\ldots,N-1\})$, considering binary expansion $\Sigma_{t=0}^{n-1} i_t 2^t (i_t \in \{0,1\})$, $(i_{n-1}i_{n-2}\ldots i_0)$ will be referred to as a binary expression of i, and will be interchangeably used with i. In other words, 7=(0111). In particular, when a binary sequence expression is to be emphasized, $\langle i \rangle_2 = (i_{n-1}i_{n-2}\ldots i_0)$. $d_H(i)$ denotes a Hamming weight of the binary expression $(i_{n-1}i_{n-2}\ldots i_0)$, and denotes the number of symbols, which is not 0. In other words, $\langle 7 \rangle_2 = (0111)$ and $d_H(7)=3$. Also, $\bar{i}$ the one's complement of i, and values of all $i_t$ may be changed $0 \to 1$ and $1 \to 0$. $\bar{7} = \overline{(0111)} = (1000) = 8$.

Hereinafter, important concepts for describing a definition and operations of a polar code will be described. First, a partial order relation in an integer set, called binary domination, will be defined.

Definition 1. Any two integers $i, j \in \mathbb{Z}_N$ and binary expressions thereof $\langle i \rangle_2 = (i_{n-1} i_{n-2} \ldots i_0)$, $\langle j \rangle_2 = (j_{n-1} j_{n-2} \ldots j_0)$ are considered. When $i_t \leq j_t$ is satisfied for all $t \in [0:n-1]$, it is phrased that "i is dominated by j" and indicated as $i \preceq j$. For example, $\langle 5 \rangle_2 = (0101)$ and $\langle 13 \rangle_2 = (1101)_2$ for $\mathbb{Z}_{16}$, and thus $5 \preceq 13$. On the other hand, $\langle 7 \rangle_2 = (0111)$, $\langle 8 \rangle_2 = (1000)$ and thus 7 and 8 are not in a comparison relation. In other words, a domination relation is unable to be determined for 7 and 8.

Definition 2. A dominated integer set $\mathcal{D}_i$ of $i \in \mathbb{Z}_N$ is defined as $\mathcal{D}_i \triangleq \{k \in \mathbb{Z}_N | k \preceq i\}$.

For example, when i=6 for $\mathbb{Z}_8$, $\mathcal{D}_6 = \{(000), (010), (100), (110)\} = \{0,2,4,6\}$.

Definition 3. A dominating integer set $\mathcal{G}_i$ of $i \in \mathbb{Z}_N$ is defined as $\mathcal{G}_i \triangleq \{k \in \mathbb{Z}_N | k \succeq i\}$.

For example, when $i=6(\langle 6 \rangle_2 = (110))$ for $\mathbb{Z}_8$, $\mathcal{G}_6 = \{(110), (111)\} = \{6,7\}$.

Definition 4. (Property of Set) When $\mathcal{D}_j \in \mathcal{A}$ for integer sets $\mathcal{A} \in \mathbb{Z}_N$ and $\forall j \in \mathcal{A}$, it is said that a set $\mathcal{A}$ has a binary domination (BD) property ($\mathcal{A}$ complies with binary domination).

Definition 5. (BD Sequence) There is a sequence $C_0^{N-1} = (c_0, c_1, \ldots, c_{N-1})$ having a length of N. The sequence $C_0^{N-1}$ has a BD property when $c_i \preceq c_j$ for different integers $i, j \in \mathbb{Z}_N$ or domination comparison is not possible therebetween. Alternatively, $C_0^{N-1}$ will be referred to as a BD sequence.

Proposition 6. A subsequence $C_0^i (i \in \mathbb{Z}_N)$ of one BD sequence $C_0^{N-1}$ is assumed. Then, a set $\mathcal{C}_i = \{c_0, c_1, \ldots, c_{N-1}\}$ including elements of $C_0^i$ satisfies a BD property.

Binary domination also plays an important role in determining puncturing and shortening patterns of a polar code. In detail, when an incapable bit pattern for a puncturing pattern $\mathcal{X}_p$ satisfying the binary domination is $\mathcal{U}_p$, a set $\mathcal{U}_p$ has a BD property of Definition 4 and $|\mathcal{X}_p| = |\mathcal{U}_p|$ is satisfied. Similarly, a shortening pattern satisfying the binary domination satisfies $|\mathcal{X}_p| = |\mathcal{U}_s|$.

A technique proposed in the disclosure is based on a result of following lemma.

Lemma 7. For a valid incapable bit pattern $\mathcal{U}_p$, identical puncturing bit pattern $\mathcal{X}_p (= \mathcal{U}_p)$ generates an incapable bit pattern $\mathcal{U}_p$.

According to Lemma 7, when any incapable bit pattern $\mathcal{U}_p$ is valid, a puncturing pattern including a same index set may make Up incapable. A same incapable bit pattern is generated even when a reverse puncturing bit pattern, in which the one's complement is applied to an index, is considered. (M. Jang et al., "Rate-matching of polar codes based on binary domination," IEEE Trans. on Commun. vol. 67, issue: 10, Oct. 2019).

FIG. 6 is a diagram showing an identical puncturing bit pattern and a reverse puncturing bit pattern, which comply with binary domination.

Referring to FIG. 6, it is verified that, for the incapable bit pattern $\mathcal{U}_p$, a same incapable bit pattern $\mathcal{X}_p$ satisfying $\mathcal{X}_p 32 \mathcal{U}_p$ makes Up incapable.

The related art corresponding to embodiments of the disclosure is a BICM model to which a polar code is applied. A BICM system based on 5G-NR polar code 5G-NR transmission/reception system and notations will be first described.

Figure 7:
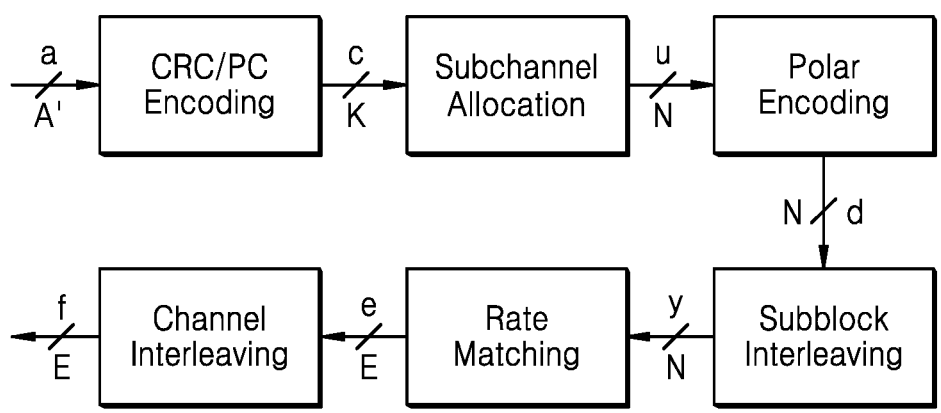
FIG. 7 is a diagram for describing a transmission system model using a polar code for 5G-NR uplink according to an embodiment of the disclosure.

FIG. 7 is a diagram for describing a transmission system model using a polar code for 5G-NR uplink according to an embodiment of the disclosure.

Referring to FIG. 7, a, c, u, d, y, x', f is a vector corresponding to input/output of each function, and K, K', N, E is a size of the vector.

A BICM model using a 5G-NR polar code may be used as the transmission system model according to FIG. 7. The polar code is used to encode uplink control information (UCI) through a physical uplink control channel (PUCCH) and a physical uplink shared channel (PUSCH). In downlink, the polar code is used to encode payloads of a physical downlink control channel (PDCCH) and a physical broadcast channel (PBCH) through a physical downlink control channel.

In a 5G application, the number of information bits is fixed to A, and transmission of a codeword having a length E for achieving a data-rate R=A/E required by a higher communication layer is considered. To satisfy such requirements, rate-matching may be performed by applying methods, such as puncturing, shortening, and repetition, to a polar code having an initially constructed length $N=2^n$.

Referring to FIG. 7, there is a binary message vector a that has a length of A'. An encoder may ① generate an input vector c having a length of K=A'+L by concatenating an external code, such as a cyclic redundancy check (CR) code or PC code, to the vector a.

Then, through the above-described code construction method (regarding the standard, based on an order of 5G-NR code sequence $Q_N$), ② bits of the vector a may be mapped to K split channels having high reliability from among N split channels. Here, the remaining split channels are pre-determined, i.e., frozen, to vectors known to a transceiver (for example, zero vectors). The vector generated through the mapping is u and a dimension of u is N. Then, ③ polar encoding is performed through multiplication with a generator matrix $$G_N = G_2^{\otimes n} \left( G_2 = \begin{bmatrix} 1 & 0 \\ 1 & 1 \end{bmatrix} \right),$$

and a vector x generated as a result of performing the polar encoding is $x = uG_N$ (Here, the multiplication is a calculation on a Galois field (GF(2).). After the two stages of encoding (external encoding +polar encoding), ④ a subblock interleaver splits the codeword vector into 32 blocks having a same size and permutates each block according to a simple rule to generate a vector y. The subblock interleaver performs such a process to facilitate puncturing/shortening to be performed in a next stage, and here, a subblock interleaving sequence is also referred to as a rate-matching sequence. In detail, N encoded bits are interleaved prior to the rate-matching, and during the rate-matching, puncturing is performed from the front or shortening is performed from the back according to an interleaved sequence to adjust a length. An interleaver J splits the N encoded bits stored in x into 32 subblocks having a length of B=N/32, and the interleaving may be performed in units of subblocks.

Figure 8:
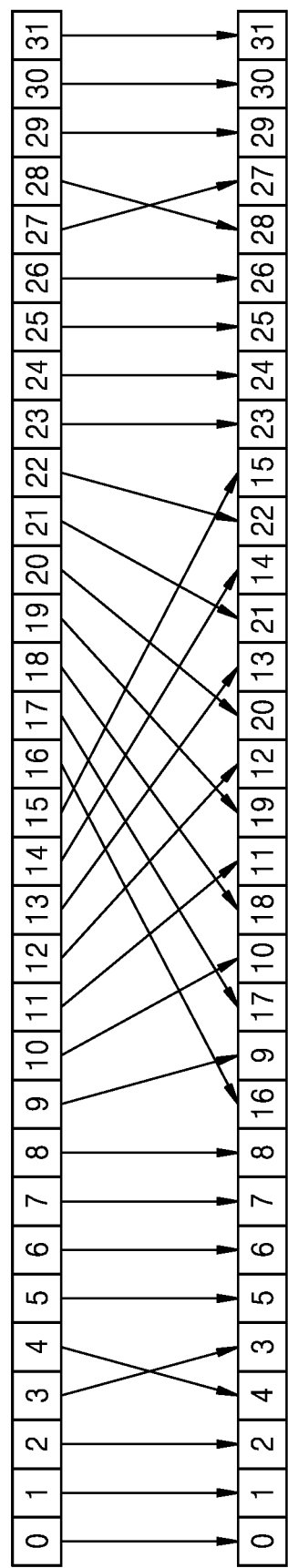
FIG. 8 is a diagram for describing a method of performing interleaving in units of subblocks according to an embodiment of the disclosure.

FIG. 8 is a diagram for describing a method of performing interleaving in units of subblocks according to an embodiment of the disclosure.

Referring to FIG. 8, 32 indexes are block indexes including several bits. A bit $y_j$ after interleaving from an encoded bit $x_i (i \in \mathbb{Z}_N)$ may be represented as Equation 5 below.

$$i = J(j) = B \cdot P(\lfloor j/B \rfloor) + q \qquad \text{Equation 5}$$

Here, $q = j \mod B$ and $j = 0, 1, \ldots, N-1$. Also, $\lfloor \cdot \rfloor$ is a descending operator that is a largest integer equal to or less than an input.

Then, ⑤ a vector x' having a length of E(=N−J) may be provided from a vector y having a length of N, through a rate-matching technology, such as puncturing/shortening/repetition. In a 5G-NR system, the puncturing is applied to E≤N and code rate (R) R≤7/16 (i.e., a low-to-moderate code rate) areas, and first U=N−E bits of interleaved codeword bits are not transmitted ($x'_i = y_{i+U}$ and i=0, . . . . E−1). On the other hand, the shortening is applied to E≤N and R>7/16 areas, and last U=N−E bits of the interleaved codeword bits are not transmitted. In other words, x;=y 1 (i=0, . . . , E−1) . Lastly, although not described in the disclosure, the repetition is applied when E >N, and first U=N−E codeword bits are used for retransmission ($x'_i = y_{i \mod N}$). Also, ⑥ a vector f is acquired through a channel interleaver, and ⑦ a vector g after modulation is transmitted to a modulator and ⑦ passes through a channel. The channel interleaver used in the 5G-NR standard is a triangular interleaver. The triangular interleaver is defined by a single parameter of a width (or height) T of an isosceles right triangle. In detail, the length T of one side of the isosceles right angle is determined to be a minimum integer value satisfying a condition of $$\frac{T(T+1)}{2} \geq E.$$

Indexes of codeword bits having a length of E are written on the triangular interleaver in a horizontal direction, and are read in a vertical direction when the write is completed. For example, when N=E=8 , T=4 is determined. For example, (0,1,2,3,4,5,6,7) are sequentially written in a row-major manner and read in a column-major manner to obtain an interleaved sequence of (0,4,7,1,5,2,6,3). In general, the channel interleaver is used to distribute, throughout a codeword, a fading effect on bits configuring a symbol during high-order modulation, and it has been experimentally verified that AWGNC has a high performance gain when the interleaver is not used. Structural vulnerability of a code may be improved through the interleaver.

6G communication have high requirements, such as ultra-high bandwidth, ultra-high reliability, and ultra-low latency. Here, due to low-latency conditions and diversity of channels, an encoded signal may be transmitted through a non-homogeneous channel or resource to secure diversity. Also, such transmission may be approximated to nonergodic channel or multi-block fading channel transmission. In general, a bit that experienced a weak channel may be adjusted to evenly spread throughout a codeword, through channel interleaving according to a BICM system, for a codeword bit before transmission. This is to prevent a performance from deteriorating by a combination of symbols that have a low channel coefficient due to a weak point of a finite length code. In particular, the BICM system may achieve a highest effect from convolutional codes where consecutive errors are fatal, and the BICM system has been also applied to other codes, such as turbo codes.

Regarding the triangular interleaver adopted as the channel interleaver of the conventional 5G-NR standard, weak points of codes have been avoided in overall through pseudo-random interleaving, and the performance has been improved by easing a performance deterioration effect in the AWGNC and fast fading channel. However, the triangular interleaver is empirically constructed in the block fading channel, and is not a construction that theoretically guarantees the diversity.

Figure 9:
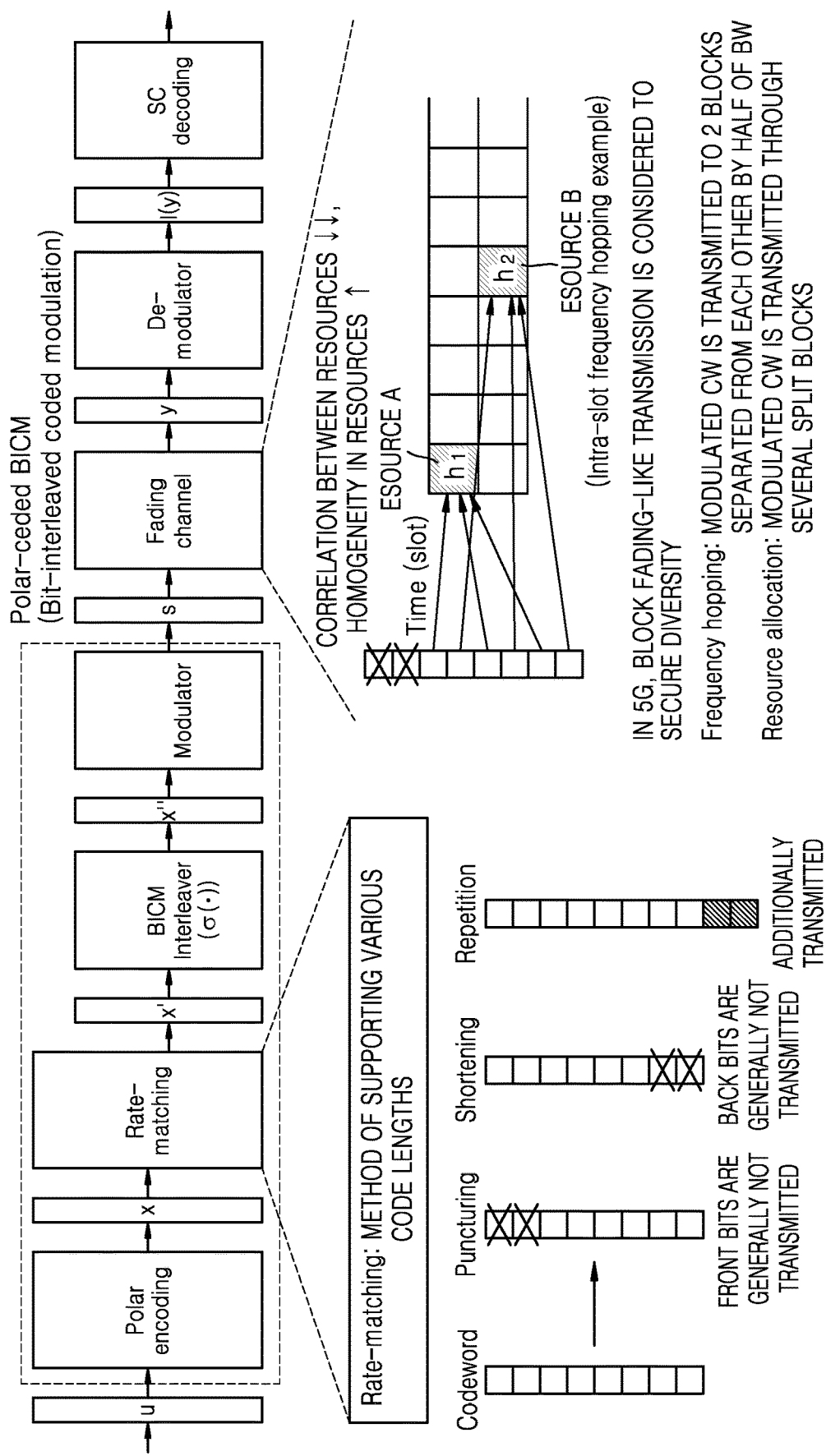
FIG. 9 is a diagram for describing a bit-interleaved coded modulation (BICM) transmission/reception system model to which a polar code is applied according to an embodiment of the disclosure.

FIG. 9 is a diagram for describing a conventional BICM transmission/reception system model to which a polar code is applied according to an embodiment of the disclosure.

Referring to FIG. 9, a code length is adjusted through a rate-matching technology, such as puncturing or shortening, after polar encoding, and an AWGNC or fading channel is experienced after BICM interleaving/modulation.

Meanwhile, in 5G-NR, resource allocation similar to block fading channel transmission is defined to secure frequency diversity. For example, a scenario in which a modulated codeword is transmitted to two frequency blocks separated from each other by a half of a system bandwidth in one slot, as in intra-slot frequency hopping, or a modulated codeword is transmitted through several split frequency blocks as in resource allocation type [3GPP-1] is defined. When M denotes the number of resource blocks to which a single codeword is to be allocated, intra-slot frequency hopping may be applied when M=2, and the resource allocation type may be applied not only when M=2 but also when M>2 , and the modulated codeword is transmitted through M different resource blocks. In the disclosure, codeword bit allocation when M=2 is mainly described, and a method of securing full-diversity when M>2 is also described. Here, when both M=2 and M>2, one codeword may be allocated to several resource blocks in a same quantity (uniform allocation) or in different quantities (non-uniform allocation).

Figure 10A:
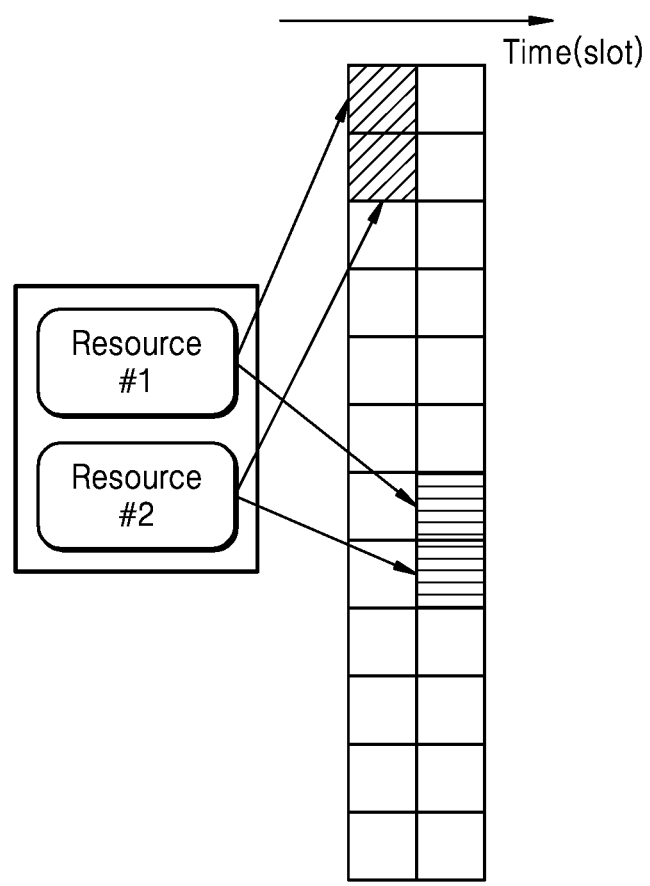
FIG. 10A is a diagram for describing a method by which logical resource blocks, to which an interleaving method is applied, are allocated to physical resource blocks according to frequency hopping according to an embodiment of the disclosure.

FIG. 10A is a diagram for describing a method by which logical resource blocks, to which an interleaving method is applied, are allocated to physical resource blocks according to frequency hopping according to an embodiment of the disclosure.

Referring to FIG. 10A, resources in two logical resource blocks may be transmitted by being allocated to two different physical resource blocks, and this may be an example of intra-slot frequency hopping resource allocation. The interleaving method according to an embodiment of the disclosure may be applied when logical resource blocks are allocated to physical resource blocks on one or more slots. However, this is only an example and a resource unit on a time axis is not limited to one slot. For example, a resource block may be allocated in units of mini-slots.

Figure 10B:
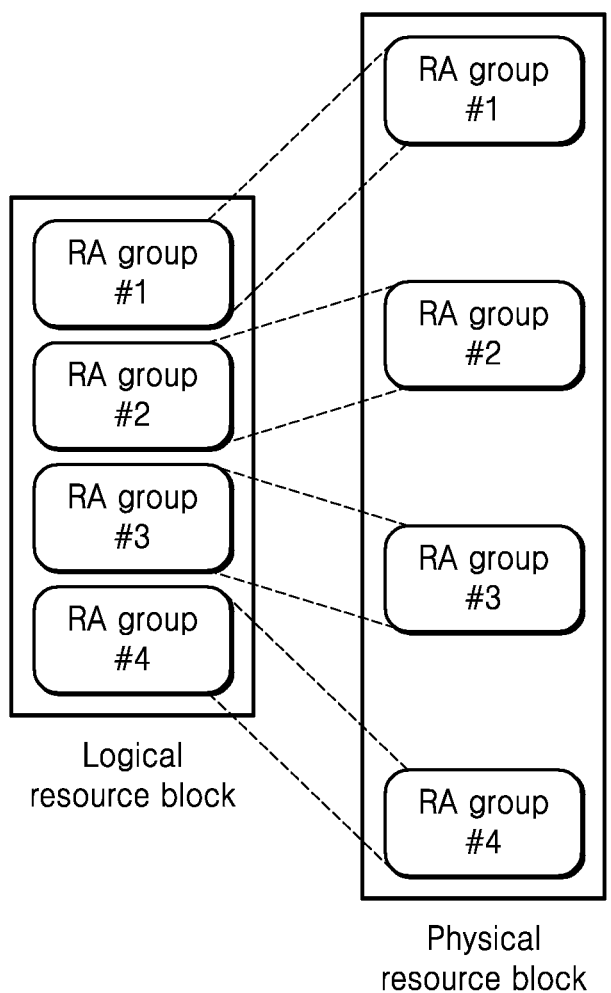
FIG. 10B is a diagram for describing allocating of logical resource blocks, to which an interleaving method is applied, to physical resource blocks according to an embodiment of the disclosure.

FIG. 10B is a diagram for describing allocating of logical resource blocks, to which an interleaving method is applied, to physical resource blocks according to an embodiment of the disclosure.

Referring to FIG. 10B, bits in four logical resource blocks may be allocated to four physical resource blocks. Embodiments of the disclosure consider modulated codeword transmission through several split frequency blocks, as in the scenarios of FIGS. 9, 10A, and 10B. It may be assumed that the above scenarios are similar to experiencing a fading channel in block units because resources in a block have homogeneous channel characteristics and have a very low correlation with a channel of a physically separated block. Accordingly, it is important to develop a modulation encoding technology considering a block fading channel and study an enhanced BICM technology, which are basic assumptions of channels of the disclosure.

Figure 11:
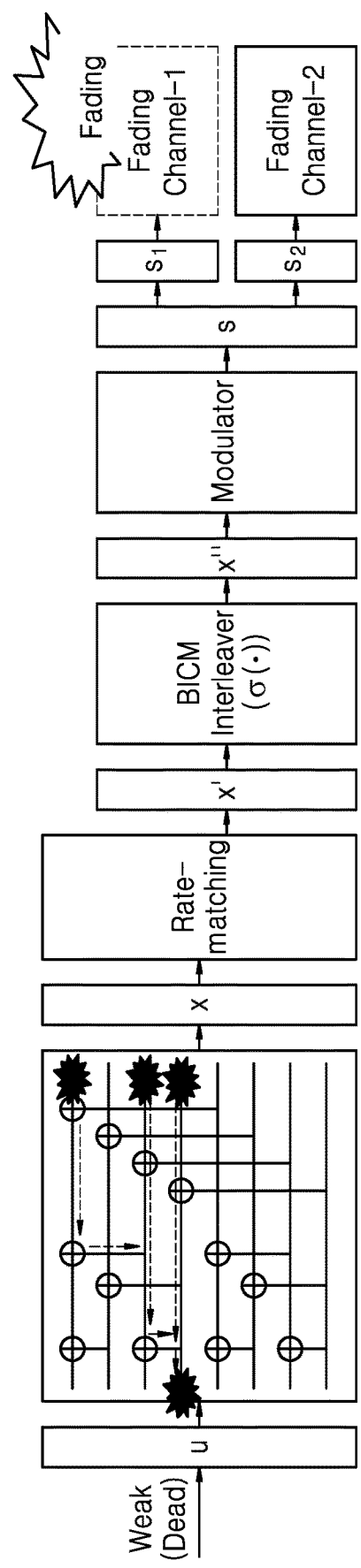
FIG. 11 is a diagram for describing a case where, when certain codeword bit patterns are simultaneously faded, reliability of a certain source bit is greatly reduced due to a structural feature of a polar code, and thus decoding becomes difficult according to an embodiment of the disclosure.

FIG. 11 is a diagram for describing a case where, when certain codeword bit patterns are simultaneously faded, reliability of a certain source bit is greatly reduced due to a structural feature of a polar code, and thus decoding becomes difficult according to an embodiment of the disclosure.

Referring to FIG. 11, N=8 and codewords may be allocated to two blocks. When first, third, and fourth codeword bits are faded due to fading, reliability of a fourth information bit may be very low due to a structural feature.

A triangular interleaver used as a BICM interleaver of the 5G-NR standard is a type of pseudo-random interleaver, and has a decoding performance almost similar to a random interleaver through an effect of averaging a fading effect experienced by a symbol. Clearly, the triangular interleaver is still considered as an interleaver supporting a highly excellent performance in high-order modulation and fading, there may be an area where performance deterioration occurs due to structural incompleteness of the triangular interleaver in some code parameters. For example, when certain bit patterns are simultaneously faded as in FIG. 11, reliability of a certain information bit may greatly decrease due to a structural construction characteristic of a polar code, which may be deemed as low diversity. The decoding performance may greatly decrease due to the low diversity. According to embodiments of the disclosure, all information bits have full-diversity under SC decoding, through a premeditated BICM system construction. Here, when all bits included in an information set have full-diversity, a code also has full-diversity. Ultimately, an AWGNC performance is to be maintained while improving a fading performance through a diversity effect, by using an improved BICM construction.

Figure 12:
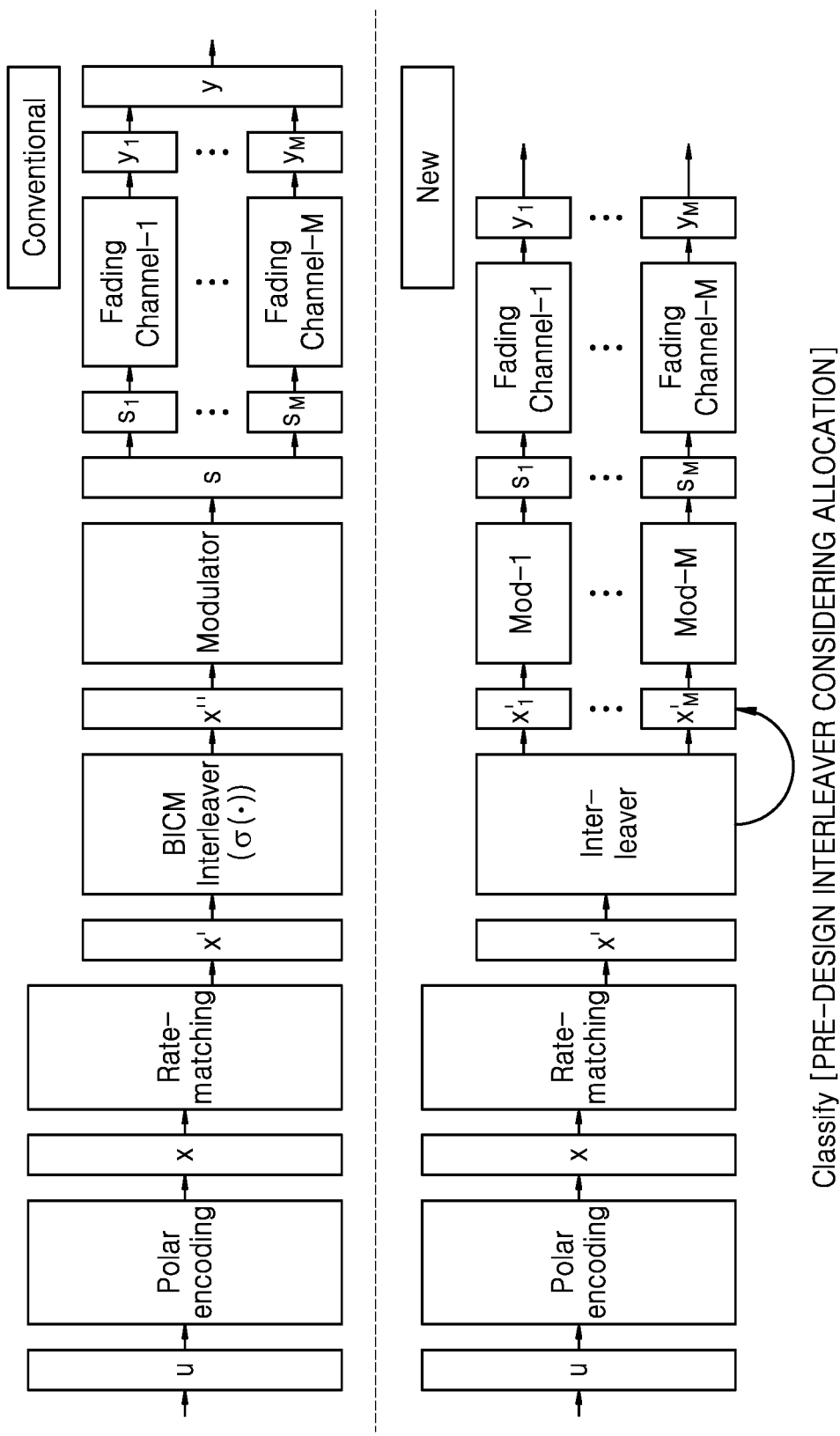
FIG. 12 is a diagram for describing a polar-coded BICM system transmitter and a BICM system transmitter during multi-block fading channel transmission according to an embodiment of the disclosure.

FIG. 12 is a diagram for describing a conventional polar-coded BICM system transmitter and a BICM system transmitter during multi-block fading channel transmission according to an embodiment of the disclosure.

A BICM interleaver in a conventional polar-coded BICM model has been mostly pseudo-randomly and heuristically constructed to evenly distribute various values of a fading channel to a codeword. In particular, a triangular interleaver adopted as a BICM system for a polar code exhibits a satisfactory BICM performance according to incoherence with a polar code structure. However, such a heuristic construction is unable to provide a guaranteed diversity in a block fading channel having a small number of fading diversities. On the other hand, an interleaver proposed in an embodiment of the disclosure is an interleaver constructed premeditatedly to secure a diversity in which decoding of information bits is high during SC decoding, by effectively using a non-homogeneous channel.

Referring to FIG. 12, an electronic device according to an embodiment of the disclosure may classify a rate-matched codeword x' into a plurality of groups considering diversity when a modulated codeword is divided and allocated to two or more multi-blocks, perform modulation on the classified codeword of each group, and allocate the same to a fading channel. To consider the diversity, the electronic device may perform interleaving on a codeword x or x' by using a polar code sequence based on reliability (e.g., polarization weight) of source bits corresponding to indexes of codeword bits.

Here, a same number of bits or different numbers of bits may be allocated to bit groups corresponding to different channel blocks or different resource groups.

Figure 13:
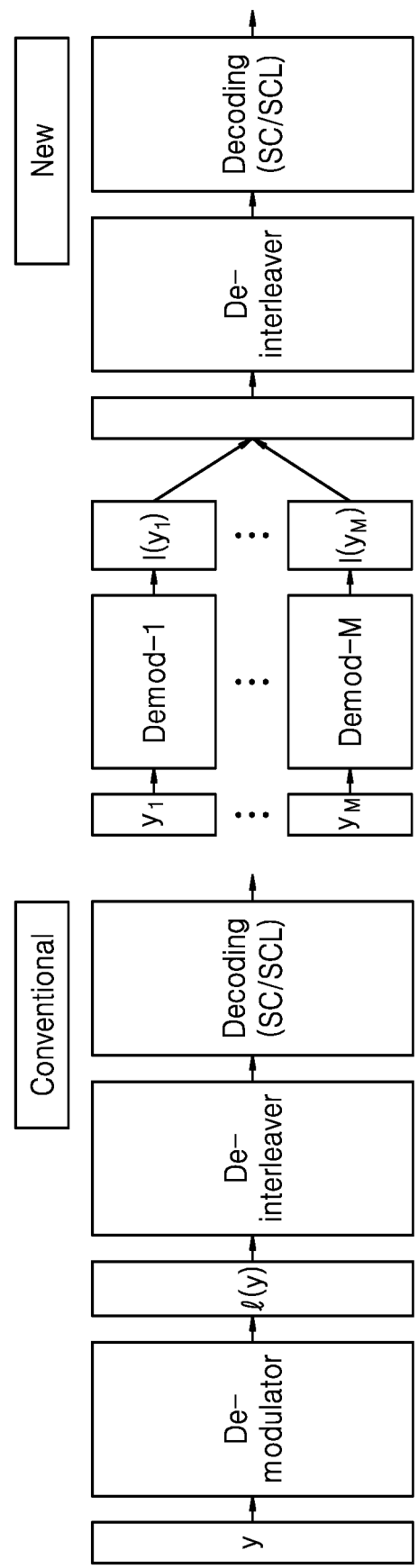
FIG. 13 is a diagram for describing a polar-coded BICM system receiver and a BICM system receiver during multi-block fading channel transmission according to an embodiment of the disclosure.

FIG. 13 is a diagram for describing a conventional polar-coded BICM system receiver and a BICM system receiver during multi-block fading channel transmission according to an embodiment of the disclosure.

Referring to FIG. 13, reception signals that passed through a channel are combined immediately before decoding, after demodulation is performed on each reception signal.

Figure 14:
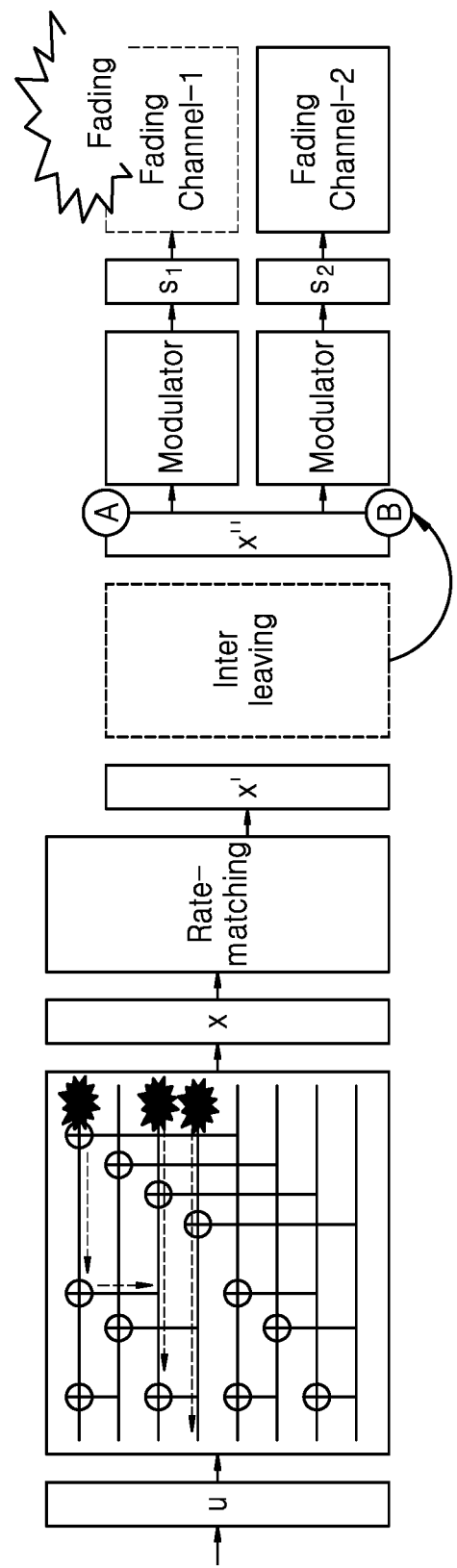
FIG. 14 is a diagram for describing a method by which a signal transmitted from an electronic device avoids a structural weakness and secures a high diversity by effectively using a non-homogeneous channel according to an embodiment of the disclosure.

FIG. 14 is a diagram for describing a method by which a signal transmitted from an electronic device avoids a structural weakness and secures a high diversity by effectively using a non-homogeneous channel according to an embodiment of the disclosure.

Referring to FIG. 14, eight codeword bits may be allocated to two blocks. When premeditated interleaving is performed as described above with reference to FIG. 12, a non-homogeneous channel may be effectively used and a structural weakness may be premeditatedly avoided, thereby securing a high diversity, as shown in FIG. 14.

There is a need for strategies for evaluating diversities of bits provided through interleaving and allocating a diversity to each bit. First, embodiments of the disclosure propose a method of calculating a diversity for each information bit by using a diversity updating method through Boolean variable approximation of a fading event.

Embodiments of the disclosure propose an interleaver construction method considering a diversity. The conventional 5G-NR polar code has been mainly constructed based on an AWGNC performance. Embodiments of the disclosure propose a method of aligning high/full diversity to information bits through premeditated fading block allocation or interleaving of codeword bits, without changing a conventional code (e.g., a 5G-NR code or a PW-based code) (i.e., a code sequence or information set). A diversity alignment method according to an embodiment of the disclosure effectively operates even for a punctured or shortened polar code and provides high/full diversity in a wider region compared to the related art, and thus provides a high performance gain in a certain code parameter.

Boolean Approximation-Based Diversity Analysis in Block Fading Channel.

As described above, a codeword (x') that is punctured/shortened after encoding may be divided and allocated to different non-homogeneous resource blocks to be transmitted, and at this time, code diversity may be secured from diversity of a channel. It is assumed that symbols/bits in one resource all experience a same fading coefficient $h_i$, and it is assumed that $h_i$s are independent from each other. In a case of resource allocation considering diversity, such as actual frequency hopping or resource allocation type allocation, resources in a block have similar channel characteristics and channels of blocks allocated by being physically separated from each other have a low correlation, and thus a similar channel situation assumed above is provided. For a theoretical analysis of a proposed system, an ideal block fading channel is assumed, and thus a resource allocation technique for securing diversity of an actual system may be satisfactorily approximated as described above.

Here, as described above, the number of blocks of a block fading channel for a codeword is M, and M has a value of 2 or greater. When M=2, the block fading channel will be referred to as a 2 fading-block channel, and when M=4, the block fading channel will be referred to as a 4 fading-block channel. In the disclosure, an interleaver construction method when M=2 (e.g., an intra-slot frequency hopping or resource allocation type scenario) will be described first, and an interleaver construction method expanding to a scenario where M≥3 will be described.

A source vector $u=(u_0, u_1, \ldots, u_{N-1})$ is multiplied by a generator matrix $G_N$ to generate a codeword vector $x=(x_0, x_1, \ldots, x_{N-1})$, and codeword bits in x may be rate-matched and then allocated to M different resource blocks. Index sets of bits allocated to blocks A, B when M=2 are referred to as $\mathcal{X}_A$, $\mathcal{X}_B$, and the numbers of elements included in the sets are $n_A$, $n_B$. When $n_A=n_B$ uniform allocation is performed and when $n_A \neq n_B$, non-uniform allocation is performed. When M=4, index sets of bits allocated to blocks A, B, C, and D are $\mathcal{X}_A$, $\mathcal{X}_B$, $\mathcal{X}_C$, $\mathcal{X}_D$, the numbers of elements included in the sets are $n_A$, $n_B$, $n_C$, $n_D$. When $n_A=n_B=n_C=n_D$, uniform allocation is performed, and non-uniform allocation is performed otherwise. A similar definition may be provided when M≠2,4.

FIG. 14 illustrates example of uniform allocation and an encoding structure of polar code where N=4 and M=2. Four source bits are encoded to generate four codeword bits, and at this time, $x_1$ and $x_2$ are allocated to the block A having a fading coefficient of $h_A$, and $x_3$ and $x_4$ are allocated to the block B having a fading coefficient of $h_B$. Here, fading experienced by codewords allocated to the blocks A and B may be represented as Boolean stochastic variables A and B. Irrelevant to the above drawing, when one codeword is allocated to M different resource blocks, fading events corresponding to the blocks may be respectively represented as $A_1, A_2, \ldots, A_M$ (When there are four blocks, A, B, C, D for convenience of expression).

In embodiments of the disclosure, a fading coefficient $h_i$ having a real value is approximated to a Boolean variable. When $I_1$ (or $I_2$)=0, $h_i$ has a sufficiently small value and thus a fading situation is indicated, and when $I_1$ (or $I_2$)=1, h has a sufficiently large value and thus a normal transmission/reception situation is indicated. In other words, each fading event is to be approximated to on-off, and fading manners of messages during Genie-aided SC decoding process are to be analyzed. A fading stochastic variable corresponding to a check/variable node is updated for each decoding stage, such that fading stochastic variables finally included in source bits are simply obtained. Such dichotomous approximation is unable to express a case where a fading coefficient value is moderate, but enables a fading operation of an SC decoding process to be effectively expressed and analyzed.

Diversity update corresponding to check/variable node processing of SC decoding will now be described. As described above, a polar code may obtain an LLR of bits in a u-domain by updating a check node and variable node, from an LLR of bits of an x-domain through LLR-based Genie-aided SC decoding (Stimming15). Here, a check node arithmetic operation $f(l_1, l_2)$ and a result thereof for two input LLRs $l_1, l_2$ may be represented as Equation 6.

$$l' \triangleq f(l_1, l_2) = \text{sgn}(l_1)\text{sgn}(l_2)\min(|l_1|, |l_2|) \quad \text{Equation 6}$$

In other words, only minimum values for two inputs are obtained as outputs during the check node arithmetic operation. Here, when Boolean approximation proposed in the disclosure is applied to $l_1$ and $l_2$ having real values, l' is l'≠0 only when both $l_1$ and $l_2$ are not 0. Because the check node arithmetic operation outputs a minimum value of an absolute value, when fading trends of two inputs are represented as Boolean variables $l_1, l_2$, fading of an output message may be represented as $l_1, l_2$ that is Boolean multiplication.

Figure 15:
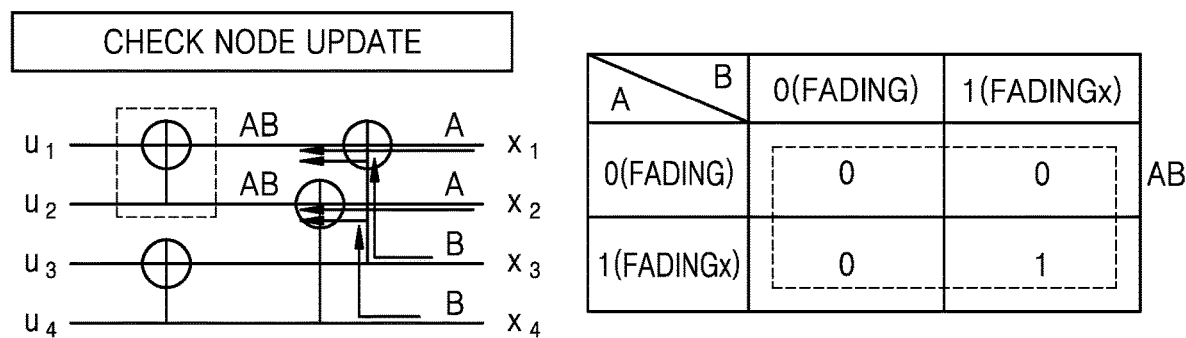
FIG. 15 is a diagram for describing a process of updating a fading variable when updating a check node according to an embodiment of the disclosure.

FIG. 15 is a diagram for describing a process of updating a fading variable when updating a check node according to an embodiment of the disclosure.

Referring to FIG. 15, a process of updating a fading stochastic variable during a first stage check node update of $\mathcal{X}_A=\{1,2\}$, $\mathcal{X}_B=\{3,4\}$ when N=4 is illustrated. When a codeword bit $x_1$ mapped to a fading block A and $x_3$ mapped to B, or a codeword bit $x_2$ mapped to A and $x_4$ mapped to B are combined at a check node and updated, AB is obtained.

On the other hand, for a variable node arithmetic operation $g(l_1, l_2, u_i)$, an LLR may be obtained by using two input LLRs $l_1, l_2$ and a previously determined source bit value $u_i$, as in Equation 7.

$$l'' = g(l_1, l_2, \beta_i) = (-1)^{\beta_i} l_1 + l_2 \quad \text{Equation 7}$$

In other words, addition of two LLRs are performed in the variable node. An output message is highly unlikely to be faded, excluding a case where two message inputs are both faded. When a fading operation of an input message is represented as a Boolean stochastic variable $l_1, l_2$, a fading operation of an output may be represented as $l_1+l_2$ that is an OR arithmetic operation.

In summary, a Boolean function-based fading approximation technique first represents a fading event of each fading block as a single Boolean variable, and evaluates a fading characteristic of an LLR message as a Boolean function in each decoding stage while tracking LLR-based Genie-aided SC decoding process. During this process, two arithmetic operations are performed, wherein multiplication of two Boolean variables is performed in a check node corresponding to downgrade, and an OR arithmetic operation of two Boolean variables is performed in a variable node corresponding to upgrade. Accordingly, a Boolean function corresponding to bits of a u domain may be calculated, and a diversity corresponding thereto may be calculated.

Figure 16:
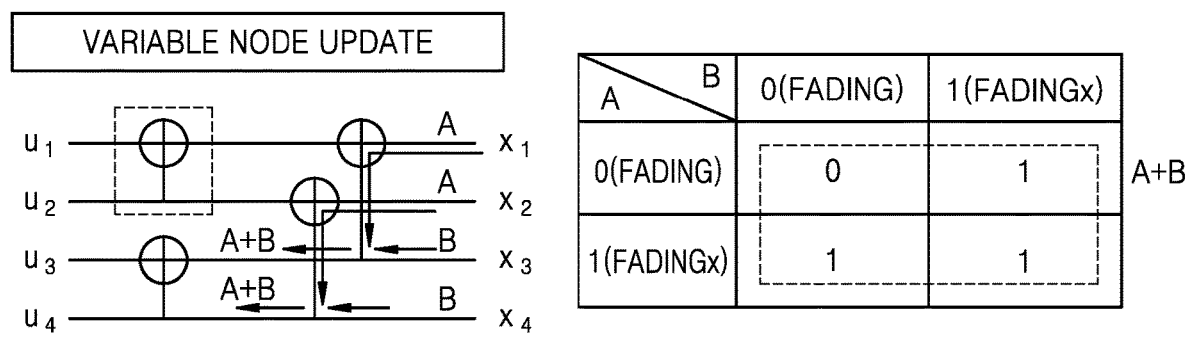
FIG. 16 is a diagram for describing a process of updating a fading stochastic variable when updating a variable node according to an embodiment of the disclosure.

FIG. 16 is a diagram for describing a process of updating a fading stochastic variable when updating a variable node according to an embodiment of the disclosure.

Referring to FIG. 16, it will be described how fading stochastic variables included in codeword bits are evaluated through a check node/variable node arithmetic operation, and how diversities of source bits are calculated. Referring to FIG. 16, N=4 and $\mathcal{X}_A=\{1,2\}$, $\mathcal{X}_b=\{3,4\}$.

For $u_1$, total two check node arithmetic operations are performed. The check node arithmetic operation is performed with respect to a fading stochastic variable AB included in bits allocated to $x_1$ and $x_3$ in a first stage, and the check node arithmetic operation is performed again with respect to AB obtained through a check node arithmetic operation of $x_2$ and $x_4$ in a second stage, and thus a fading stochastic variable of $u_1$ is AB. Unlike $u_1$, $u_2$ experiences one variable node arithmetic operation after one check node arithmetic operation. When represented as a diversity, (AB)+(AB)=AB. Similarly, update processes of $u_3$ and $u_4$ may be respectively represented as $(A+B)\cdot(A+B)=A+B$ and $(A+B)+(A+B)=A+B$ in equations.

FIG. 17 is a diagram for describing updating of a fading stochastic variables included in source bits according to an embodiment of the disclosure.

Referring to FIG. 17, N=8 and $\mathcal{X}_A=\{1,2,3,4\}$, $\mathcal{X}_B=\{5,6,7,8\}$.

In this case, a fading (Boolean) function of $u_1 \sim u_4$ is represented as AB and a fading function of $u_5 \sim u_8$ is represented as A+B. Here, source bits may be A (or B), AB, or A+B depending on an allocation pattern. In the disclosure, for convenience of description, a concept of survival count $n_s$ (when M=2, $n_s \in \{1,2,2^2-1\}$, and when M=4, $n_s \in \{1, 2, \ldots, 2^4-1\}$) corresponding to a state of a fading stochastic variable included in the source bits is introduced and a diversity is to be directly or indirectly evaluated based on the survival count. AB survives only in a case of M=2, A≠0, B≠0, and thus $n_s$=1, and for A (or B), $n_s$=2, and for A+B, $n_s$=3. In the example of FIG. 17, for $u_1$~$u_4$, $n_s$=1, and for $u_5$~$u_8$, $n_s$=3. When M=2, $n_s$=3 corresponds to full diversity 2.

Evaluation of diversity for each source bit is based on Genie-aided SC decoding and assumes that previous bits have been completely decoded. When SC decoding is actually performed, it is unable to achieve an evaluated diversity. This is because, due to characteristics of the SC decoding, when previous information bits are wrongly determined, it is unable to guarantee reliability or diversity of following information bits, since when a diversity of previous bits is low, the following information bits (may be subject to the previous bits. However, when a source bit is a fixed bit (frozen bit), determining (decoding) of the source bit does not affect decoding of a following source bit. Accordingly, to secure full-diversity of a code, all bits corresponding to an information set $\mathcal{A}$ need to have full-diversity. A polar code interleaver construction guaranteeing a diversity is provided by maximizing $\mathcal{A}$ that satisfies the full-diversity.

Meanwhile, considering a situation where a parameter of a code is provided, only a diversity of pre-determined information bits may be considered and a decoding performance may be affected by the lowest diversity among the diversity of each of pre-determined information bits In the disclosure, when the information bits in the information set $\mathcal{A}$ all have the full-diversity, it is defined that a diversity of the code also has the full-diversity. In particular, the code has the full-diversity when $n_s$ of all information bits is 3. In addition, it is defined that a diversity-1 is provided when the diversity of the code has a stochastic variable corresponding to A (or B), and a weak diversity-1 is provided when the diversity of the code has a stochastic variable corresponding to AB. For example, there may be a situation where data is transmitted by selecting four source bits from among eight source bits, i.e., a code rate is 0.5. In this case, an information set is $\mathcal{A}_{AWGN}$={4,6,7,8} for a code constructed based on an AWGNC performance, but minimum $n_s$ of bits in the set $\mathcal{A}$ is 1 (a fading stochastic variable of the code is AB), and thus there may be a bit having a weak diversity-1 in the information bits for an AWGN code (a code constructed considering AWGNC: PW-based code or 5G-NR code). On the other hand, when a code is constructed considering only a diversity, an information set is provided according to $\mathcal{A}_{div}$={5,6,7,8}, and because bits in the set $\mathcal{A}$ are all $n_s$=3, the code has a diversity-2.

According to embodiments of the disclosure, to provide a high code diversity without changing a conventional code, fading block allocation is applied through suitable BICM interleaving, thereby assigning a high diversity to information bits of a pre-constructed code.

Figure 18:
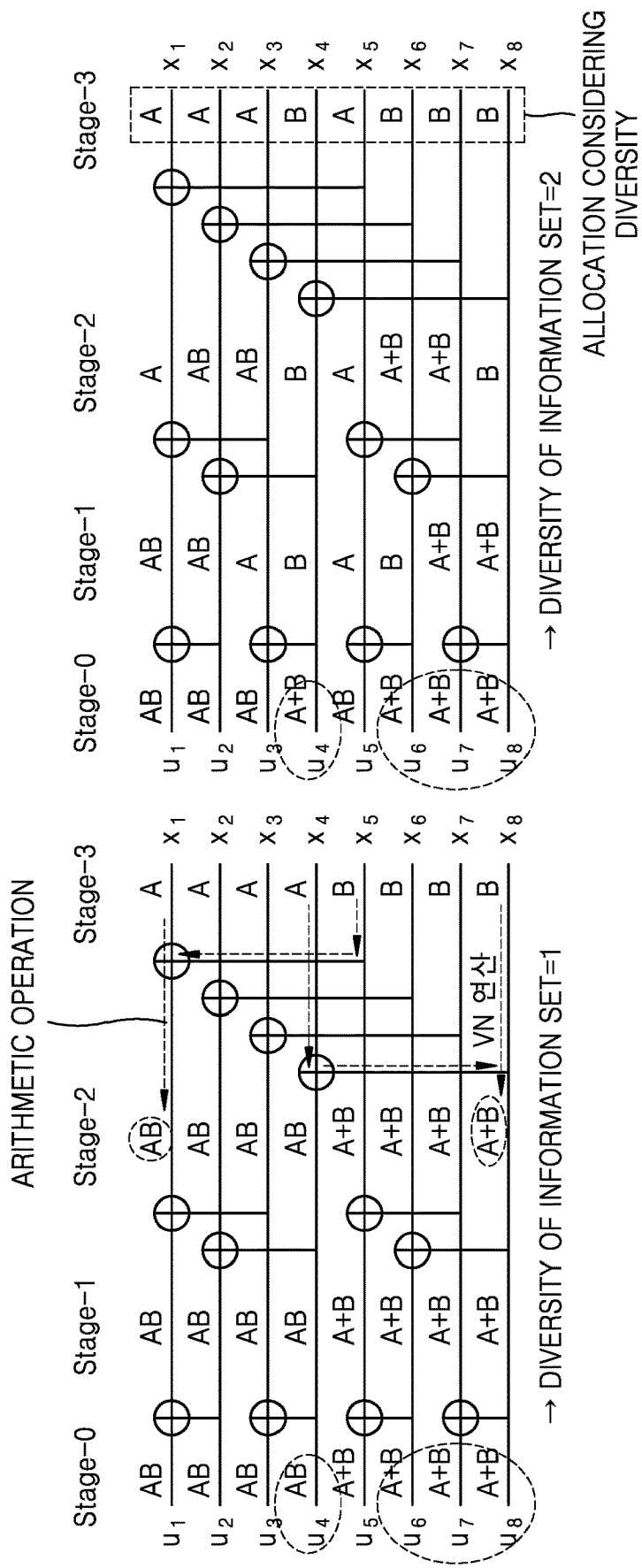
FIG. 18 is a diagram for describing a change in a diversity for each bit, according to fading block allocation through suitable interleaving of a codeword bit according to an embodiment of the disclosure.

FIG. 18 is a diagram for describing a change in a diversity for each bit, according to fading block allocation through suitable interleaving of a codeword bit according to an embodiment of the disclosure.

Referring to FIG. 18, in both a case where allocation is performed according to $\mathcal{X}_A$={1,2,3,4}, $\mathcal{X}_B$={5,6,7,8} as in a left diagram of FIG. 18 and a case where allocation is performed according to X $\mathcal{X}_A$={1,2,3,5}, $\mathcal{X}_A$={4,6,7,8} as in a right diagram of FIG. 18, four source bits have a fading approximation function A+B. However, as shown in FIG. 18, a location of an information bit having a code diversity-2 varies. Information bits in an AWGN code $\mathcal{A}_{AWGN}$={4,6,7,8} have a weak code diversity-1 according to minimum $n_s$=1 in the left diagram, but have a code diversity-2 according to minimum $n_s$=3 in the right diagram. In other words, a high diversity may be allocated to pre-determined information bits via codeword bit distribution through suitable interleaving, and this will be referred to as diversity alignment in the disclosure.

Figure 19:
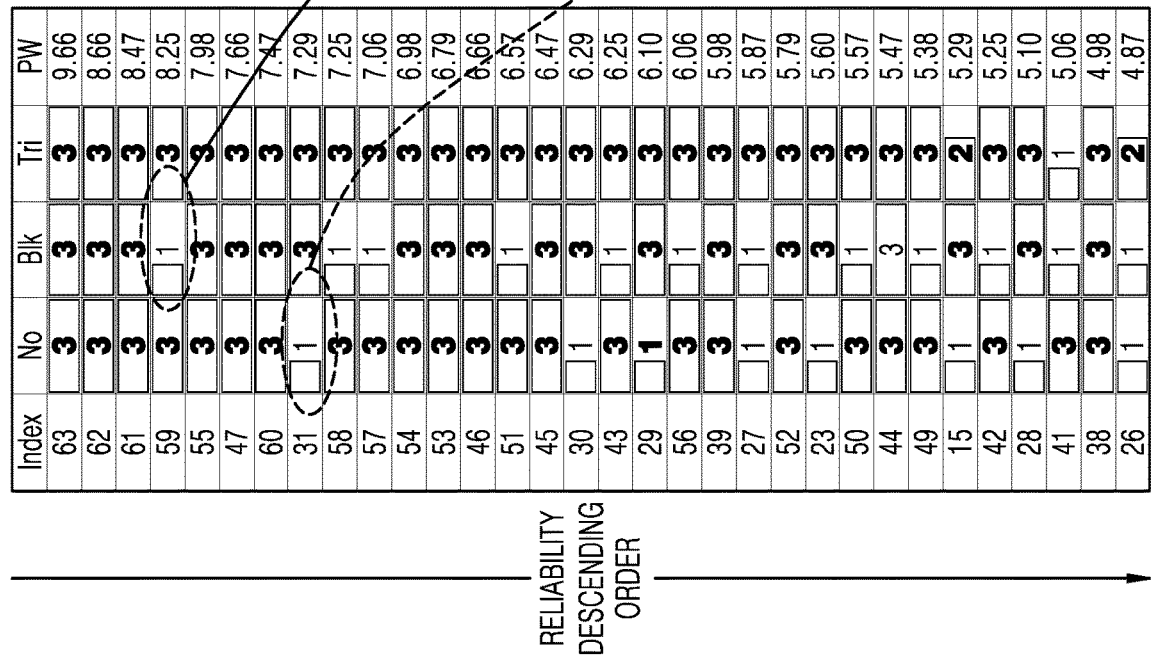
FIG. 19 is a diagram for analyzing a diversity according to an interleaving method and comparing a correlation between the diversity and a simulation performance, based on a Boolean approximation-based diversity analysis according to an embodiment of the disclosure.

FIG. 19 is a diagram for analyzing a diversity according to a conventional interleaving method and comparing a correlation between the diversity and a simulation performance, based on a Boolean approximation-based diversity analysis according to an embodiment of the disclosure.

Referring to FIG. 19, $n_s$ included in each bit is indicated in a descending order from a bit having high reliability when N=64, and 2nd to 4th columns indicate $n_s$ for each bit respectively when there is no interleaver (No), a block interleaver (Block) is applied, and a triangular interleaver (Tri) is applied. Also, a right diagram in FIG. 19 indicates a required signal-to-noise ratio (SNR) [dB] achieving BLER=$10^{-3}$ according to the number of information bits. In other words, the smaller the value of the required SNR, the better the performance.

Also, FIG. 19 illustrates $n_s$ (in an order of a code sequence $C_N$) for each source bit when there is no interleaver (NO), when a block interleaver is applied (BLK), and when a triangular interleaver is applied (TRI), in a 2-fading block channel, and a required SNR (dB) achieving BLER=$10^{-3}$, which correspond thereto.

Based on experiment results, when the block interleaver is used and K=3→4, a bit where $n_s$=1 is included in an information set $\mathcal{A}$, and thus a diversity of a code is decreased from 2 to a weak diversity-1, thereby greatly increasing a required SNR. In addition, when there is no interleaver, a decoding performance is greatly reduced when a bit in which an index is 31 is included in $\mathcal{A}$ (K=7→8). In the above example, the diversity is decreased to diversity-1 (or weak diversity-1) when K=10 when there is no interleaver, K=4 when the block interleaver is applied, and K=27 when the triangular interleaver is applied. In other words, the triangular interleaver relatively maintains diversity-2 even when K is high, and thus has an excellent performance. In summary, the Boolean approximation-based diversity analysis newly considered in embodiments of the disclosure has a very close relation with an actual simulation performance, and accordingly, an excellent performance of a conventional triangular interleaver may also be described.

Referring to FIG. 19, referring to $n_s$ for each bit included in the triangular interleaver, the triangular interleaver includes high $n_s$ in general, but does not include an optimum diversity arrangement. Here, the optimum diversity arrangement denotes an arrangement in which diversity-2 is provided as information bits of a code where R=0.5 all include $n_s$=3. In this regard, embodiments of the disclosure newly propose an interleaving method having an excellent fading performance by supplementing weaknesses of the triangular interleaver and approximating to the optimum diversity arrangement of a 5G-NR code. First, interleaver optimization through repetitive diversity evaluation may be performed. However, an interleaver optimized as such may have a limited code rate and limited length flexibility, and thus a more basic diversity alignment technique will be proposed.

Interleaving Method for Transmitting Diversity of Polar Code.

1) Interleaving Method for Fading Block Distribution of Modulated Codeword Bit When M=2.

Through an interleaving method for fading block distribution of a codeword bit, according to an embodiment of the disclosure, a code diversity-2 may be satisfied when R≤0.5 by transmitting a pre-constructed polar code of a full N=$2^n$ length. Before the introduction, a theoretical setoff regarding the number of source bits having full-diversity when M=2 will be first proposed.

Lemma. When M=2, the maximum number of source bits having diversity-2 is N/2.

Even when interleaving is not performed, the number of bits having full-diversity is always N/2, and thus as long as the degree of freedom of code construction is provided, it is very easy for a code to achieve full-diversity. However, because a satisfactorily constructed code is pre-determined in AWGNC, an interleaver (or a bit allocation pattern) needs to be well determined such that existing information source bits all have full-diversity. Accordingly, the disclosure proposes a new greedy algorithm that uses, as an output, an optimum bit allocation pattern guaranteeing full-diversity up to a code rate of 0.5. An algorithm when M=2 will be proposed first, and an optimum bit allocation pattern search algorithm of M>2 will be proposed next.

First, when a polarization weight or a polar code sequence $C_N$ defined according to a 5G-NR method is provided, the key is to create full-diversity one by one from an information bit having highest reliability. First, all codeword bits are allocated to block $X_1$. Here, according to a Boolean approximation-based diversity analysis tool, all source bits have diversity-1. After the initial setting process above, one bit is randomly selected at a time to be moved to a block $X_2$, and it is verified whether the bit has full-diversity in an order of $C_N$. Whenever each bit is moved, it is verified whether full-diversity is achieved by using the Boolean diversity analysis tool proposed above. The above process is shown in Algorithm 1.

---

Algorithm 1 Optimization of bit allocation for M = 2.

---

Input: Fading blocks $X_1$, and $X_2$;
Output: $\mathcal{X}'_{x_1}, \mathcal{X}'_{x_2}$;
1: Allocate all $x_i$'s to block $X_1$: $X_{X_1}$ = [N], $\mathcal{X}'_{x_2}$ = 0.
2: while The number of information bits with diversity 2 ≤ N/2 do
3:   Find bit index i such that the next reliable information
     bit has diversity 2 if $x_i$ is moved to block $X_2$.
4:   if found then
5:     Move the i from $\mathcal{X}'_{x_1}$ to $\mathcal{X}'_{x_2}$.
6:   else
7:     Stop optimization.
8:   end if
9: end while

---

For example, an optimum bit allocation pattern search example when a code length is N=8 and $C_8$=(7,6,5,3,4,2,1,0) will be described. First, all codeword bits are allocated to the block $X_1$ ( $\mathcal{X}_{x_1}$= $\mathbb{Z}_8$, $\mathcal{X}_{x_2}$=∅). Then, after selecting a random bit (index: i) in $\mathcal{X}_{x_1}$ and moving the same to the block X 2, it is verified whether a source bit $u_7$ has diversity-2. When $u_7$ has diversity-2, updates of $\mathbb{Z}_{x_1}$= $\mathbb{Z}_8$\{i}, $\mathcal{X}_{x_2}$={i} are performed, and then another bit is moved to the block X 2 to verify whether a next highly reliable $u_6$ has diversity-2. Algorithm 1 operates until all N/2 information source bits have full-diversity or until no particular source bit has full-diversity in any movement. In other words, Algorithm 1 ends when K=N/2 is reached or when a diversity-interleaver is not found.

Table 1 shows a diversity-interleaver search success probability of Algorithm 1. Code lengths were N∈{64, 128, . . . , 2048} and a polarization weight-based code construction sequence was considered. According to Algorithm 1, an optimum interleaver search was successful with a very high probability in a short-medium code length, and the search was successful with a probability of 20% even in a very long code length of N=2048. As a result, for a well-constructed code provided in AWGNC, many interleavers having full-diversity are found through Algorithm 1.

TABLE 1

Diversity-Interleaver Search Success Probability N∈ {64, 128, . . . , 2048} PW Code Assumption

| N | 64 | 128 | 256 | 512 | 1024 | 2048 |
|---|---|---|---|---|---|---|
| Rate | 0.998 | 0.983 | 0.933 | 0.795 | 0.525 | 0.190 |

In Table 2, maximum code rates guaranteeing full-diversity for various interleaver types are compared. Unlike identity (when interleaver is not applied), a square block interleaver, and a triangular interleaver, diversity-2 is always guaranteed at a code rate 0.5.

TABLE 2

Comparison of Full-Diversity Guaranteed Maximum Code Rate according to Code Length and Interleaver Type (M = 2)

|  |  | 64 | 128 | 256 | 512 | 1024 |
|---|---|---|---|---|---|---|
| Identity | $R_{max}$ | 0.125 | 0.094 | 0.066 | 0.051 | 0.040 |
| Block | $R_{max}$ | 0.063 | 0.195 | 0.020 | 0.158 | 0.006 |
| Triangular | $R_{max}$ | 0.406 | 0.336 | 0.426 | 0.336 | 0.406 |
| Proposed | $R_{max}$ | 0.500 | 0.500 | 0.500 | 0.500 | 0.500 |

Among many types of optimized interleavers, it was verified that a code sequence-based interleaver that conforms to BD while satisfying symmetry is one of the interleavers. In other words, a method of using a code sequence $C_N$ as an interleaver sequence after Algorithm 1 is also proposed.

As described above, $n_A$ and $n_B(n_A+n_B=N)$ may be different from each other. This concept may be expanded and referred to as uniform allocation when bits allocated to all blocks are the same when M>2. Here, $$X_A = C_N\left[0:\frac{N}{2} - 1\right], X_B = C_N\left[\frac{N}{2}:N - 1\right]$$

are determined for $\mathcal{X}_p$, $\mathcal{U}_p$ satisfying binary domination and an ordered set (code ordered set) $\mathcal{C}_N$ of indexes provided in an order of a code sequence $C_N$ of split channels. This process may be achieved by performing interleaving on a codeword vector in an order of $C_N$, dividing the interleaved codeword vector forward and backward, and allocating the same to two blocks. Here, following results may be obtained based on Lemma 7.

Theorem 8. When a code sequence $C_N$ is symmetric for a polar code defined by the code sequence $C_N$ in which a mother code length is N=$2^n$, u-domain bits corresponding to information bits of $$C_N\left[0:\frac{N}{2} - 1\right]$$

have diversity-2 when a codeword vector x is allocated to two fading blocks based on $$X_A = C_N\left[0:\frac{N}{2} - 1\right], X_B = C_N\left[\frac{N}{2}:N - 1\right].$$

In other words, codeword interleaving through $C_N$ and a same block allocation method may satisfy full-diversity at a code rate R<0.5. As will be described below, even when a codeword sequence is not symmetric, a full-diversity performance approximating to a code rate 0.5 may be realized when the codeword sequence has high symmetry.

Figure 20:
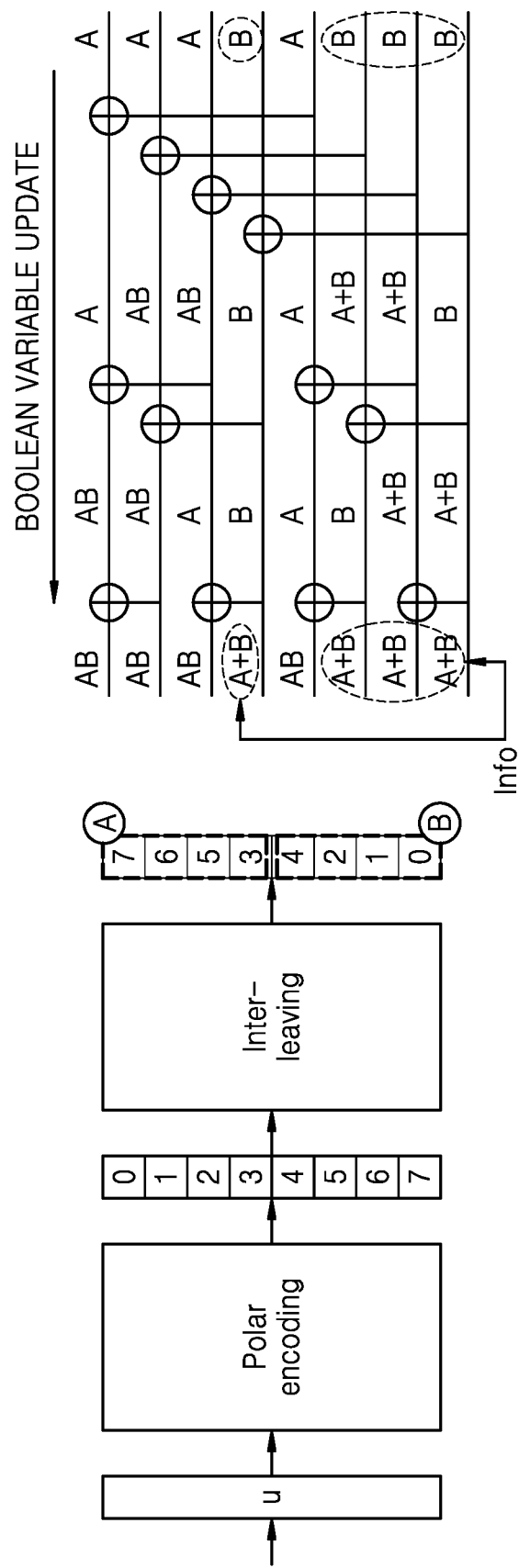
FIG. 20 is a diagram for describing an interleaving method and effects, which guarantee a diversity, according to an embodiment of the disclosure.

FIG. 20 is a diagram for describing an interleaving method and effects, which guarantee a diversity, according to an embodiment of the disclosure.

Referring to FIG. 20, a diversity included in source bits when same numbers ($n_A=n_B=4$) of codeword bits are allocated to two different resource blocks, based on a code sequence (i.e., interleaver sequence $I_N$=code sequence $C_N$), is illustrated. When a code length is 8, $C_8$=[7 6 5 3 4 2 1 0], and at this time, index sets of bits allocated to blocks A and B, based on uniform allocation, are respectively $X_A$=set($C_8$[0:3])={7,6,5,3}, $X_B$=set($C_8$[4:7])={4,2,1,0}. Here, set(·) is a function converting an ordered set or sequence into a set. In this case, bits in a u-domain having a same index as a bit index allocated to the block A in an x-domain may include $n_s$=3, and bits in the u-domain having a same index as a bit index allocated to the block B includes $n_s$=. However, when the code sequence $C_N$ is not symmetric, the number of source bits of the u-domain having a full-diversity may be reduced. This will be described in detail below.

2) Interleaving Method for Fading Block Distribution After Modulation of Codeword Bit When M>2.

Algorithm 2 indicates a method of searching for an optimum bit allocation pattern when M>2. Similar to Algorithm 1, all codeword bits are allocated to the block $X_1$ for initial setting. Then, (M−1)-tuple codeword bits ($x_{i-1}$, $x_{i-2}$, ..., $x_{i-M-1}$, ) are respectively moved to blocks $X_2$, ... $X_{M-1}$, and then it is verified whether a first source bit of $C_N$ has diversity-M. When successful, updates of $X_{X_1}= \mathbb{Z}_N\setminus\{i_1...,i_{M-1}\}$, $X_{X_2}=\{i_1\}$, ..., $X_{X_M}=\{i_{M-1}\}$ are performed, and then the above processes are repeated. Algorithm 2 is repeated when K=[N/M] is reached or when full-diversity is not achieved even by moving any tuple.

---
Algorithm 2 Optimization of bit allocation for M > 2.
---

Input: Fading blocks $X_1$, $X_2$, ..., $X_M$;
Output: $X_{X_1}, X_{X_2}, ..., X_{X_M}$;
  1: Allocate all $x_i$'s to block $X_1$: $X_{X_1}$ = [N], $X_{X_2}$ = ... = $X_{X_M}$ = 0.
  2: while The number of information bits with diversity 2 ≤ N/M] do
  3:   Find ($i_1$, ..., $i_{M-1}$) such that the next reliable information bit has diversity M if ($x_{i_1}$, ..., $x_{i_{M-1}}$) is moved to block ($X_2$, ..., $X_M$).
  4:   if found then
  5:     Move $i_1$, $i_2$, ..., $i_{M-1}$ from $X_{X_1}$ to
  6:     $X_{X_2}, X_{X_3}, ..., X_{X_M}$, respectively.
  7:   else
  8:     Stop optimization.
  9:   end if
10: end while In Tables 3 and 4, maximum code rates $R_{max}$ guaranteeing full-diversity of interleavers found through Algorithm 2 and conventional interleavers are compared respectively when M=3, 4. For an identity interleaver, $R_{max}$ is gradually decreased when a code length is increased. For a triangular interleaver, $R_{max}$ is high compared to the identity interleaver and a square block interleaver, but a proposed interleaver has full-diversity up to a much higher code rate area.

TABLE 3

Comparison of Full-Diversity Guaranteed Maximum Code Rates according to Code Length and Interleaver Type (M = 3)

| N | | 32 | 64 | 128 | 256 | 512 |
|---|---|---|---|---|---|---|
| Identity | $R_{max}$ | 0.156 | 0.109 | 0.086 | 0.063 | 0.049 |
| Block | $R_{max}$ | 0.156 | 0.047 | 0.086 | 0.016 | 0.092 |
| Triangular | $R_{max}$ | 0.219 | 0.234 | 0.250 | 0.215 | 0.156 |
| Proposed | $R_{max}$ | 0.313 | 0.328 | 0.313 | 0.316 | 0.320 |

TABLE 4

Comparison of Full-Diversity Guaranteed Maximum Code Rates according to Code Length and Interleaver Type (M = 4)

| N | | 32 | 64 | 128 | 256 | 512 |
|---|---|---|---|---|---|---|
| Identity | $R_{max}$ | 0.125 | 0.078 | 0.055 | 0.043 | 0.031 |
| Block | $R_{max}$ | 0.125 | 0.031 | 0.047 | 0.012 | 0.031 |
| Triangular | $R_{max}$ | 0.156 | 0.109 | 0.156 | 0.102 | 0.129 |
| Proposed | $R_{max}$ | 0.250 | 0.250 | 0.250 | 0.246 | 0.245 |

Figure 21:
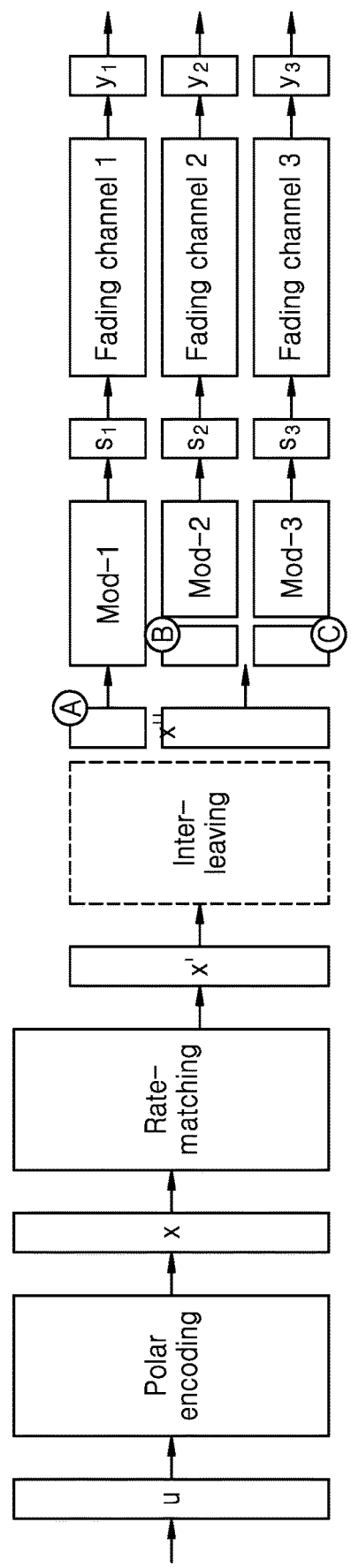
FIG. 21 is a diagram for describing a block allocation method of modulated codeword bits, according to an embodiment of the disclosure.

FIG. 21 is a diagram for describing a block allocation method of modulated codeword bits, according to an embodiment of the disclosure.

Referring to FIG. 21, M=3. As in M=2, when M>2, it is important to secure a diversity of 2 in as many source bits as possible. When the numbers of bits allocated to blocks A, B, and C are respectively indicated as $n_A$, $n_B$, $n_C$, and puncturing/shortening is performed by J bits, values of $n_A$, $n_B$, $n_C$ may be determined to be very close to (N−J)/3 and may be non-homogeneously allocated to $n_A \neq n_B \neq n_C$ depending on a situation. When indexes corresponding to a bit set $X_B$ where $n_s$=3 when M=2 are arbitrarily allocated to the blocks B and C, a value of diversity for each bit under genie-aided SC decoding may be guaranteed to be at least 2. However, such a case does not guarantee a full-diversity.

Figure 22:
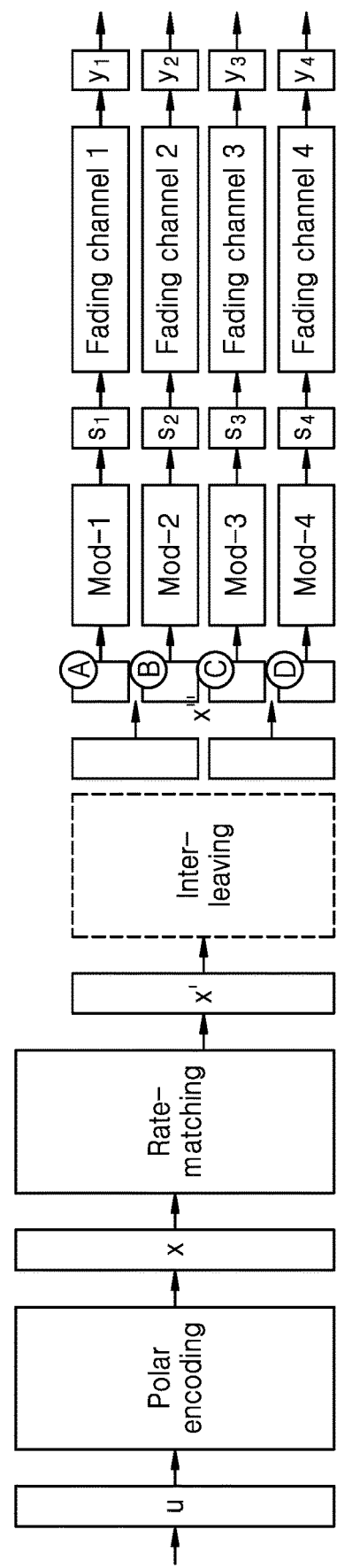
FIG. 22 is a diagram for describing a block allocation method of modulated codeword bits, according to an embodiment of the disclosure.

FIG. 22 is a diagram for describing a block allocation method of modulated codeword bits, according to an embodiment of the disclosure.

Referring to FIG. 22, modulated codeword bits may be allocated to four different resource blocks. In this case, as described above, allocation of $$X_A = C_N\left[0:\frac{N}{2}-1\right], X_B = C_N\left[\frac{N}{2}:N-1\right]$$

satisfying $n_A=n_B$ when M=2 satisfies code diversity-2 up to R=0.5 , and thus even when the modulated codeword bits are allocated to four blocks as in FIG. 22, a minimum value-2 may be guaranteed as a diversity for each bit regardless of a pattern allocated to C and D in $X_B$. According to situations, same numbers of bits, i.e., $n_A=n_B=n_C=n_D$, may be allocated to fading blocks, and when $n_A$, $n_B$, $n_C$, $n_D$ have different values, the bits may be non-homogeneously allocated.

A range of code rates satisfying diversity 2 for each bit may vary depending on symmetry of a code sequence. Hereinafter, a PW sequence in which a code sequence is symmetric and a 5G-NR code sequence that is asymmetric are considered, and code rates at which the PW sequence and the 5G-NR code sequence guarantee diversity 2 (full-diversity when M=2) will be identified. Also, a diversity performance is expanded while guaranteeing flexibility and good AWCNC performance through symmetry modification of the 5G-NR code sequence.

Before detailed descriptions, additional notations will be briefly introduced. For a set $\mathcal{X} \subset \mathbb{Z}_N = \{0, 1, \ldots, N-1\}$, a complementary set of $\mathcal{X}$ is indicated as a symbol $\mathcal{X}'$, and $\mathbb{Z} = \mathbb{Z}_N \setminus \mathcal{X}$. Also, a reverse set of the set $\mathcal{X}$ (or the one's complement set) is defined as $\widetilde{\mathcal{X}} = \{N-i | i \in \mathcal{X}\}$. When cardinality of the set $\mathcal{X}$ is $|\mathcal{X}|=a$, sizes of the complementary set and the reverse set are respectively $|\mathcal{X}'|=N-a$, $|\widetilde{\mathcal{X}}|=a$. For example, when $\mathcal{X}=\{0,1,2\}$ for $\mathbb{Z}_8$, $\mathcal{X}'$ and $\widetilde{\mathcal{X}}$ are respectively $\mathcal{X}'=\{3,4,5,6,7\}$ and $\widetilde{\mathcal{X}}=\{5,6,7\}$.

Also, for a listed integer set or sequence (ordered set) $\mathcal{Z}$, when $$x = z\left[0:\frac{N}{2}-1\right], y = z\left[\frac{N}{2}:N-1\right] \text{ is } x \cap \tilde{y} = x \text{ or } \tilde{x} \cap y = y,$$

$\mathcal{Z}$ is symmetric (In this case, when $\mathcal{Z}$ is symmetric while satisfying BD, $\mathcal{Z}$ is BD-symmetric). For example, when $\mathcal{Z}_1=\{7,6,5,3,4,2,1,0\}$, and $\mathcal{X}_1=\{7,6,5,3\}$, $\mathcal{Y}_1=\{4,2,1,0\}$ and $\widetilde{\mathcal{X}_1} \cap \mathcal{Y}_1 = \mathcal{Y}_1$ is satisfied, and thus a symmetric sequence and a BD property are satisfied. On the other hand, when $\mathcal{Z}_2=\{7,6,5,2,4,3,1,0\}$, BD is not satisfied, and $\mathcal{X}_2=\{7,6,5,2\}$, $\mathcal{Y}_2=\{4,3,1,0\}$, and $\widetilde{\mathcal{X}_2} \cap \mathcal{Y}_2=\{0,1\} \neq \mathcal{Y}_2$, and thus symmetry is also not satisfied. As a result, for a code constructed to satisfy a BD property and symmetry, a diversity-2 is guaranteed at a code rate $R \leq 0.5$. In the disclosure, a proposed interleaving and block allocation technique has a BD property, but even for an asymmetric conventional 5G-NR code, a high code diversity is securable for a general code parameter compared to conventional interleavers. Descriptions will be developed based on a polarization-weight (PW) sequence as an example of a symmetric code sequence having a BD property and a 5G-NR code sequence as an example of asymmetric code having a BD property.

1) Symmetric Code: Polarization-Weight (PW)-Based Code Sequence.

As described in the background of a polar code, a polarization weight is a method of approximating and evaluating qualities of split channels to a weighted sum, and symmetry is satisfied as in $\widetilde{\mathcal{C}}_A \cap \mathcal{C}_B = \mathcal{C}_B$ for a sequence $\mathcal{C}_N = [\mathcal{C}_A | \mathcal{C}_B]$ obtained during a PW-based code construction.

For example, when a PW-based code construction method is assumed when N=64, $C_{64}$=[63 62 61 59 55 47 60 31 58 57 54 53 46 51 45 30 43 29 56 39 27 52 23 50 44 49 15 42 28 41 38 26 37 25 22 35 21 48 14 19 13 40 11 36 24 7 34 20 33 18 12 17 10 9 6 5 32 3 16 8 4 21 0]. Accordingly, $\widetilde{\mathcal{C}}_A$=[26 38 41 28 42 15 49 44 50 23 52 27 39 56 29 43 30 45 51 46 53 54 57 58 31 60 47 55 59 61 62 63] and $\widetilde{\mathcal{C}}_B$=[0 1 2 4 8 16 3 32 5 6 9 10 17 12 18 33 20 34 7 24 36 11 40 13 19 14 48 21 35 22 25 37], and for all i, $\widetilde{\mathcal{C}}$ (i)+$\widetilde{\mathcal{C}}$ (N−1−i)=N−1 is satisfied, and thus a PW-based code sequence satisfies a BD property and symmetry ($\widetilde{\mathcal{C}}_A \cap \widetilde{\mathcal{C}}_B = \widetilde{\mathcal{C}}_B$).

In other words, when a single codeword is allocated to two channels having different fading coefficients under SC decoding, a diversity-2 is guaranteed when R≤0.5 in a case where a code $\mathcal{C}$ satisfying a BD property and symmetry is $\mathcal{X}_A=$ $$C_N\left[0:\frac{N}{2}-1\right] \mathcal{X}_B = C_N\left[\frac{N}{2}:N-1\right].$$

2) Asymmetric Code:5G-NR Code Sequence.

Unlike the PW-based code sequence, the 5G-NR code sequence stores a single code sequence (reliability ascending order code sequence) $Q_{1024}$ for $N_{max}$=1024, and determines $C_N = \{i < N_1 | i \in Q_{1024}\}$ when a code sequence for $N = N_1 < N_{max}$ is used. In other words, a new sub-code sequence is configured by selecting an index of $i < N_1$. Here, $Q_{1024}$ is a code determined such that an AWGNC performance is excellent through an empirical method.

FIG. 23 is a diagram for describing bit indexes arranged in an order of a code sequence $C_N$ and diversity values corresponding thereto according to an embodiment of the disclosure.

Referring to FIG. 23, when N=64, a 5G-NR code sequence is $C_0{}^{63}C_{64}$=[63 62 61 59 55 47 31 60 58 57 54 53 46 51 45 30 43 29 39 27 56 52 15 50 44 49 42 28 41 38 22 25 37 26 35 21 14 48 13 19 40 11 7 36 24 34 20 33 18 10 17 6 9 32 16 8 4 2 1 0]. Accordingly, $C_{64}[0:31]$=[22 38 41 28 42 49 44 50 15 52 23 56 27 39 29 43 30 45 51 46 53 54 57 58 60 31 47 55 59 61 62 63] and $C_{64}[0:31]$=[0 1 2 4 8 16 32 3 5 9 6 17 10 18 12 33 20 34 24 36 7 11 40 19 13 48 14 21 35 26 37 25]. Here, $\widetilde{\mathcal{C}}_B \cap \mathcal{C}_B{}^c=\{41,22\} \neq \emptyset$ and thus a 5G-NR code for N=64 is an asymmetric code.

Due to a bit set {41,22}, {37,26} inducing asymmetry, bits in which $n_s$=2 ($n_s \neq 3$) are generated compared to a symmetric sequence.

Referring to FIG. 23, indexes (source bits) of the 5G-NR code are arranged in an order of a code sequence $C_N$ when N=64, and $n_s$ of each corresponding source bit is illustrated. Here, a first row of a first box corresponds to $$C_A\left(=C_N\left[0:\frac{N}{2}-1\right]\right),$$

and a second row corresponds to $$C_B\left(=C_N\left[0:\frac{N}{2}-1\right]\right),$$

Bit pairs violating symmetry in $C_A$, $C_B$ are respectively {41,22} and {37,26}.

First, source bits corresponding to $\mathcal{C}_A \setminus \{41,22\}$ have $n_s$=3, bits corresponding to $\mathcal{C}_B \setminus \{37,26\}$ have $n_s$=1, and bits of {41,22,37,26} inducing asymmetry have $n_s$=2. In other words, a location of a first bit generating asymmetry is a point where a diversity is decreased to a diversity-1 (or a weak diversity-1), and thus a maximum code rate for maintaining a code diversity-2 varies depending on the location of the first bit. In embodiments of the disclosure, it is reviewed whether 1) an excellent decoding performance is exhibited compared to a conventional triangular 2) a fading channel performance and an AWGNC performance are securable even when a code or code sequence is reconstructed to remove asymmetry.

First, an electronic device according to an embodiment of the disclosure 1) identifies whether an excellent diversity and decoding performance is exhibited compared to a conventional triangular interleaver even when an asymmetric code sequence is used. In other words, the electronic device identifies symmetry of a code when the code, such as N=64,128,256, is selected from a 5G-NR code sequence $C_{1024}$ and used, and analyzes how much the code affects a diversity.

Figure 24:
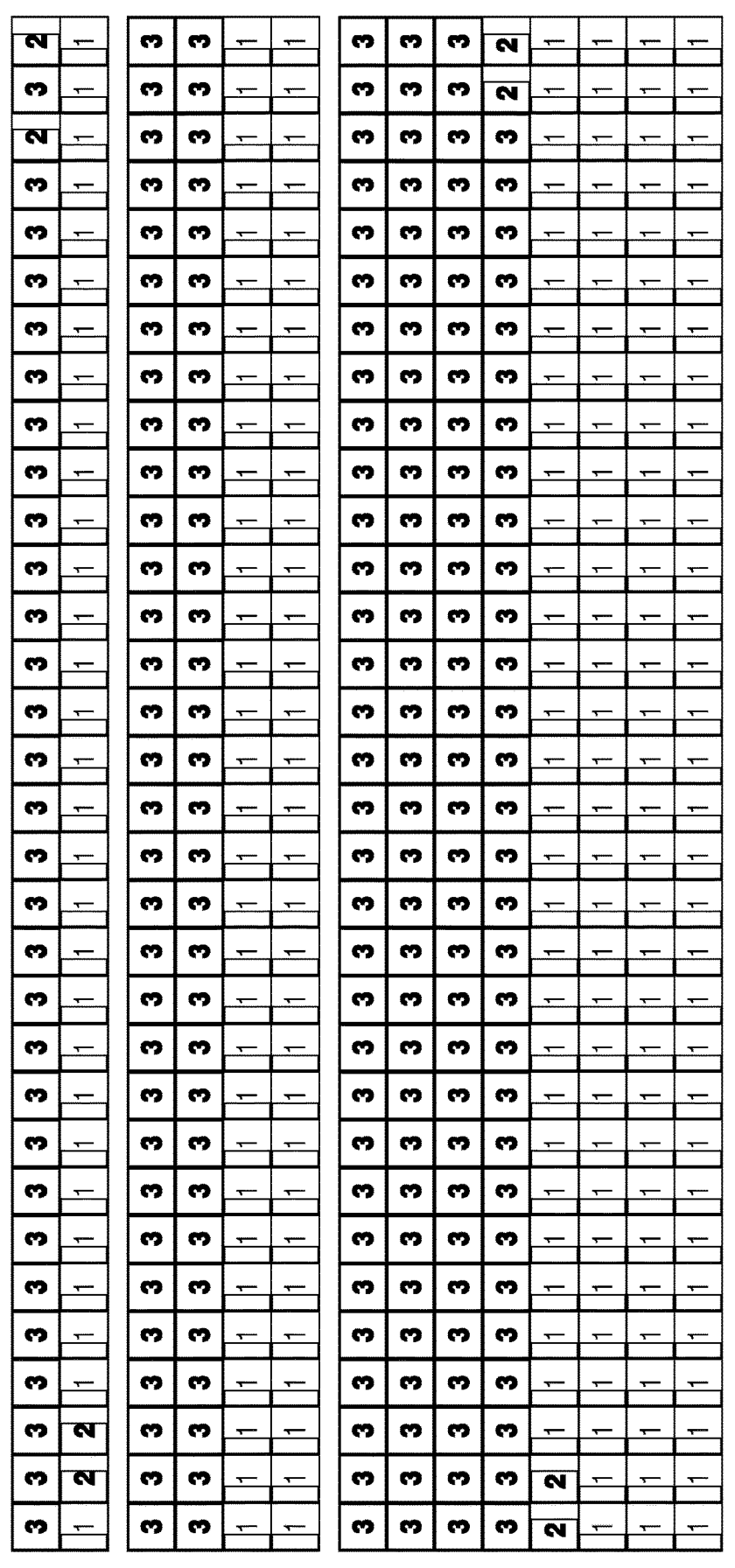

FIG. 24 is a diagram showing reliabilities of bits for each of an interleaver and a triangular interleaver, in a descending order, according to an embodiment of the disclosure.

Referring to FIG. 24, $n_s$ of bits when an interleaver and triangular interleaver according to an embodiment of the disclosure are each applied to N=64,128,256 are illustrated in an order of a code sequence $C_N$.

$n_s$ of bits arranged in the order of the code sequence $C_N$ are compared when a 5G-NR code (BD and asymmetric) is used when N=64,128,256. As described above, the 5G-NR code is a sub-sequence of a pre-constructed sequence $C_{1023}$ having a length of 1024, and may be symmetric or asymmetric depending on a length. In conclusion, N=128 guarantees a diversity-2 when R=0.5, but for N=64,256, there are bits where a diversity-2 is damaged when R<0.5.

First, when a code length N=64, an asymmetric code sequence is obtained as a result. Here, a diversity-2 is guaranteed up to K=29 considering a codeword bit allocation method (or an interleaving method) of the disclosure, and $$\left(R \leq \frac{29}{64}\right)$$

diversity-2 is provided in a wider area than a triangular interleaver that is the related art guaranteeing diversity-2 only up to K=23. When N=128, a 5G-NR code sequence is symmetric as a result, and thus a diversity-2 is guaranteed up to K=64, i.e., R≤0.5, as in a case where a symmetric sequence is used. On the other hand, when the triangular interleaver is applied, a diversity is decreased to a diversity-2 when K=39, and thus a performance gain is secured when K=39–64. Lastly, when N=256, a bit having $n_s$=2 as an asymmetric code sequence first appears when K=127. A bit causing asymmetry in the 5G-NR code generally appears very close to R=0.5. A diversity-2 maximum guarantee K value of the conventional triangular interleaver is only K=105, whereas a combination of interleaver 5G-NR code sequences of the disclosure guarantees a diversity-2 up to K=126, and thus there is only a difference of 2 from an achievable maximum value 128. In this regard, asymmetry is not great even when the 5G-NR code sequence is used, and thus an AWGNC performance may be maintained while obtaining a performance gain of approaching the optimum in a fading channel.

Next, 2) a diversity in a block fading channel may be optimized by reconstructing a code for summarization when a provided code sequence is asymmetric. When an asymmetric code sequence is used, a code is not changed, and thus an AWGNC is maintained, whereas according to a method of reconstructing a code, an excellent performance may be guaranteed as a diversity-2 is maintained up to R=0.5 in a block fading channel, but an AWGNC performance may deteriorate because the code is changed. However, the number of bits causing asymmetry in the 5G-NR code is only 1 to 2, and thus the bits barely affects an actual simulation performance. Accordingly, a case where the 5G-NR code is used and a case where a symmetric PW code is used both maintain an AWGNC performance and at the same time, secure a great performance gain compared to the related art in a fading situation.

Figure 25:
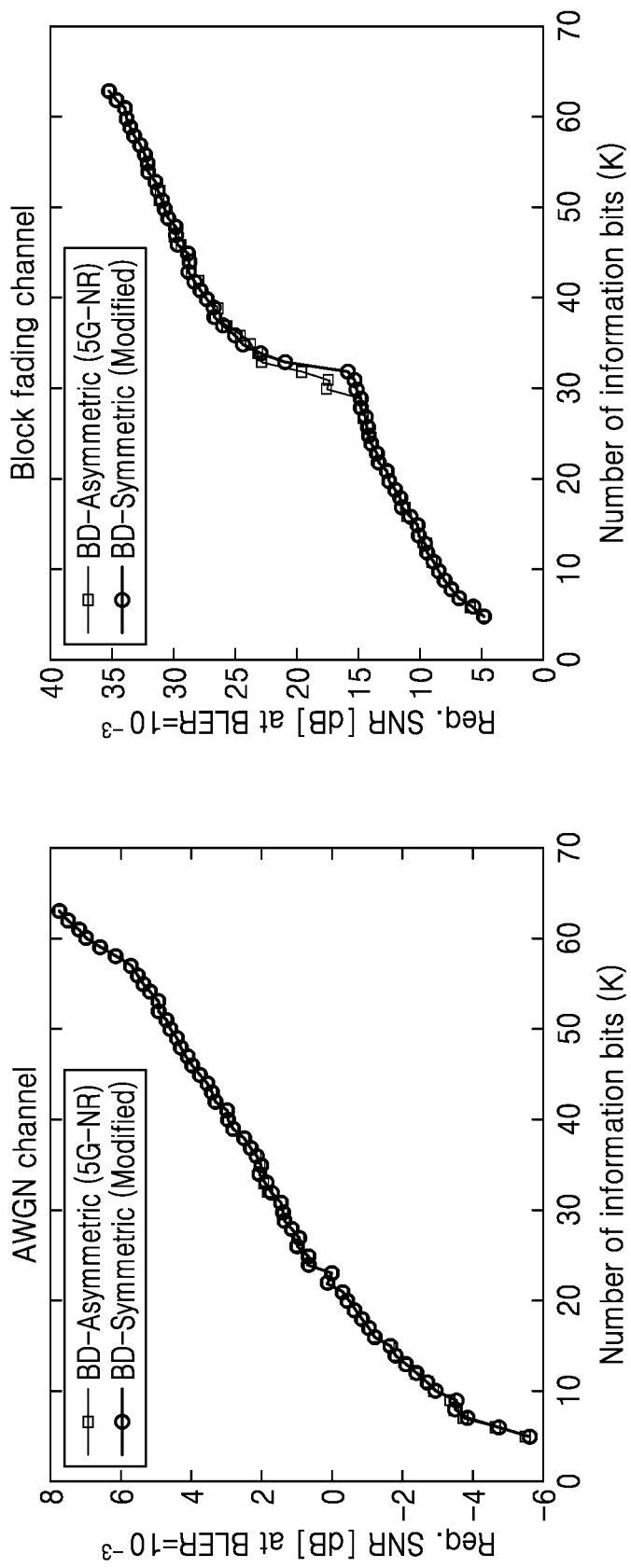
FIG. 25 is a graph comparing required signal-to-noise ratio (SNR) [dB] performances achieving a block error rate (BLER) 0.1% of a code modified to have symmetry with an asymmetric 5G-NR code in an additive white Gaussian noise channel (AWGNC) and a block fading channel according to an embodiment of the disclosure.

FIG. 25 is a graph comparing required SNR [dB] performances achieving a BLER 0.1% of a code modified to have symmetry with an asymmetric 5G-NR code in an AWGNC and a block fading channel according to an embodiment of the disclosure.

Referring to FIG. 25, N=64 and biphase shift keying (BPSK) are assumed. Also, a 5G-NR code may be modified to be symmetric by substituting bits generating asymmetry in $X_A$ and $X_B$ with each other.

The 5G-NR code has a sequence of [63 62 61 59 55 47 31 60 58 57 54 53 46 51 45 30 43 29 39 27 56 52 15 50 44 49 42 28 41 38 22 25 37 26 35 21 14 48 13 19 11 7 36 24 34 20 33 18 10 17 6 9 5 32 16 8 4 2 1 0] and the modified code has a sequence of [63 62 61 59 55 47 31 60 58 57 54 53 46 51 45 30 43 29 39 27 56 52 15 50 44 49 42 28 41 38 37 25 22 26 35 21 14 48 13 19 40 11 7 36 24 34 20 33 18 10 17 6 9 32 16 8 4 2 1 0] by substituting {41,22} and {37,26}, which induce asymmetry, with each other.

Through the graphs of FIG. 25, required SNRs [dB] of a BD-asymmetric code and a symmetrically modified code, which achieve BLER=0.1%, in a BPSK-AWGNC and block fading channel are identified.

A left graph of FIG. 25 indicates a BPSK-AWGNC performance, and it is identified that performances achieving BLER=0.1% before and after the modification are almost the same. Also, it is identified, through a right graph of FIG. that an area where an AWGNC decoding performance is improved by removing asymmetry from a BPSK-block fading channel.

It is identified, through the graphs of FIG. 25, that when an interleaving method according to an embodiment of the disclosure is used, a diversity-2 is provided in a wider area than the related art even when the asymmetric 5G-NR code is used, and a fading performance is improved while maintaining an AWGNC performance even when a code is modified to remove asymmetry.

FIG. 26 is a diagram for comparing the maximum numbers $K_{max}$ of information bits guaranteeing diversity-2, according to an interleaving type and a code length according to an embodiment of the disclosure.

When there is no interleaver or a block interleaver (square block interleaver) is considered, a diversity-2 is not fully guaranteed even at a low code rate, such as R=0.2, and in particular, in a case of the block interleaver, when a code length is N=$(2^b)^2$(b=1, . . . ), a diversity is greatly decreased in association with a structural feature. On the other hand, a conventional triangular interleaver guarantees a diversity-2 even for a relatively high code rate. However, an interleaver according to an embodiment of the disclosure has a code diversity-2 up to a higher code rate, and may have a great performance gain by a higher diversity than the triangular interleaver in a code rate area of R=0.33~0.50.

Interleaving and codeword bit allocation method of polar code considering rate-matching.

A code length of a polar code is limited to N=$2^n$(n=1, 2, . . . ) according to a construction characteristic, and to apply the limited code length to actual practical 5G/B5G/6G communication, various code lengths and code rates need to be flexibly supported. For example, an effective code length E required to transmit 50-bit data at a ½ code rate is $$E = \frac{K}{R} = 50/(0.5) = 100.$$

In tnis case, 36 bits may be repeatedly transmitted from N=2⁶=64 bits or 28 bits may be punctured or shortened from N=2⁷=128 bits. In the standard, the puncturing is applied to R≤7/16 that is a relatively low-to-moderate code rate area, and the shortening is applied to higher code rate transmission.

technique for a modified code is to be proposed. Uniform allocation is mainly considered, but quasi-uniform allocation in which the number of bits for each block is almost the same does not exceed an intention and application range of the technique of the disclosure. A code length of a punctured polar code is adjusted to (N−| $\mathcal{X}_p$|), and in a case of uniform

TABLE 5

Comparison of K areas to which puncturing and shortening are applied, according to code length and number of punctured/shortened bits

| N | Punctured bit | 0 | 4 | 8 | 12 | 16 | 20 | 24 | 28 | 32 | 36 | 40 | 44 | 48 | 52 | 56 |
|---|---|---|---|---|---|---|---|---|---|---|---|---|---|---|---|---|
| 32 | M | 32 | 28 | 24 | 20 | 16 | | | | | | | | | | |
|  | Puncturing (Max. K) | 14 | 12 | 10 | 8 | 7 | | | | | | | | | | |
|  | Shortening (Min. K) | 15~ | 13~ | 11~ | 9~ | 8~ | | | | | | | | | | |
| 64 | M | 64 | 60 | 56 | 52 | 48 | 44 | 40 | 36 | 32 | | | | | | |
|  | Puncturing (Max. K) | 28 | 26 | 24 | 22 | 21 | 19 | 17 | 15 | 14 | | | | | | |
|  | Shortening (Min. K) | 29~ | 27~ | 25~ | 23~ | 22~ | 20~ | 18~ | 16~ | 15~ | | | | | | |
| 128 | M | 128 | 124 | 120 | 116 | 112 | 108 | 104 | 100 | 96 | 92 | 88 | 84 | 80 | 76 | 72 |
|  | Puncturing (Max. K) | 56 | 54 | 52 | 50 | 49 | 47 | 45 | 43 | 42 | 40 | 38 | 36 | 35 | 33 | 31 |
|  | Shortening (Min. K) | 57~ | 55~ | 53~ | 51~ | 50~ | 48~ | 46~ | 44~ | 43~ | 41~ | 39~ | 37~ | 36~ | 34~ | 32~ |

Table 5 shows, in detail, the K areas to which techniques are applied according to the number of punctured/shortened bits. For example, when N=64, an area to which the puncturing is applied when the number of punctured/shortened bits is 16 is K≤21, and the shortening is applied when K>22 that is a relatively high code rate. The puncturing is used in a relatively low code rate area, and thus a sufficient diversity improvement effect may be exhibited through the disclosure in an area where $n_s$=1 or 2 due to structural vulnerability of the related art. On the other hand, the shortening is considered when R≥7/16. Accordingly, a full-diversity is not obtained in an R>1/2 area, and thus performance improvement may be expected in an $$\frac{7}{16} \leq R \leq \frac{1}{2}$$

area. In embodiments of the disclosure, efficient diversity transmission using a polar code is enabled through a construction of an interleaver comprehensively considering even a code rate.

Interleaver and codeword allocation operating method for guaranteeing diversity of punctured/shortened polar code.

As described above, in a case where there is no rate-matching, when codeword bits having indexes corresponding to the first half and codeword bits having indexes corresponding to remaining half are respectively allocated to blocks A and B, regarding a code sequence $C_N$ satisfying BD property and symmetry, through an interleaving method according to an embodiment of the disclosure, a diversity-2 may be guaranteed when R=0.5. Even when the code sequence $C_N$ is asymmetric, the diversity-2 may be guaranteed to a very high area compared to the related art. However, when code modification, such as puncturing/shortening, is applied, natural application and effect of a technique of the disclosure are limited due to characteristics of puncturing/shortening techniques of 5G-NR. Accordingly, herein, an interleaving and fading block bit allocation allocation when the same number of modulated codeword bits are allocated to different fading blocks, the number of bits allocated to each block is (N−| $\mathcal{X}_p$|)/2. Similarly, a code length of a shortened polar code is also adjusted to (N−| $\mathcal{X}_s$|), and in a case of uniform allocation, the number of bits allocated to each block is (N−| $\mathcal{X}_s$|)/2. For example, a polar code ($C_8$=[7 6 5 3 4 2 1 0]) in which a code length is 8 is allocated to blocks A and B by 4 bits each ( $\mathcal{X}_A$={7,6,5,3}, $\mathcal{X}_B$={4,2,1,0}). However, when puncturing of 2 bits is applied, 3 bits may be allocated to each of the blocks A and B. The puncturing is generally performed from a codeword bit corresponding to a source bit having a low reliability, and when $\mathcal{X}_p$={0,1}, 2 bits from among the 4 bits previously allocated to the block B are punctured A:4→4, B:4→2), and thus 1 bit needs to be moved from the block A to the block B and reallocated. When a first bit index reallocated to the block B is $r_0$, sets $\mathcal{X}_A$, $\mathcal{X}_B$ of bit indexes allocated to the blocks A and B are $\mathcal{X}_A$={3,5,6,7}\\$r_0$ and $\mathcal{X}_B$={2,4}∪$r_0$.

The above scenario may be represented as a formula below.

When an information bit index set for a punctured bit number J (a puncturing index set (puncturing pattern): $\mathcal{X}_p$, J=| $\mathcal{X}_p$|) and code rate R=0.5 is $\mathcal{A}$, $\mathcal{X}_A$=$\mathcal{A}$, $\mathcal{X}_B$=$\mathcal{A}^c$, and $\mathcal{X}_A$= $\mathcal{X}_B$=0.5N when J=0. On the other hand, when J≠0, $\mathcal{X}_A$≠$\mathcal{A}$, $\mathcal{X}_B$≠$\mathcal{A}^c$, | $\mathcal{X}_A$|=| $\mathcal{X}_B$|=0.5(N−J) . Also, when 2 bits are additionally punctured to J=2i(i≥0)→2 (i+1), $\mathcal{X}_B$=( $\mathcal{X}_B$\ $\mathcal{X}_p$)∪$r_i$ and $\mathcal{X}_A$=( $\mathcal{X}_A$\ $\mathcal{X}_p$)\\$r_i$, and when J is increased, $r_i$ is an (i+1)th bit index moved from $\mathcal{X}_B$ to $\mathcal{X}_A$. Here, $r_i$ may be determined such that diversities of information bits are maximized, and a high code diversity may be secured by greedily determining $r_i$ in an order for various J values.

The above method may be identically applied to a code shortening situation. When a polar code ($C_8$=[7 6 5 3 4 2 1 0]) in which a code length is 8 is 2-bit shortened ( $\mathcal{X}_s$={6, 7}), 3 bits may be allocated to each of the blocks A and B. The shortening is generally performed from a codeword bit corresponding to a source bit having a high reliability, and when $\mathcal{X}_s$={6,7}, 2 bits from among the 4 bits previously allocated to the block A are shortened (A:4→2, B:4→4) (unlike the puncturing), and thus 1 bit needs to be moved from the block B to the block A. When a first bit index moved to the block A is s o, sets of bit indexes moved to the block A are $\mathcal{X}_B=\{0,1,2,4\}\backslash s_0$ and $\mathcal{X}_B=\{3,5\}\cup s_0$.

When J≠0 for an information bit index set $\mathcal{A}$ regarding a shortened bit number J and a code rate R=0.5, $\mathcal{X}_B \neq \mathcal{A}^c$, $\mathcal{X}_A \neq \mathcal{A}$ and $|\mathcal{X}_A|=|\mathcal{X}_B|=0.5$ (N−J). Also, when 2 bits are additionally shortened to J=2i(i≥0)→2(i+1), $\mathcal{X}_B=(\mathcal{X}_B\backslash \mathcal{X}_s)\backslash s_i$ and $\mathcal{X}_A=(\mathcal{X}_B\backslash \mathcal{X}_s)\backslash s_i$, and when J is increased, $s_i$ is a bit index moved from $\mathcal{X}_B$ to $\mathcal{X}_A$. Like $r_i$, $s_i$ may also be determined such that diversities of information bits are improved, and $s_i$ values optimized for the determined J may be determined, thereby securing a high diversity.

The bits may be reallocated to secure a high diversity in various puncturing/shortening situations with the $r_i$ values and $s_i$ values determined through the above processes, and in this regard, embodiments of the disclosure introduce "auxiliary sequences $$T_N = \begin{bmatrix} r_0 & r_1 & \cdots & r_{\frac{N}{4}-1} & s_0 & s_1 & \cdots & s_{\frac{N}{4}-1} \end{bmatrix}$$

and len $(T_N)=N/2$ (len(·) is a length of ·)". Here, $$r_i\left(i \in \left[0:\frac{N}{4}-1\right]\right)$$

is an (i+1)th bit index moving a punctured polar code from the block B to the block A as described above, and $s_i$ $$\left(i \in \left[0:\frac{N}{4}-1\right]\right)$$

is an (i+1)th bit index moving the shortened polar code from the block A to the block B. In other words, when the code length is generally N, a case where more than half bits are shortened or punctured does not occur, and thus a length of an auxiliary sequence may be determined to be equal to or less than N/2. Contemplating an auxiliary sequence for puncturing and an auxiliary sequence for shortening, the disclosure considers one auxiliary sequence in which the two sequences for puncturing and shortening are concatenated, for convenience. Considering longest puncturing or shortening lengths possible, the first $$R_N = T_N\left[1:\frac{N}{4}\right] = \begin{bmatrix} s_0 & s_1 & \cdots & s_{\frac{N}{4}-1} \end{bmatrix}$$

of an auxiliary sequence $T_N$ is a sequence of bit indexes to be moved from the block A to the block B in a puncturing mode, and the rear $$S_N = T_N\left[\frac{N}{4}+1:\frac{N}{2}\right] = \begin{bmatrix} s_0, s_1, \cdots, s_{\frac{N}{4}-1} \end{bmatrix}$$

of the sequence is a sequence of bit indexes to be moved from the block B to the block A in a shortening mode. In the disclosure, an example in which the same numbers of modulated codeword bits are allocated to different fading blocks is described, but even when different numbers of modulated codeword bits are allocated as in $n_A \neq n_B$, the more (or fewer) number of bits may be allocated based on the auxiliary sequence defined above.

Figure 27:
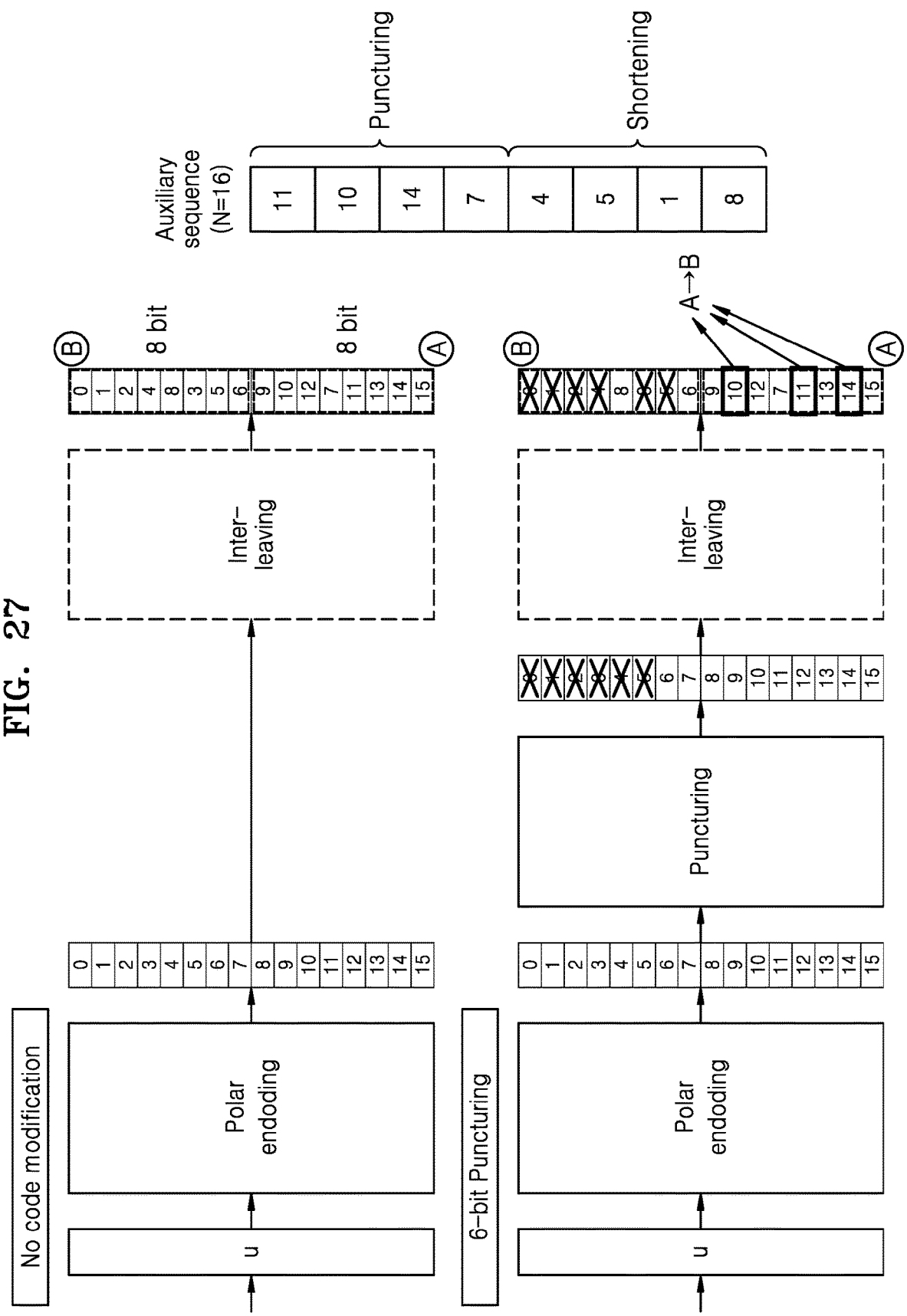
FIG. 27 is a diagram for describing a method of allocating a diversity, based on auxiliary sequences of a polar code mother code to which rate-matching is not applied and a polar code in which 6 bits are punctured according to an embodiment of the disclosure.

FIG. 27 is a diagram for describing a method of allocating a diversity, based on auxiliary sequences of a polar code mother code to which rate-matching is not applied and a polar code in which 6 bits are punctured according to an embodiment of the disclosure.

Referring to FIG. 27, N=16 is assumed. Also, modulated codeword bit indexes to be allocated to each resource block for a punctured or shortened polar code are determined by using an auxiliary sequence $T_{16}$=[11 10 14 7 4 5 1 8] pre-defined for N=16. When there is no rate-matching, a diversity-2 is guaranteed by allocating $\mathcal{X}_A$=set $(C_{16}[0:7])=\{15,14,13,11,7,12,10,9\}$, and $\mathcal{X}_B$=set$(C_{16\ [8:15]})=\{6,5,3,8,4,2,1,0\}$. For the punctured polar code, bits to be moved from a block A to a block B are determined based on the pre-defined auxiliary sequence $T_{16}$. For example, when 6 bits of $\mathcal{P}=\{0,1,2,3,4,5\}$ are punctured as in the above example, $\mathcal{X}_B=\{0,1,2,4,8,3,5,6\}\backslash\{0,1,2,3,4,5\}\cup\{r_0=11,r_1=10,r_22=14\}=\{6,8,10,11,14\}$ and $\mathcal{X}_A=\{9,10,12,7,11,13,14,15\}\backslash\{r_0=11,\ r_1=10,\ r_2=14\}=\{7,9,12,13,15\}$.

Figure 28:
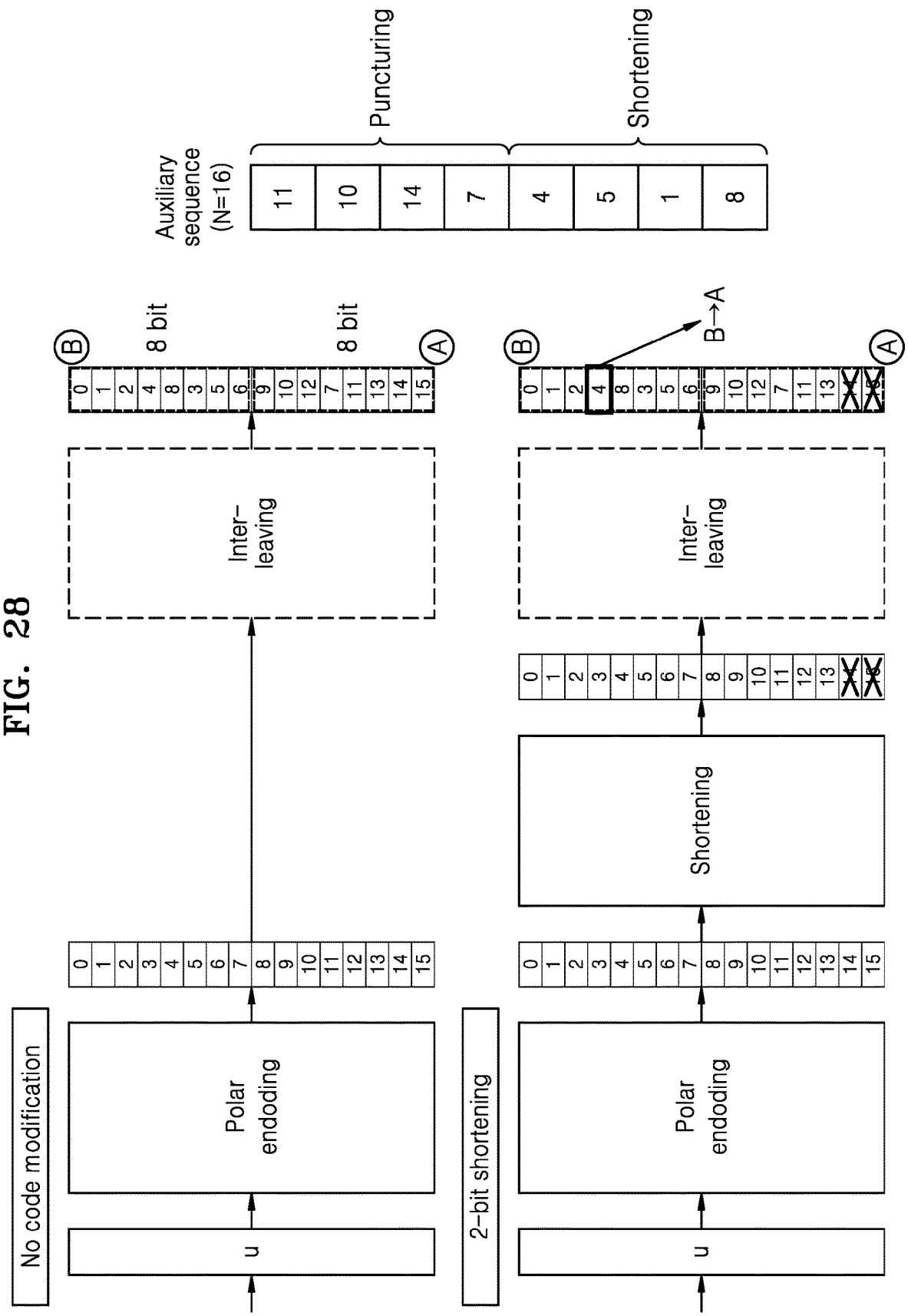
FIG. 28 is a diagram for describing a method of allocating a diversity according to auxiliary sequences of a polar code mother code without rate-matching and a polar code in which 2 bits are shortened according to an embodiment of the disclosure.

FIG. 28 is a diagram for describing a method of allocating a diversity according to auxiliary sequences of a polar code mother code without rate-matching and a polar code in which 2 bits are shortened according to an embodiment of the disclosure.

Bits to be moved are determined by using an auxiliary sequence $T_N$ shown in FIG. 28, for both puncturing and shortening. For a shortened polar code, a bit is moved from a block B to a block A, based on a pre-defined auxiliary sequence. Referring to FIG. 28, when 2 bits having indexes of $\mathcal{S}=\{14,15\}$ ($\mathcal{S}$: an index set of shortened bits; shortening pattern) are shortened, $\mathcal{X}_B=\{0,1,2,4,8,3,5,6\}\backslash\{s_0=4\}=\{0,1,2,3,5,6,8\}$ and $\mathcal{X}_A=\{\{9,10,12,7,11,13,14,15\}\backslash\{14,15\}\}\cup\{4\}=\{4,7,9,10,11,12,13\}$. A method of determining a priority of bits to be moved at this time will be described later. According to a user definition, one auxiliary sequence may be defined and used for each code length of $N=2^n$ (N∈{32, ...,1024}), or a single auxiliary sequence corresponding to $N_{max}$ may be defined ($N_{max}$=1024) to correspond to rate-matching. Here, a case where a single auxiliary sequence corresponding to a plurality of modified polar codes having a length equal to or less than $N_{max}$ is used may need to compromise on a certain level of performance (or diversity).

Alternatively, instead of using an auxiliary sequence and an interleaving sequence based on a polar code sequence together, a unified sequence in which an auxiliary sequence is reflected on an interleaving sequence may be defined and used. (In other words, allocation to blocks A and B when there is no code modification and reallocation through an auxiliary sequence for code modification may be defined as one unified sequence.) The unified sequence corresponds to both shortening and puncturing, and as a result, because an auxiliary sequence for puncturing and an auxiliary sequence for shortening are in a symmetric relation, an overall unified sequence may be constructed by using the symmetric relation even when only the auxiliary sequence for puncturing is known.

Figure 29:
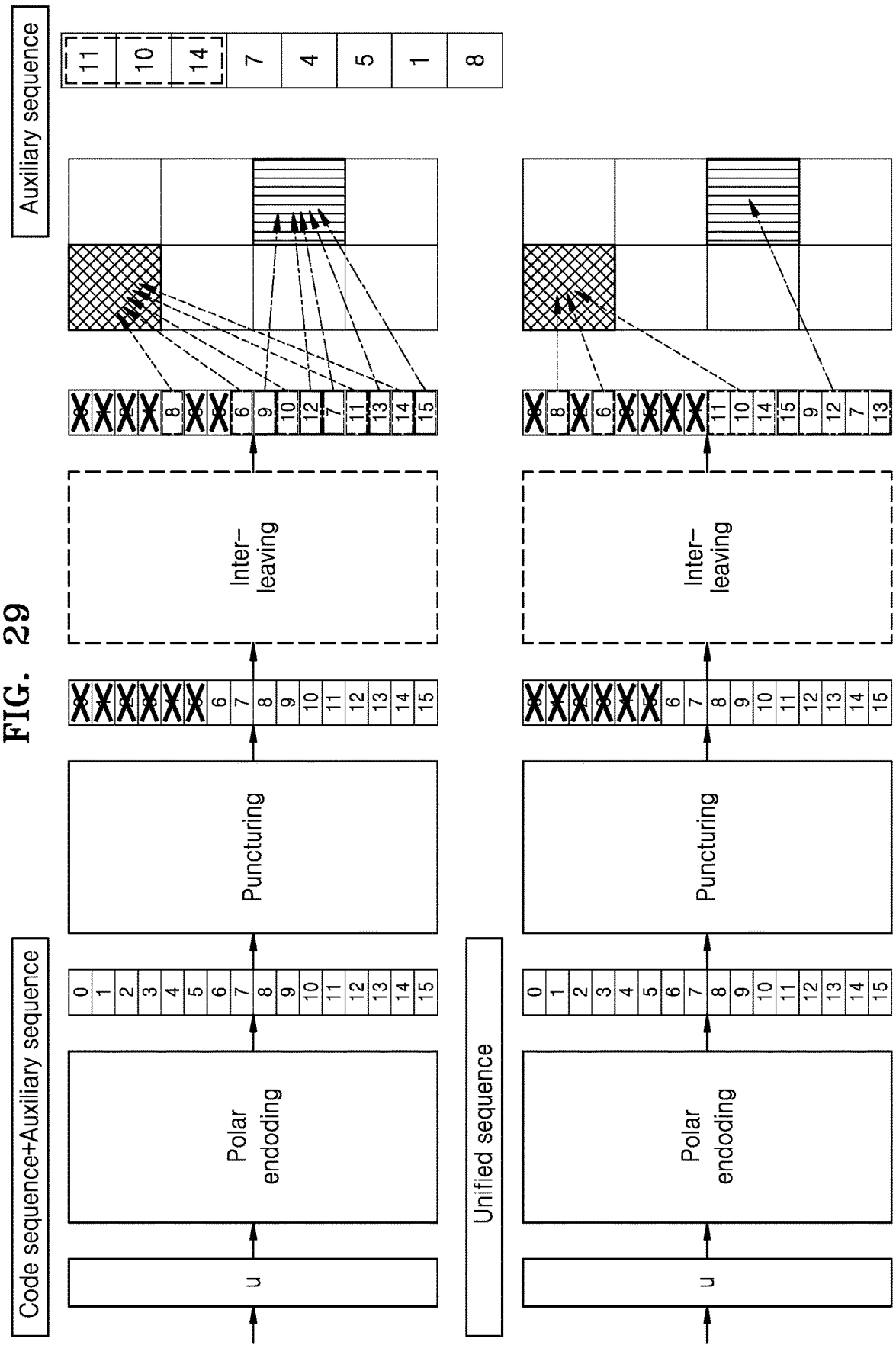
FIG. 29 is a diagram for describing a method of allocating modulated codeword bits to resource blocks by separately defining a sequence and an auxiliary sequence, and a method of allocating the modulated codeword bits by using a unified sequence, according to an embodiment of the disclosure.

FIG. 29 is a diagram for describing a method of allocating modulated codeword bits to resource blocks by separately defining a sequence and an auxiliary sequence, and a method of allocating the modulated codeword bits by using a unified sequence, according to an embodiment of the disclosure.

Referring to FIG. 29, a method of using a code sequence-based interleaving sequence and auxiliary sequence together during 6-bit puncturing when N=16, and a method of allocating a modulated codeword of one unified sequence (i.e., a sequence constructed by reflecting an auxiliary sequence to an interleaving sequence) are illustrated.

When the code sequence-based interleaving sequence and the auxiliary sequence are used together, $\mathcal{P}=\{0,1,2,3,4,5\}$ may be punctured when $\mathcal{X}_B=\{0,1,2,4,8,3,5,6\}$, $\mathcal{X}_A=\{9,10,12,7,11,13,14,15\}$, and then 3 bits ($\{11,10,14\}$) of $T_N[1:3]=(r_0\ r_1\ r_2)$ may be reallocated from the auxiliary sequence when $\mathcal{X}_B=\{6,8\}$, $\mathcal{X}_A=\{7,9,10,11,12,13,14,15\}$. In other words, $\mathcal{X}_A=\{9,12,7,13,15\}$, $\mathcal{X}_B=\{6,8,11,10,14\}$. are obtained based on the allocation. On the other hand, according to the method of allocating a modulated codeword of one unified sequence, when a sequence is reconstructed such that an auxiliary sequence is reflected to an interleaving sequence, [2 8 3 6 0 1 5 4 11 10 14 15 9 12 7 13], and when M=2, $n_A$ from the front excluding a punctured bit, and $n_B$ bits thereafter may be respectively allocated to blocks A and B.

1) Method of Determining Auxiliary Sequence for Punctured Polar Code.

A technique for constructing an auxiliary sequence for codeword bit allocation when M=2 in a case where a polar code is punctured is proposed. The punctured polar code transmits x' in which a length is E=N−J by puncturing J bits from a codeword x. An LLR of punctured bits is set to 0, and the number of incapable bits same as the number of punctured bits are generated in a u-domain in response to the punctured bits. In other words, $\mathcal{U}_p$ satisfying $|\mathcal{X}_p|=|\mathcal{U}_p|$ is generated, and $\mathcal{U}_p$ has a BD property.

Figure 30:
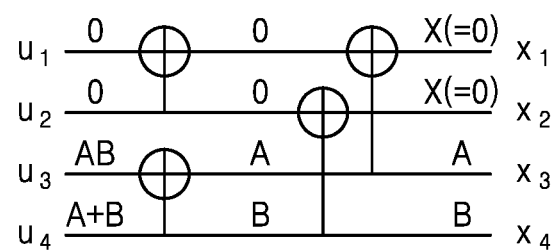
FIG. 30 is a diagram for describing a diversity calculating method for a punctured polar code according to an embodiment of the disclosure.

FIG. 30 is a diagram for describing a diversity calculating method for a punctured polar code according to an embodiment of the disclosure.

Referring to FIG. 30, a diversity of a polar code in which $\mathcal{X}_p=\{1,2\}$, $\mathcal{X}_A=\{4\}$, $\mathcal{X}_B=\{3\}$ may be updated. When a fading stochastic variable corresponding to first punctured bits is indicated as X, an LLR corresponding to punctured bits during decoding is 0, and thus may be considered as fixed fading, and X=0. When X(=0) and A meet, an update corresponding to a check node may be updated to multiplication 0 A=0 of two stochastic variables, and an update corresponding to a variable node may be updated to addition 0+A=A of two stochastic variables.

A fading Boolean function included in $u_3$ is (0+B)·(0+A)=AB, and a fading Boolean function included in $u_4$ is (0+B)+(0+A)=A+B. In other words, $n_s$ of $u_3$ is 1, $n_s$ of $u_4$ is 3, and a code diversity of a (2,1) polar code where $\mathcal{A}=\{4\}$ is 2.

Hereinafter, a $r_i$, i=0,1, . . . , $$\frac{N}{4}-1$$

sequence to be moved to another resource for a punctured polar code according to an embodiment of the disclosure may be optimized by using an algorithm. Algorithm 3 for determining a $r_i$ value is as follows.

---

Algorithm 3. Select $r_i$ recursively based on depth-2 intermediate $n_s$

1. Given information
   $\mathcal{X}_p$ (puncturing pattern), $\mathcal{A}_h$ (i ∈ $\mathcal{A}_h$; An; half-rate information set), $\mathcal{X}_B$, $I_{Cand.} = \emptyset$
2. Obtain the set of adjacent direct path indices, $g_i$s for index i ∈ $\mathcal{A}_h$.
   $g_i \leftarrow \{i - b_j \cdot 2^j: j \in \{0, 1, \ldots, n-1\}\}\setminus\{i\}$, $\forall i \in \mathcal{A}_h$ ( i = ($i_{n-1} \ldots i_1 i_0$), j ∈ [0: n − 1])
   If $g_i \cap \mathcal{A}_h = \emptyset$, $I_{Cand.} = I_{Cand.} \cup \{i\}$ // secure candidate direct path index that
   require intermediate $n_s$ test (it is assumed that bits satisfying $g_i \cap \mathcal{A}_h \neq \emptyset$
   guarantee diversity-2.)
   $I_{Cand.} \leftarrow$ Sort_RelDescending($I_{Cand.}$) // align bits in order of code sequence $C_N$
   by applying polarization reliability rule of u-domain for $I_{Cand.}$ including
   indexes of x-domain. (Sort_RelDescending(·) function denotes a sequence in
   which · is aligned in order of code sequence $C_N$ of polar code or polarization weight.)
3. Reduce the candidate set $T_i$ to select $r_i$ for puncturing mode, or reduce the candidate
   set $S_i$ to select $s_i$ for shortening mode) (prevent from degrading the depth-2
   intermediate $n_s$) (an index set of candidate bits for determining a $s_i$ value is $T_i$ $$\left(i \in \left[0: \frac{N}{4} - 1\right]\right).$$

$$T_i = C_N\left[\left\lfloor\frac{|\mathcal{P}|}{2}\right\rfloor + \frac{N}{2} - 1: N - 1\right] \text{ // Candidate set definition of bits to be moved to}$$

block A from all available blocks B
U = {$N_s$(i): i ∈ $I_{Cand.}$} // Depth-2 $n_s$ set corresponding to bit index i(∈ $I_{Cand.}$)
($N_s$(i) denotes $n_s$ value in depth -2 direct path-index i)
for j ∈ $T_i$ // for candidates of bits to be moved from all available blocks B to block A
   Switch 'the fading block of $x_j$' from B to A // Reanalyze $n_s$ (diversity) when
   $x_j$ is moved from block B to block A
   $U_j$ = {$N_s$(i): i ∈ $I_{Cand.}$} // Depth-2 $n_s$ set of candidate bits after switching
   For every k(= 1: |Candidate|)
      If U(k) > $U_j$(k) then $T_i \leftarrow T_i\setminus\{j\}$ // For $n_s$ of arranged information bits
      (in descending order), when diversity result deteriorates through
      movement of $x_j$, j is excluded from movement candidate
      endif, endfor
   endfor
4. Choose $s_i$ which increases the overall intermediate depth-2 $n_s$
   for j ∈ TransCan // For candidates from all updated available B → A
   Switch 'the fading block of $x_j$' from B to A // Same as step 3
   $U_j$ = {$N_s$(i): i ∈ $I_{Cand.}$} // Depth-2 $n_s$ set of candidate bits after switching
   If $U_j$(k) = 3 for every k(= 1: |Candidate|)
      Select j as a transition bit Algorithm 3. Select $r_i$ recursively based on depth-2 intermediate $n_s$

```
        If multiple bits are survived, select the bit with highest reliability or priority
        If there is no survivor, go to step 5.
5. Reduce the candidate set T_i to select r_i for puncturing mode, or reduce the candidate
set S_i to select s_i for shortening mode) (prevent from degrading the depth-3 intermediate n_s)
    for k ∈ I_Cand.
        If N(k) = 3 then I_Cand. = I_Cand.\{k} // Exclude x_k s in which n_s is 3 from
            index set. Search remaining bits for depth-3 n_s
    End
    V = {N_s(i): i ∈ I_Cand.} // Calculate n_s only for bits in which n_s is equal to or
    less than 2.
    for j ∈ T_i
        Switch 'fading block of x_j' from B to A
        V_j = {N_s(i): i ∈ I_Cand.}
        For every k(= 1: |Candidate|)
            If U(k) > U_j(k) then T_i\T_i\{j} // When diversity result deteriorates
            through movement of n_s of information bits (arranged in descending
            order), j is excluded from movement candidate.
        endif, endfor
    endfor
6. Choose s_i which increases the overall intermediate depth-3 n_s
    for j ∈ T_i
        Switch 'the fading block of x_j' from B to A
        V_j = {N_s(i): i ∈ I_Cand.} // Depth-3 n_s set of candidate bits after switching
        If V_j(k) = 3 for every k(= 1: |Candidate|)
            Select j as a transition bit
            If either multiple bits are survived or there is no bit survived, select the
            bit with highest reliability
```

As an example of an auxiliary sequence construction, a method of determining an auxiliary sequence for a PW-based auxiliary sequence will be described. For a code $C_{16}$=[15 14 13 11 7 12 10 9 6 5 3 8 4 2 1 0] in which N=16, $\mathcal{X}_A$={15,14,13,11,7,12,10,9}, $\mathcal{X}_A$={6,5,3,8,4,2,1,0} is an optimum diversity allocation pattern when there is no rate-matching (for a polar code mother code). When J bits are punctured, a $r_i$ value needs to be determined such that (N−J)/2 bits having highest reliability have diversity-2 (or $n_s$=3). In other words, a code diversity of an information bit $\mathcal{A}_h$(|$\mathcal{A}_h$|=(N−J)/2) when R=0.5 is 2. For example, when J=2, a $r_0$ value needs to be determined such that bits in which indexes are {15,14,13,11,7,12,10} is $n_s$, and when J=6, a $r_0$, $r_1$, $r_2$ value needs to be determined such that bits in which indexes are {15,14,13,11,7} is $n_s$=3.

A set of adjacent direct path indexes excluding a bit $i(\in\mathcal{A})$=[$b_{n-1}$ ... $b_j b_0$]($b_i \in$ {0,1}) included in $\mathcal{A}_h$, which is encountered during a VN update process, is represented as $g_i$={i−$b_j$·$2^j$:j∈{0,1, ... , n−1}}\{i}. Here, a direct path denotes a path connecting ith symbols of all encoding/decoding stages. A set of indexes of direct paths in a polarization relation with the ith symbols is $g_i$. Here, when $g_i \cap \mathcal{A}_h \neq \emptyset$, it is highly likely that information bits may have a diversity-2 as a result. On the other hand, when $g_i \cap \mathcal{A}_h \neq \emptyset$, a diversity-2 is not guaranteed, and a "depth-2 polarization" update process therefor may be traced.

TABLE 6

Adjacent path indexes of bits included in $\mathcal{A}_h$ when N = 16, |$\mathcal{X}_p$| = 2

| Index | Binary | Depth-1 | Depth-2 | Depth-3 | Depth-4 |
|-------|--------|---------|---------|---------|---------|
| 15    | 1111   | 7       | 11      | 13      | 14      |
| 14    | 1110   | 6       | 10      | 12      |         |
| 13    | 1101   | 5       | 9       |         | 12      |
| 11    | 1011   | 3       |         | 9       | 10      |
| 7     | 0111   |         | 3       | 5       | 6       |
| 12    | 1100   | 4       | 8       |         |         |
| 10    | 1010   | 2       |         | 8       |         |

For example, an information set of a polar code in which N=16,J=2 is $\mathcal{A}_h$={15,14,13,11,7,12,10}, and $g_{15}$={7,11,13,14}, $g_{14}$={6,10,12}, $g_{13}$={5,9,12}, $g_{11}$={3,9,10}, $g_7$={3,5,6}, $g_{12}$={4,8},$g_{10}$={2,8}. Also, $\mathcal{P}$={0,1}, $\mathcal{X}_B$={2,4,8,3,5,6}∪$r_0$, $\mathcal{X}_A$={9,10,12,7,11,13,14,15}\$r_0$, and a candidate set of $r_0$ is $R_0$={9,10,12,7,11,13,14,15}= $\mathcal{X}_A$. For $g_5$, $g_{14}$, $g_{13}$, $g_{11}$, at least one bit is included in A h . As a result, it is expected that source bits having corresponding indexes are highly likely to have a diversity-2. However, for $g_7$, $g_{12}$, $g_{10}$, all bits are included in $\mathcal{A}_h^c$, and thus a diversity-2 is not guaranteed, and diversity trace up to depth-2 polarization is performed therefor in an order of a code sequence $C_N$. In embodiments of the disclosure, a $r_i$ value is determined to maximize a diversity thereof.

For additional descriptions on an algorithm operation, a fading Boolean function for each message according to a decoding process on a bipartite graph is defined as $s_{i,j}$. Here, i∈{0,1, ... , n−1} denotes a direct path and symbol index, and j∈{0,1, ... , n} denotes a depth or layer index. At this time, a direct path index denotes an index i shared on a path connecting $u_i$ and $x_i$. Also, a depth index j is a value obtained by subtracting a stage index from n, and denotes a degree of polarization in an actual channel. For reference, in a depth-index, j=0 corresponds to an x domain, where as a stage index starts to be indexed from a u domain.

A bit in which an index is 7(0111) performs a CN operation by encountering a bit in which an index is 15 during depth-1 polarization ($s_{i,j}$: Fading Boolean variable corresponding to a direct path index i at depth-j), and performs a VN operation by encountering a bit in which an index is 3 at a depth-2. Here, a fading function corresponding to a bit in which an index is 3 is a stochastic variable updated after a CN operation is performed with a bit in which an index is 11 at a depth-2. A fading function updated after a depth-2 polarization process is performed is represented as Equation 8.

$$s_{7,2}=(s_{7,0}s_{15,0})+(s_{3,0}s_{11,0})$$ Equation 8

When $s_{3,0}=B$ and $s_{7,0}$, $s_{11,0}$, $s_{15,0}$ are not moved, all of $s_{7,0}$, $s_{11,0}$, $s_{15,0}$ have A, and thus $s_{7,2}=A$. When $s_{7,0}$ or $s_{15,0}$ is moved to B, $s_{7,2}=AB$ and an intermediate diversity deteriorates compared to existing A, and thus when $R_i$ is an index set of candidates for determining a $r_i$ value, 7 and 15 may be excluded from $R_0$.

For a path in which a direct path index is 12, a fading function at a depth-2 is $s_{12,2}=(s_{12,0}+s_{4,0})+(s_{8,0}+s_{0,0})$, $s_{0,0}=0$, $s_{4,0}=s_{8,0}=B$, and $s_{12,0}$ is A when not moved, and thus $s_{12,2}=A+B(n_s=3)$. When $s_{12,0}$ is moved to B, $s_{12,2}=B$ and the intermediate diversity deteriorates compared to existing A+B, and thus 12 may also be excluded from $R_0$ ($R_0=\{9,10,11,13,14\}$).

A fading stochastic variable at a depth-2 corresponding to a bit in which an index is 10 is $S_{10,2}=(s_{10,0}+s_{2,0})(s_{14,0}+s_{6,0})$, and $s_{2,0}=s_{6,0}=B$, $s_{10,1}s_{14,1}$ is A when not moved, and thus $s_{10,2}=A+B$ ($n_s=3$). When $s_{10,0}$ or $s_{14,0}$ is moved to B, $s_{10,2}=B$, and thus intermediate diversity (depth-k diversity (1<k<n)) deteriorates compared to existing A+B. Accordingly, 10 and 14 may also be excluded from $R_0$ ($R_0=\{9,11,13\}$). The above process is a process of excluding bits causing depth-2 deterioration for $g_i$ satisfying $g_i \cap \mathcal{A}_h = \emptyset$. Referring back to 7, $s_{7,2}=(s_{7,0}s_{15,0})+(s_{3,0}s_{11,0})=(B \cdot s_{11,0})+A$. Here, when $s_{11,0}$ is moved to B, $s_{7,2}=A+B$ and $n_s=3$ is satisfied, and thus $r_0=11$.

TABLE 7

Adjacent path indexes of bits included in $\mathcal{A}_h$ when N = 16, $|\mathcal{X}_p| = 4$

| Index | Binary | Depth-1 | Depth-2 | Depth-3 | Depth-4 |
|---|---|---|---|---|---|
| 15 | 1111 | 7 | 11 | 13 | 14 |
| 14 | 1110 | 6 | 10 | 12 | |
| 13 | 1101 | 5 | 9 | | 12 |
| 11 | 1011 | 3 | | 9 | 10 |
| 7 | 0111 | | 3 | 5 | 6 |
| 12 | 1100 | 4 | 8 | | |

When J=4, $\mathcal{X}_p=\{0,1,2,4\}$, $\mathcal{X}_B=\{8,3,5,6,11\} \cup r_1$, $\mathcal{X}_A=\{9,10,12,7,13,14,15\} \backslash r_1$. An information set of a polar code in which N=16, J=4 is $\mathcal{A}_h=\{15,14,13,11,7,12\}$, and $g_{15}=\{7,11,13,14\}$, $g_{14}=\{6,10,12\}$, $g_{13}=\{5,9,12\}$, $g_{11}=\{3,9,10\}$, $g_7=\{3,5,6\}$, $g_{12}=\{4,8\}$. Also, a candidate index set for determining a bit $s_1$ to be moved from B to A is $R_1$. Here, $g_{15} \cup \mathcal{A}_h \neq \emptyset$, $g_{14} \cup \mathcal{A}_h \neq \emptyset$, $g_{13} \cup \mathcal{A}_h \neq \emptyset$, but $g_{11} \cup \mathcal{A}_h \neq \emptyset$, $g_7 \cup \mathcal{A}_h \neq \emptyset$, $g_{12} \cup \mathcal{A}_h \neq \emptyset$, and thus an electronic device according to an embodiment of the disclosure traces a diversity for bits in which indexes are 11, 7, and 12.

First, a fading Boolean function at a depth-2 corresponding to a bit in which an index is 11 is provided as $s_{11,2}=(s_{11,0}+s_{3,0})(s_{15,0}+s_{7,0})$. When $s_{11,0}=s_{3,0}=B$ and $s_{15,0}$ and $s_{7,0}$ are not moved, all of $s_{15,0}$ and $s_{7,0}$ have A, and thus $s_{11,2}=AB$. Here, when even one of $s_{15,0}$ and $s_{7,0}$ is moved, deterioration of $n_s$ does not occur, and thus the corresponding index is not excluded from a candidate set. Then, bits in which an index is 7 are $s_{7,2}=(s_{7,0}s_{15,0})+(s_{3,0}s_{11,0})$ and $s_{3,0}=s_{11,0}=B$, and $s_{15,0}$, $s_{7,0}$ are A when not moved, and thus $s_{11,2}=A+B$. When one of $s_{15,0}$, $s_{7,0}$ is moved, an intermediate diversity decreases to $s_{7,2}=B+AB=B$, and thus 7 and 15 may be excluded from $R_1$.

For a bit in which an index is 12, $s_{12,2}=(s_{12,0}+s_{4,0})+(s_{8,0}+s_{0,0})$, and $s_{0,0}=s_{4,0}=X=0$, $s_{8,0}=B$ and $s_{12,0}$ are A when not moved, and thus $s_{12,2}=A+B(n_s=3)$. When $x_{12}$ is moved, a diversity deteriorates, and thus 12 is removed from $R_1$ ($R_1=\{9,10,13,14\}$). As in a case when J=2, the above process is a process of excluding bits causing depth-2 diversity deterioration for $g_i$ satisfying $g_i \cap \mathcal{A}_h = \emptyset$. Referring back to 11(1011), $s_{11,2}=(s_{11,0}+s_{3,0})(s_{15,0}+s_{7,0})=AB$ (always $n_s=1$). Thus, the electronic device according to an embodiment of the disclosure may determine a bit to be moved to B in a direction an intermediate stage $n_s$ is increased during a process after depth-3. For a bit in which an index is 11, a VN operation is performed after depth-3, and diversity update is performed by encountering a path corresponding to indexes 9 and 10. For a path index 9, a depth-2 diversity is $s_{9,2}=(s_{9,0}+s_{1,0})(s_{13,0}+s_{5,0})=(s_{9,0})(B+s_{13,0})$ and for 10, $s_{10,2}=(s_{10,0}+s_{2,0})(s_{14,0}+s_{6,0})=(s_{10,0})(B+s_{13,0})$. Here, when $s_{13,0}$ or $s_{14,0}$ is moved to B, $n_s$ is damaged, and thus indexes 13 and 14 are also excluded from $R_1$ ($R_1 \in \{9,10\}$). Any one of the indexes 9 and 10 may be selected, and at this time, one of source bits having the indexes, which has higher reliability, may be selected as $r_1$. Accordingly, $r_1=10$.

TABLE 8

Adjacent path indexes of bits included in $\mathcal{A}_h$ when N = 16, $|\mathcal{X}_p| = 6$

| Index | Binary | Depth-1 | Depth-2 | Depth-3 | Depth-4 |
|---|---|---|---|---|---|
| 15 | 1111 | 7 | 11 | 13 | 14 |
| 14 | 1110 | 6 | 10 | 12 | |
| 13 | 1101 | 5 | 9 | | 12 |
| 11 | 1011 | 3 | | 9 | 10 |
| 7 | 0111 | | 3 | 5 | 6 |

When J=6, $\mathcal{X}_p=\{0,1,2,4,3,5\}$, $\mathcal{X}_B=\{8,6,11,10\} \cup r_2$, $\mathcal{X}_A=\{9,12,7,13,14,15\} \backslash r_2$. Also, $R_2$ is a candidate bit index set for determining a $s_2$ value to be moved from B to A. An information set of a polar code in which N=16, J=4 is $\mathcal{A}_h=\{15,14,13,11,7\}$, and $g_{15}=\{7,11,13,14\}$, $g_{14}=\{6,10,12\}$, $g_{13}=\{5,9,12\}$, $g_{11}=\{3,9,10\}$, $g_7=\{3,5,6\}$. Here, $g_{15} \cap \mathcal{A}_h = \emptyset$, but $g_{14} \cap \mathcal{A}_h \neq \emptyset$, $g_{13} \cap \mathcal{A}_h \neq \emptyset$, $g_{11} \cap \mathcal{A}_h \neq \emptyset$, $g_7 \cap \mathcal{A}_h \neq \emptyset$, and thus the electronic device according to an embodiment of the disclosure traces a diversity for bits in which indexes are 14, 13, 11, and 7.

A fading stochastic variable at a depth-2 corresponding to a bit in which an index is 14 is $s_{14,2}=(s_{14,0}+s_{6,0})+(s_{10,0}+s_{2,0})$, and $s_{2,0}=X=0$, $s_{6,0}=s_{10,0}=B$. $s_{14,2}=A+B$ when not moved, and thus 14 is maintained as a candidate. Also, an intermediate fading stochastic variable at a depth-2 corresponding to a bit in which a bit index is 13 is $s_{13,2}=(s_{13,0}+s_{5,0})+(s_{9,0}+s_{1,0})$, and $s_{1,0}=s_{5,0}=X=0$, and thus $s_{13,2}=s_{13,0}+s_{9,0} \cdot s_{13,0}=A$ when not moved, and bits do not deteriorate even when one of the bits is moved to B, and thus are maintained as candidates. ($R_2=\{7,9,12,13,14,15\}$). A fading stochastic variable at a depth-2 of an index 11 is $s_{11,2}=(s_{11,0}+s_{3,0})(s_{15,0}+s_{7,0})$. $s_{3,0}=s_{11,0}=B$, and thus $s_{11,2}=B(s_{15,0}+s_{7,0})$ $s_{11,2}=AB$ when not moved, and bits do not deteriorate even when one of the bits is moved to B, and thus 7 and 15 are maintained as candidates. A fading Boolean function at a depth-2 of a bit line 7 is $s_{7,2}=(s_{7,0}s_{15,0})+(s_{3,0}+s_{11,0})$. $s_{3,0}=X=0$, $s_{11,0}=B$, and thus $s_{7,2}=s_{7,0}s_{15,0} \cdot s_{7,2}=A$ when not moved, but deteriorates to $s_{7,2}=AB$ when one bit is moved to B, and thus 7 and 15 are excluded from candidates. In other words, Cambria Math may be updated to $R_2=\{9,12,13,14\}$. As in a case when J=2,4, the above process is a process of excluding bits causing depth-2 diversity deterioration for $g_i$ satisfying $g_i \cap \mathcal{A}_h = \emptyset$. Referring to the bit index 12 again, $s_{13,2}=s_{13,0}+s_{9,0}=A+B$. For an index 11, $s_{11,2}=AB$, and thus $n_s=1$. Accordingly, an intermediate diversity or $n_s$ value may be improved during a polarization process after depth-3. A direct path index 11 encounters paths 9 and 10 respectively at depths-3 and 4, and $[s_{9,2}=(s_{9,0}+0)(s_{13,0}+0)=s_{9,0} \cdot s_{13,0}$ and $ss_{10,2}=[B+X][s_{14,0}+B]]$. Accordingly, when 9 and 13 are moved, deterioration of a $n_s$ value is caused, and thus 9 and 13 are excluded from $R_2$ ($R_2$={12, 14}), and $s_{14,0}$ does not cause deterioration and thus is maintained as a candidate. Here, 14 that is an index corresponding to a source bit having highest reliability from among elements in $R_2$ remaining after all bits not satisfying a condition are excluded may be determined as $r_2$ ($r_2$=14).

TABLE 9

Adjacent path indexes of bits included in $\mathcal{A}_h$ when N = 16, $|\mathcal{X}_p|$ = 8

| Index | Binary | Depth-1 | Depth-2 | Depth-3 | Depth-4 |
|---|---|---|---|---|---|
| 15 | 1111 | 7 | 11 | 13 | 14 |
| 14 | 1110 | 6 | 10 | 12 | |
| 13 | 1101 | 5 | 9 | | 12 |
| 11 | 1011 | 3 | | 9 | 10 |

When J=8, $\mathcal{X}_p$={0,1,2,4,3, 5, 6, 8}, $\mathcal{X}_A$={11, 10, 14}∪$r_3$, $\mathcal{X}_B$={7, 9, 12, 13, 15}\$r_3$. An information set of a polar code in which N=16,J=6 is $\mathcal{A}_h$={15, 14, 13, 11}, and $g_{15}$={7, 11, 13, 14}, $g_{14}$={6, 10, 12}, $g_{13}$={5, 9, 12}, $g_{11}$={3, 9, 10}. Here, $g_{15}\cup\mathcal{A}_h\neq\emptyset$, but $g_{14}\cup\mathcal{A}_h\neq\emptyset$, $g_{13}\cup\mathcal{A}_h\neq\emptyset$, $g_{11}\cup\mathcal{A}_h\neq\emptyset$, and thus diversities for bits in which indexes are 14, 13, and 11 are traced. For a bit index 14, $s_{14,2}$ is always $s_{14,2}(s_{14,0}+s_{6,0})+(s_{10,0}+s_{2,0})=s_{10,0}+s_{14,0}A$. For 13, $s_{13,2}(s_{13,0}+s_{5,0})+(s_{9,0}+s_{1,0})=s_{9,0}+s_{13,0}$. Because these two bits do not cause deterioration of depth-2 intermediate diversity, the two bits are included in $r_3$. For 11, $s_{11,2}$ $(s_{11,0}+s_{3,0})(s_{15,0}+s_{7,0})=B(s_{15,0}+s_{7,0})$. The two bits do not cause deterioration of intermediate diversity, and thus are not removed from $r_3$. There are not bits removed even through a process after depth-3, and thus an index corresponding to a source bit having highest reliability may be determined as $r_3$ ($r_3$=15). Accordingly, an auxiliary sequence for puncturing when N=16 is [$r_0 r_1 r_2 r_3$]=[11 10 14 15].

2) Method of Constructing Auxiliary Sequence for Shortened Polar Code.

Hereinafter, a method of constructing an auxiliary sequence, according to an embodiment of the disclosure, for codeword bit reallocation when M=2 in a case where a polar code is shortened will be described. Regarding the shortened polar code, when J bits in a u domain to be shortened during encoding are selected and fixed to 0, J bits are also fixed to 0 in an x domain and thus are not transmitted. Shortening also satisfies $|\mathcal{X}_s|=|\mathcal{U}_s|$ and $\mathcal{U}_s$ needs to satisfy binary domination. In the 5G-NR standard, the shortening is mainly considered in an intermediate-high code rate area of R≥7/16.

Figure 31:
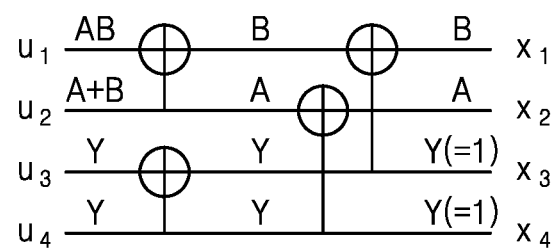
FIG. 31 is a diagram for describing a diversity updating method for a shortened polar code according to an embodiment of the disclosure.

FIG. 31 is a diagram for describing a diversity updating method for a shortened polar code according to an embodiment of the disclosure.

Referring to FIG. 31 $\mathcal{X}_s$={3,4}, $\mathcal{X}_B$={1}, $\mathcal{X}_A$={2}. A fading stochastic variable of shortened bits is indicated as Y, and because the shortened bits are accurately known during decoding, the fading stochastic variable is equivalent to having an infinite LLR, and corresponding fading Y may be indicated as 1. When Y and B encounter, an update corresponding to a check node is always updated to multiplication Y·B=B of two stochastic variables (in case of puncturing, X·B=X), and an update corresponding to a variable node is always updated to OR arithmetic operation Y+B=Y of two stochastic variables (in case of puncturing, X+B=B). In FIG. 31, a fading stochastic variable included in $u_1$ is (A·Y) (B·Y)=AB, and a fading stochastic variable included in $u_2$ is (A·Y)+(B·Y)=A+B. In other words, $n_s$ of $u_1$ is 1, $n_s$ of $u_2$ is 3, and a diversity of a (2,1) polar code where $\mathcal{A}$={2} is 2.

Hereinafter, a method of determining $s_i$ $$\left(i = 0, 1, \cdots, \frac{N}{4} - 1\right)$$

bit values to be allocated to different resources for a shortened polar code, according to an embodiment of the disclosure, will be described. For example, in a case of N=16, when there is no rate-matching for a code $C_{16}$=[15 14 13 11 7 12 10 9 6 5 3 8 4 2 1 0], $\mathcal{X}_B$={1,2, 4, 8, 3, 5, 6}, $\mathcal{X}_A$={9, 10, 12, 7, 11, 13, 14, 15} is an optimum diversity allocation pattern. However, in a case of a polar code in which J bits are shortened, a $s_i$ value may be determined such that (N−J)/2 bits having highest reliability have a diversity-2 (or $n_s$=3). Here, incapable bits corresponding to punctured bits are mostly source bits having very low reliability and thus do not affect an information set, but the shortened bits are mostly bits having very high polarization weight, and thus the information set may be greatly changed.

An electronic device according to an embodiment of the disclosure may determine bit values to be allocated to different resources such that a code diversity of an information set $\mathcal{A}_h(|\mathcal{A}_h|=(N-J)/2)$ becomes 2 when R=0. 5. For example, an $s_0$ value is determined such that bits in which indexes are {13,11,7,12,10,9,6} become $n_s$=3 when J=2 ($\mathcal{X}_s$={15,14}), and $s_0$, $s_1$, $s_2$ values are determined such that bits in which indexes are {7, 9, 6, 5, 3} become $n_s$=3 when J=6 ($\mathcal{X}_s$={15, 14, 13, 11, 12, 10}).

As in puncturing, a set of adjacent path indexes excluding a bit $i(i \in \mathcal{A}_h)$=[$b_{n-1} \ldots b_1 b_0$]($b_i \in$ {0,1}) included in $\mathcal{A}_h$, which is encountered during a VN update process, is represented as $g_i$={i−$h_j \cdot 2^j$: $j \in$ {0, 1, . . . , n−1}}\{i}. As described above, when $g_i \cap \mathcal{A}_h = \emptyset$, a diversity-2 is not guaranteed, and a "depth-2 polarization" update process therefor is traced.

TABLE 10

Adjacent path indexes of bits included in $\mathcal{A}_h$ when N = 16, J = 2 ($\mathcal{X}_s$ = {14, 15})

| Index | Binary | Depth-1 | Depth-2 | Depth-3 | Depth-4 |
|---|---|---|---|---|---|
| 13 | 1101 | 5 | 9 | | 12 |
| 11 | 1011 | 3 | | 9 | 10 |
| 7 | 0111 | | 3 | 5 | 6 |
| 12 | 1100 | 4 | 8 | | |
| 10 | 1010 | 2 | | 8 | |
| 9 | 1001 | 1 | | | 8 |
| 6 | 0110 | | 2 | 4 | |

For example, an information set of a polar code in which N=16,l=2 is $\mathcal{X}_h$={13,11,7, 12, 10, 9, 6}, and $g_{13}$={5, 9, 12}, $g_{11}$={3, 9, 10}, $g_7$={3, 5, 6}, $g_{12}$={4, 8}, $g_{10}$={2, 8}, $g_9$={1, 8}, $g_6$={2,4}. First, a bit s o to be moved first is to be determined. Here, a depth-2 diversity is to be investigated and determined for a case where $\mathcal{X}_s$={15,14}, $\mathcal{X}_B$={0, 1, 2, 4, 8, 3, 5, 6}\$s_0$ and $\mathcal{X}_A$={13,11, 7, 12, 10, 9} U s o , and a candidate set of $s_0$ is $s_0$={0, 1, 2, 4, 8, 3, 5, 6}. In other words, $S_i$ is an index set of candidate bits for determining an $s_i$ value. Because at least one bit is included in $\mathcal{A}_h$ for $g_{13}$, $g_{11}$, $g_7$, it is assumed that a diversity-2 is guaranteed. However, for $g_{12}$, $g_{10}$, $g_9$, $g_6$, all elements are included in $\mathcal{A}_h^c$, and thus a diversity-2 is not guaranteed, and diversity trace up to depth-2 polarization is performed therefor in an order of a code sequence $C_N$ (e.g., (12,10,9,6)). As in the puncturing, a $s_i$ value is determined to maximize a diversity thereof.

For a bit in which an index is 12, a fading stochastic variable updated after a depth-2 polarization process is performed is as follows.

$$s_{12,2}=(s_{12,0}+s_{4,0})+(s_{8,0}+s_{0,0})$$

Here, $s_{12,0}$=A and $s_{4,0}$, $s_{0,0}$, $s_{8,0}$ are initially B, an initial stochastic variable that is not moved is A+B. Also, $n_s$ calculated during a depth-2 intermediate stage does not deteriorate even when any one of the bits is moved, and thus $s_0$(={0, 1, 2, 4, 8, 3, 5, 6}) is maintained. Next, a bit in which an index is 10 is $s_{10,2}=(s_{10,0}+s_{2,0})(s_{14,0}+s_{6,0})$, and $s_{10,0}$=A, Y=1. As a result, $s_{10,2}=s_{10,0}(=A)+s_{2,0}(\therefore Y\cdot B=Y, Y+B=Y)$. $s_{10,2}$=A+B when not moved, but when 2 is moved, $s_{10,2}$=A and thus a depth-2 intermediate diversity deteriorates, and thus 2 is removed from $s_0$($s_0$={0, 1, 4, 8, 3, 5, 6}). For a bit in which an index is $s_{9,2}=(s_{9,0}+s_{1,0})(s_{13,0}+s_{5,0})$, and $s_{9,0}=s_{13,0}$A, and thus a $s_{9,2}$ stochastic variable when not moved is $s_{9,2}$=A+$(s_{1,0}+s_{5,0})$=B+A. Here, when a bit in which an index is 1 or 5 is moved, deterioration to $s_{9,2}$=A+AB=A occurs, and thus 1 and 5 are removed from $s_0$($s_0$={0, 4, 8, 3, 6}). Lastly, a depth-2 diversity of a bit in which an index is 6 is provided as $s_{6,2}=(s_{6,0}+s_{14,0})(s_{2,0}+s_{10,0})$, and $s_{14,0}$=Y=1$s_{10,0}$=A and thus $s_{9,2}$ when not moved is $s_{9,2}=s_{6,2}+(s_{2,0})\cdot$A=B. In this case, an intermediate stage diversity does not deteriorate even when any bit is moved, and thus $s_0$ is maintained. The above process is a process of removing bits inducing deterioration of $n_s$ during a depth-2 polarization process.

During a following process, a bit having a diversity-2 is searched for through fine-tuning (i.e., observation of depth-3 update or greater). Bits in which indexes are 12, 10, and 9 satisfy a diversity-2 at a depth-2. However, a bit in which an index is 6 does not guarantee a diversity-2 at a depth-2 without being moved. This is because $s_{6,2}[s_{6,0}s_{14,0}]+[s_{2,0}s_{10,0}]=s_{6,0}+AB=s_{6,0}(=B)$. Thus, a depth is expanded to a depth-3. $s_{4,2}(s_{4,0}+s_{12,0})+(s_{0,0}+s_{8,0})$ is encountered at the depth-3, and when no bit is moved, $s_{4,2}$ includes A, but when "4" is moved, A+B and thus a diversity-2 is satisfied. Accordingly, $s_0$=4.

TABLE 11

Adjacent path indexes of bits included in $\mathcal{A}_h$ when N = 16, J = 4 ($\mathcal{S}$ = {11, 13, 14, 15})

| Index | Binary | Depth-1 | Depth-2 | Depth-3 | Depth-4 |
|---|---|---|---|---|---|
| 7 | 0111 | | 3 | 5 | 6 |
| 12 | 1100 | 4 | 8 | | |
| 10 | 1010 | 2 | | 8 | |
| 9 | 1001 | 1 | | | 8 |
| 6 | 0110 | | 2 | 4 | |
| 5 | 0101 | | 1 | | 4 |

For example, an information set of a polar code in which N=16, J=4 is $\mathcal{A}_h$={7,1 2,1 0, 9, 6, 5}, and $g_7$={3, 5,6}, $g_{12}$={4, 8}, $g_{10}$={2,8}, $g_9$={1, 8}, $g_6$={2, 4}, $g_5$={1, 4}. Also, $\mathcal{S}$ ={15, 14, 13, 11}, $\mathcal{X}_B$={0,1,2,8,3,5,6}\$s_1$ and $\mathcal{X}_A$={13,11, 7, 12, 10, 9, 4}∪$s_1$, and a candidate set of $s_1$ is $s_1$={0, 1, 2, 8, 3, 5, 6}. Because at least one bit is included in $\mathcal{A}_h$ for $g_7$, it is assumed that a diversity-2 is guaranteed. However, for $g_{12}$, $g_{10}$, $g_9$, $g_6$, $g_5$, all bits are included in $\mathcal{A}_h^c$, and thus a diversity-2 is not guaranteed, and diversity trace up to depth-2 polarization is performed therefor in an order of a code sequence $C_N$.

First, a bit in which an index is 12 is $s_{12,2}(s_{12,0}+s_{4,0})+(s_{8,0}+s_{0,0})$ when a depth-2 polarization process is performed. $s_{12,0}$=A and $s_{0,0}$, $s_{4,0}$, $s_{8,0}$ that is not moved is B, and thus an initial stochastic variable is A+B. Also, $n_s$ of a depth-2 intermediate stage does not deteriorate even when any bit is moved, and thus $S_1$(={0, 1, 2, 8, 3, 5, 6}) is maintained. Next, a bit in which an index is 10 is $s_{10,2}=(s_{10,0}+s_{2,0})(s_{14,0}+s_{6,0})$. $s_{10,0}$=A, $s_{14,0}$=Y−1 and $s_{2,0}$, $s_{16,0}$ that is not moved is B, and thus A+B. Deterioration occurs when $s_{9,0}$ is moved, and thus 2 is removed from $s_1$. A bit index 6 does not affect a change in $n_s$ even when moved from B to A, and thus is maintained. ($s_1$={0, 1, 8, 3, 5, 6}). Next, a bit in which an index is 9 is $s_{9,2}=(s_{9,0}+s_{1,0})(s_{13,0}+s_{5,0})$. $s_{9,0}$=A, $s_{13,0}$=Y and $s_{1,0}$, $s_{5,0}$=AB when not moved, and thus B+A. Deterioration occurs when $s_{1,0}$ is moved, and thus 1 is removed from $s_1$. $n_s$ is not affected even when 5 is moved, and thus the electronic device according to an embodiment of the disclosure maintains 5 ($s_1$={0, 8, 3, 5, 6}). Bits in which indexes are 6 and 5 are $s_{6,2}=(s_{6,0}+s_{14,0})+(s_{2,0}s_{10,0})$ and $s_{5,2}=(s_{5,0}s_{13,0})+(s_{1,0}s_{9,0})$, and because $s_{14,0}$=Y=1, $s_{10,0}$=B, $s_{9,0}$=B and $s_{6,0}$=B when not moved, $s_{6,2}$=B . There is no bit inducing deterioration of $n_s$ , and thus 6 does not change $S_1$. For an index $s_{13,0}$=Y=1, $s_{9,0}$=A and $s_{1,0}=s_{5,0}$=B when not moved, and thus $s_{5,2}$=B. There is no bit inducing deterioration of $n_s$ when moved, and thus the bit is maintained ($s_1$={0, 8, 3, 5, 6}). Through the above process, bits inducing deterioration of $n_s$ during a depth-2 polarization process may be removed.

The electronic device according to an embodiment of the disclosure may determine a movement bit for achieving a diversity-2 by observing depth-3 update or greater during a following process. For bit indexes 7, 12, 10, and 9, a diversity-2 may be achieved at a depth-2. However, a diversity-2 is not guaranteed at a depth-2 without movement of indexes 6 and 5.

6 encounters $(s_{4,0}s_{12,0})+(s_{0,0}s_{8,0})=A+(s_{0,0}\cdot s_{8,0})=A+B$ at a depth-3 through a VN operation, and thus $n_s$=3 is achieved. On the other hand, 5 (B) encounters $(s_{7,0}s_{15,0})+(s_{3,0}s_{11,0})=A+s_{3,0}$ at a depth-3. $s_{3,0}$ is updated to AB through a CN operation when moved to A, and thus 3 is not moved ($S_1$={0,8, 5, 6}). At this time, 5 is not increased to $n_s$=3, and thus the electronic device may observe depth-4 update. $(s_{4,0}s_{12,0})+(s_{0,0}s_{8,0})=A+(s_{0,0}\cdot s_{8,0})$ at a depth-4, and degrade of n s occurs when one of the bits is moved, and thus 0 and 8 may be excluded from $S_1$. $S_1$ updated through the above process is $S_1$={5, 6}, and a bit having low reliability thereamong may be selected as $s_i$ .

In conclusion, a bit inducing $n_s$ deterioration is excluded from a candidate during a depth-2 polarization process, and $s_i$ values may be determined through a method of guaranteeing $n_s$=3 during polarization after a depth-3. The electronic device according to an embodiment of the disclosure may recursively perform the above method to determine $s_0$=4, $s_1$=5, $s_2$=1, $s_3$=0.

To operate the puncturing of 1) and the shortening of 2) at once, an "auxiliary sequence" may be defined, and a unified auxiliary sequence may be used by concatenating two auxiliary sequences formed through the above two processes. For example, a front part of an auxiliary sequence $T_N$ may be used for the puncturing and the rear part may be used for the shortening. When N=16 , $T_{16}$=[11 10 14 15 4 5 1 0]. For example, when 4 bits are punctured, bits having indexes included in $T_{16}$[0:1] are bits moved to a resource B, and when 6 bits are shortened, bits of $T_{16}$[4:6] are bits moved to a resource A. A sequence determination method for shortening may be optimized through depth-2 $n_s$ deterioration prevention and n s upgrade method at a subsequent depth described above, or may be directly determined as the one's complement sequence of a sequence determined for puncturing.

For example, a sub-auxiliary sequence for the puncturing is [11 10 14 15], but the one's complements of the indexes are [4 5 1 0], and thus as an index sequence as the above method empirically constructed. In other words, an auxiliary sequence $T_N$ defined for a code length N may be configured by a concatenation $T_N=[R_N|S_N]$ of an auxiliary sequence $R_N$ for puncturing and an auxiliary sequence $S_N$ or shortening. In other words, $$R_N = \left[r_0\ r_1\ \cdots\ r_{\frac{N}{4}-1}\right], S_N = \left[s_0\ s_1\ \cdots\ s_{\frac{N}{4}-1}\right].$$

Figure 32:
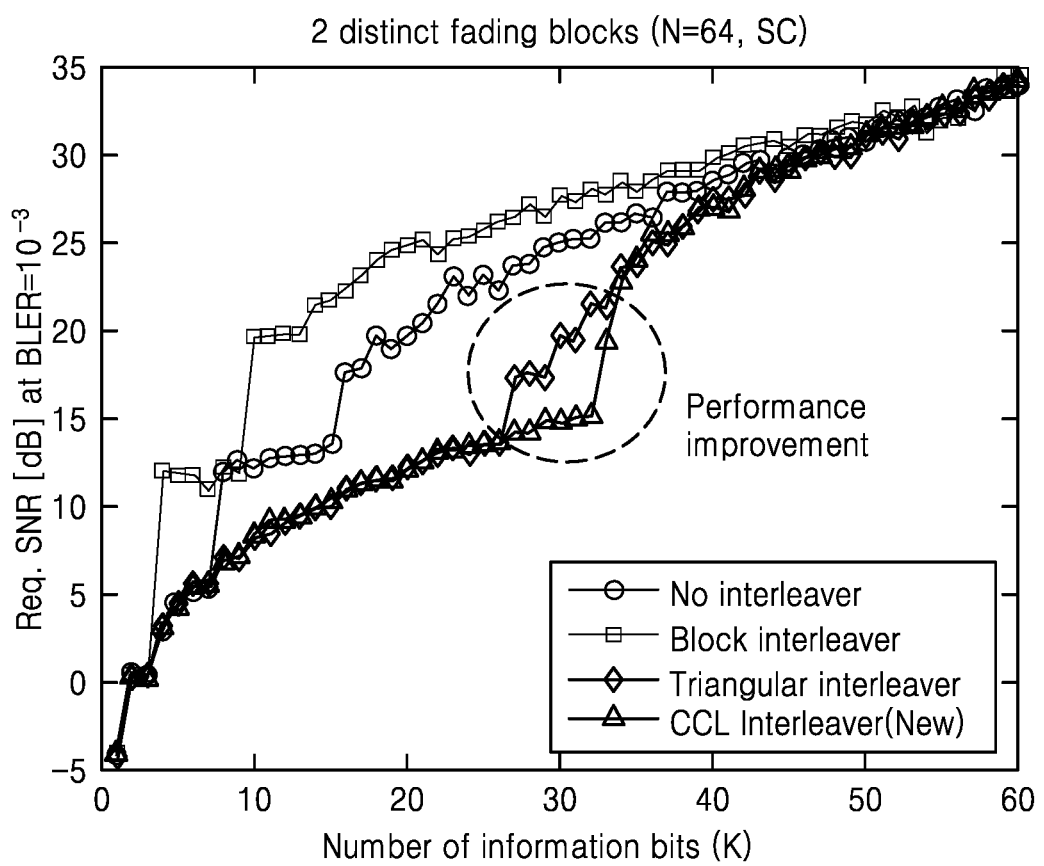
FIG. 32 is a graph showing a required SNR [dB] achieving BLER=0.1% according to the number of information bits, according to an interleaver type, under successive cancellation (SC) decoding according to an embodiment of the disclosure.

FIG. 32 is a graph showing a required SNR [dB] achieving BLER=0.1% according to the number of information bits, according to an interleaver type, under SC decoding. A performance of an interleaver is higher when a y value is smaller according to an embodiment of the disclosure.

Referring to FIG. 32, N=64, and a 2-block fading channel are assumed. Referring to FIG. 32, it is identified that a performance of an interleaving method according to an embodiment of the disclosure is most excellent compared to a performance of a conventional interleaver described above. In particular, an interleaver according to an embodiment of the disclosure has a high performance gain at an intermediate code rate that is a code rate area of interest, compared to a triangular interleaver that exhibits a best performance in the related art. In detail, a performance gain around 5 dB may be secured for a certain code parameter, and the interleaver according to an embodiment of the disclosure guarantees a diversity-2 in a corresponding region, whereas conventional interleavers have relatively low performances as a bit having a low diversity is included in an information set.

Figure 33:
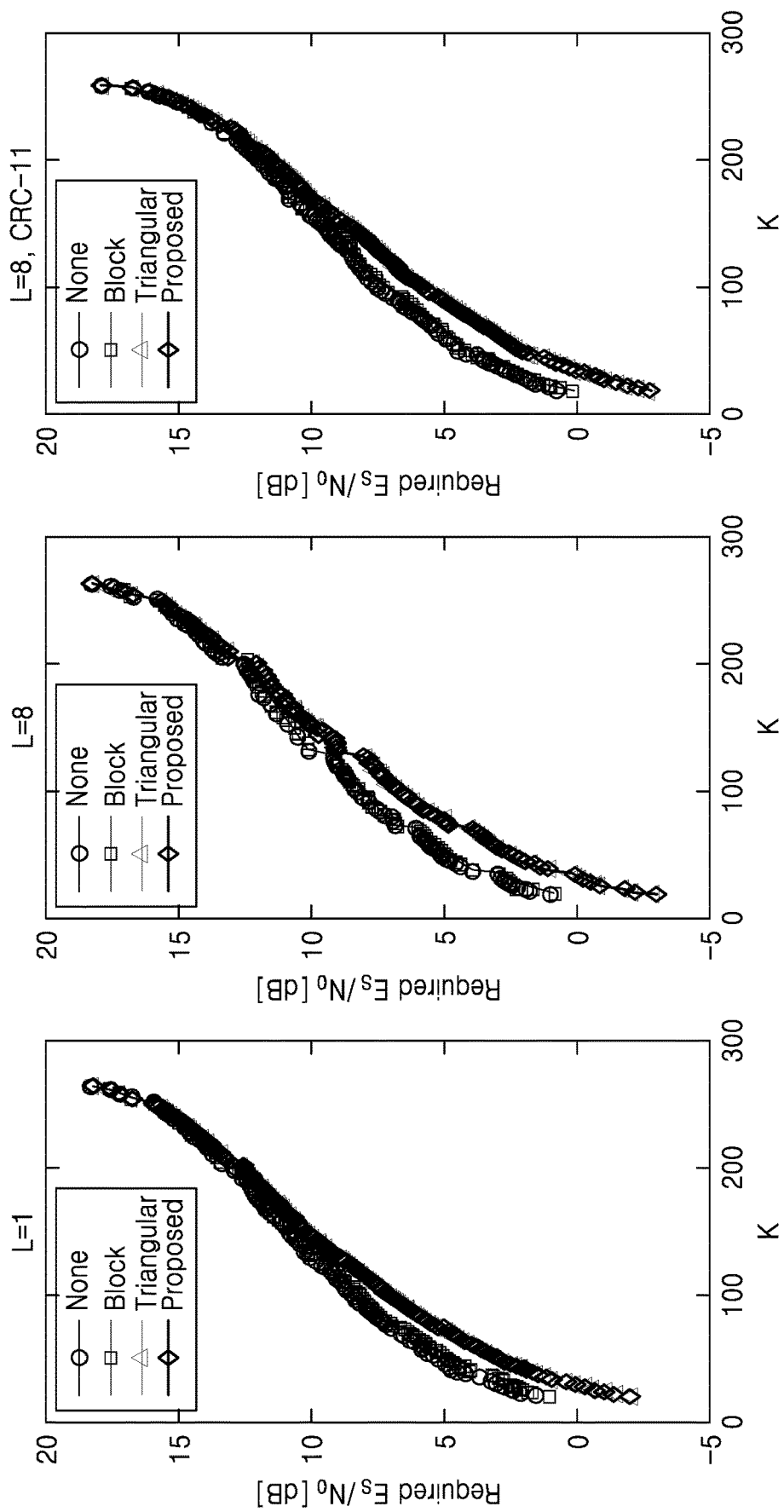
FIG. 33 is a graph for describing a performance of an interleaving method in an AWGNC, according to an embodiment of the disclosure.

FIG. 33 is a graph for describing a performance of an interleaving method in an AWGNC, according to an embodiment of the disclosure.

Referring to FIG. 33, performances of SC decoding (L=1), SCL decoding (L=8), and SCL decoding (L=8) using a 11-bit CRC code are identified when N=512 and 16 QAM.

More particularly, a decoding performance indicates a required SNR [dB] achieving BLER=0.1%, and the smaller the value, the higher the performance. Through the graph of FIG. 33, it is identified that a performance of a block interleaver is slightly greater when an interleaver is not applied, but a performance of a triangular interleaver is noticeably greater. This is because the triangular interleaver satisfactorily distributes a fading effect in a symbol in overall during high-order modulation. Also, it is identified that an interleaver according to an embodiment of the disclosure maintains an almost the same level of performance as the triangular interleaver.

Figure 34:
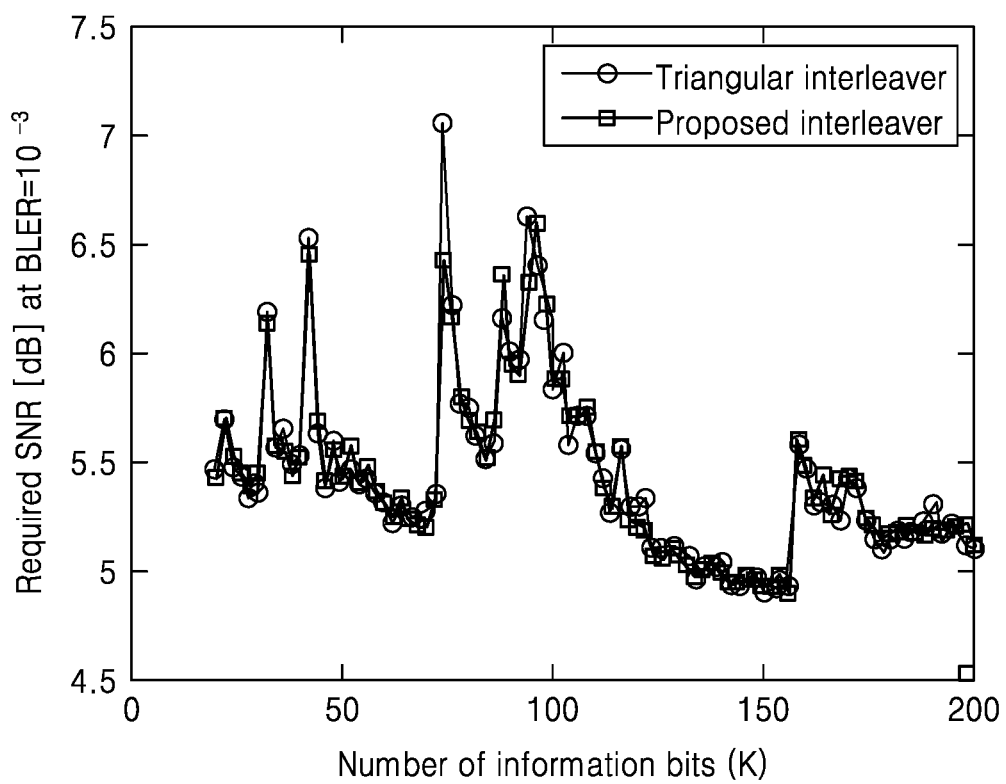
FIG. 34 is a graph for describing a performance of an interleaving method when rate-matching is considered in an AWGNC according to an embodiment of the disclosure.

FIG. 34 is a graph for describing a performance of an interleaving method when rate-matching is considered in an AWGNC according to an embodiment of the disclosure.

In detail, a decoding performance is shown according to a data size (K) when R=0.33, and for example, when K=20, E=K/R=60, and thus the graph indicates a required SNR [dB] achieving a BLER 0.1% when 4 bits are punctured from N=64. Even when rate-matching is considered, it is identified that a performance of the interleaver according to an embodiment of the disclosure in the AWGNC maintains a same level as the triangular interleaver according to an embodiment of the disclosure.

Figure 35:
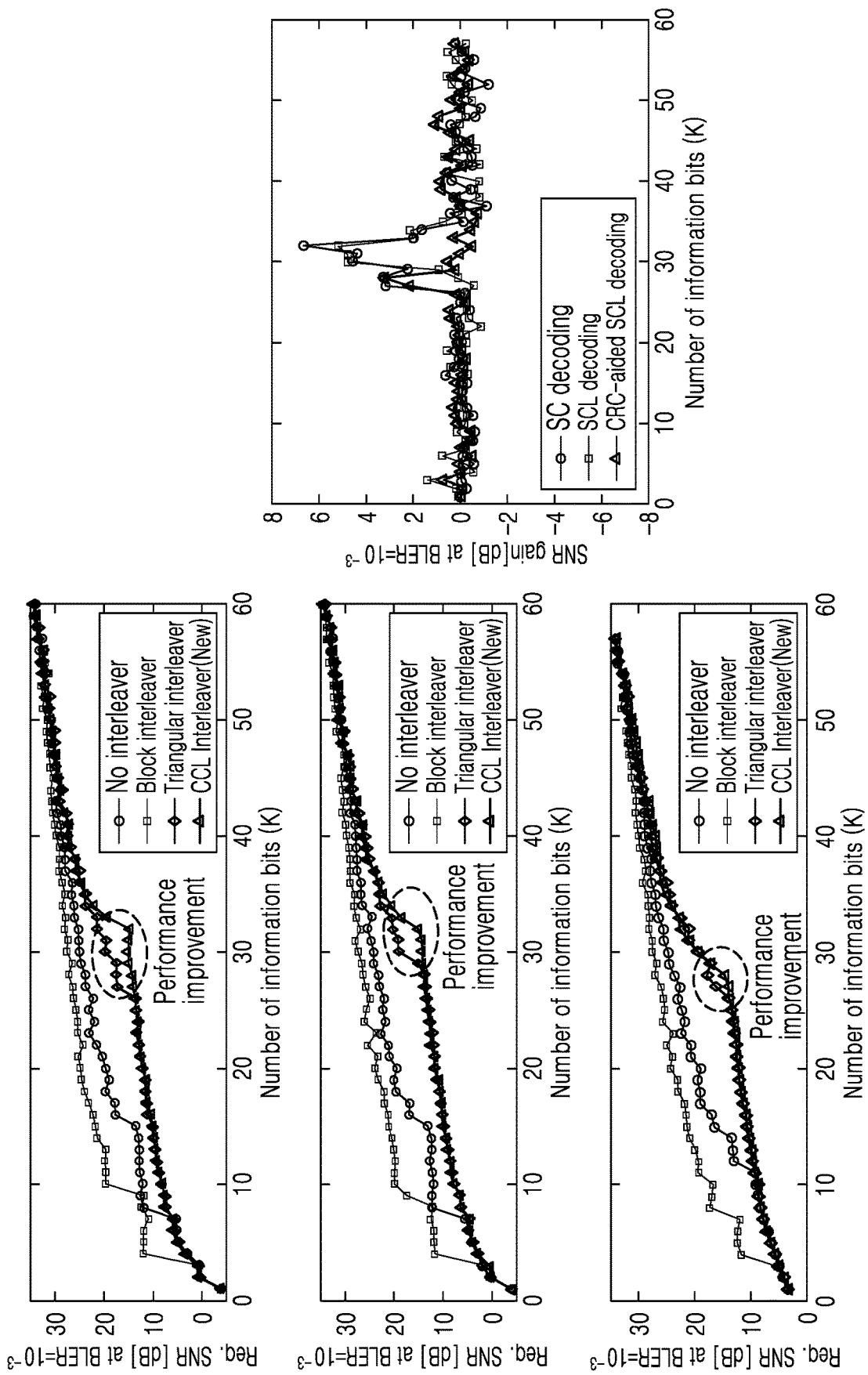
FIG. 35 is a graph for describing a performance of an interleaving method according to various decoding methods according to an embodiment of the disclosure.

FIG. 35 is a graph for describing a performance of an interleaving method according to various decoding methods according to an embodiment of the disclosure.

FIG. 35 illustrates a graph of a required SNR achieving BLER 0.1% for each code rate, according to various decoding methods. It is identified that an interleaver according to an embodiment of the disclosure has an excellent performance of SC decoding compared to conventional interleaver types, and maintains a performance even in SCL and CRC-aided SCL. Also, when a code length increases, an area of the interleaver according to an embodiment of the disclosure, having a high diversity, increases compared to a conventional triangular interleaver, and thus a performance gain width is also increased.

FIG. 36 is a diagram showing diversities included in source bits in an order of a code sequence $C_N$, according to an interleaver type and the number of punctured bits according to an embodiment of the disclosure.

Referring to FIG. 36, N=32, $|X_p|\in\{0,2,4,\ldots,14\}$) is assumed, and a diversity and $n_s$ included in source bits of a block channel interleaver, a triangular channel interleaver, and an interleaver according to an embodiment of the disclosure are provided in an order of a code sequence $C_N$.

In detail, a first column shows an index of each bit having high reliability, for each interleaver type, in a descending order and a second column shows $n_s$ when there is no rate-matching, and third through ninth columns show $n_s$ during rate-matching. Regarding a diversity (or $n_s$) analysis result $|X_p|=0$ (i.e., no rate-matching; plain polar code), the interleaver according to an embodiment of the disclosure has a diversity-2 when R≤0.5 as described above. In other words, all bits in an information set $\mathcal{A}$ has $n_s=3$ when R=0.5. Not only when the rate-matching is not considered, but also when several bits are punctured, the interleaver according to an embodiment of the disclosure may allocate high $n_s$ to information bits most stably. For example, a triangular interleaver guarantees a diversity-2 only up to K=6 when the number of punctured bits is 12 or 14, but the interleaver according to an embodiment of the disclosure guarantees a diversity-2 up to K=8.

Figure 37:
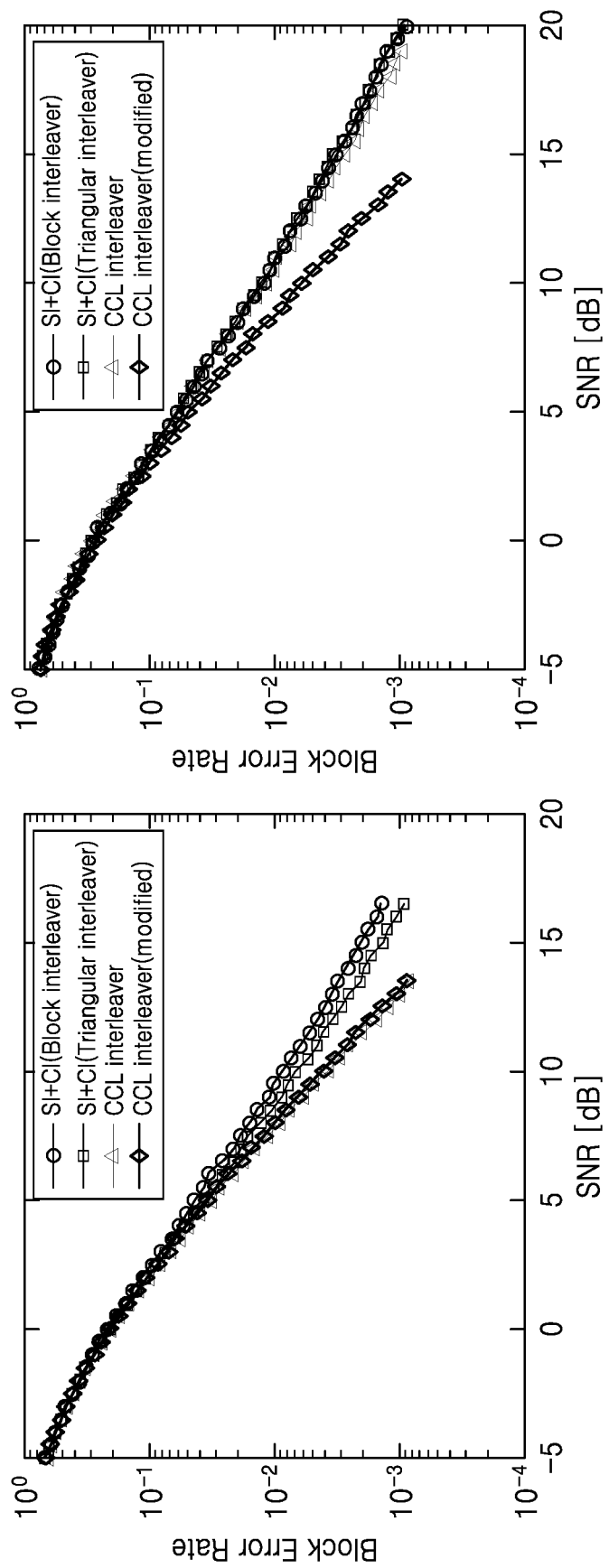
FIG. 37 is a graph for describing a decoding performance according to an interleaver type according to an embodiment of the disclosure.

FIG. 37 is a graph for describing a decoding performance according to an interleaver type according to an embodiment of the disclosure.

Referring to FIG. 37, an SNR vs BLER graph is illustrated according to an interleaver type when $|X_p|=20,40$. In particular, a left graph shows a performance of a (108,36) code and a right graph shows a performance of a (88,33) polar code. It is identified that an interleaver according to an embodiment of the disclosure, which is modified at a corresponding parameter, has a steeper curve than a conventional technique, and in particular, solely guarantees a diversity-2 for a (88,33) polar code. Here, a required SNR gain achieving BLER=0.1% is about 6 to 7 dB.

Figure 38:
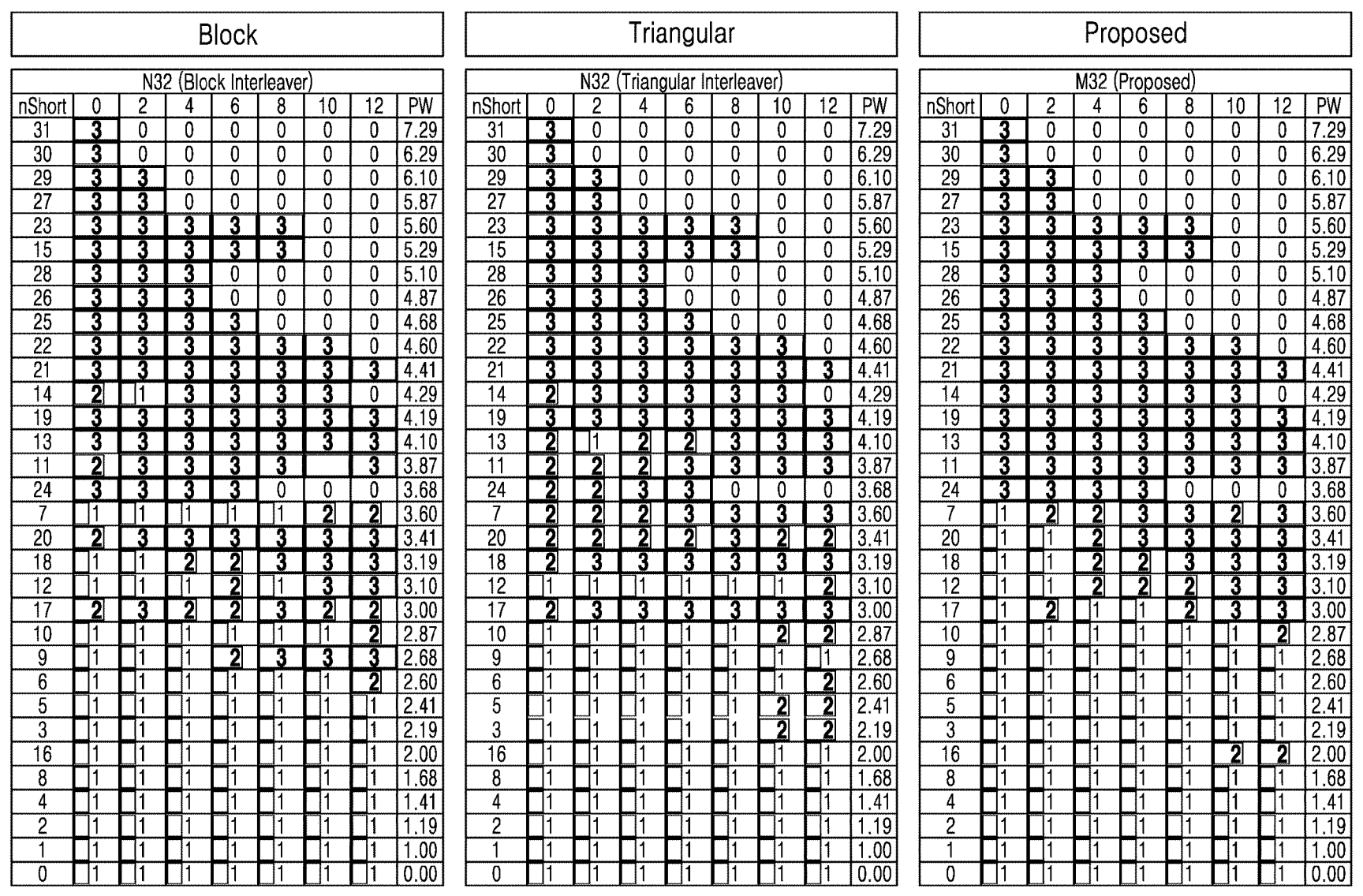

FIG. 38 is a diagram showing diversities included in source bits in an order of a code sequence $C_N$, according to an interleaver type and the number of shortened bits according to an embodiment of the disclosure.

Referring to FIG. 38, diversities $n_s$ included in source bits for a block channel interleaver, a triangular channel interleaver, and an interleaver according to an embodiment of the disclosure are illustrated in an order of a code sequence $C_N$ when N=32 and shortening of $|X_s|\{0,2,4,\ldots,14\}$ is applied.

When there is no rate-matching, the interleaver according to an embodiment of the disclosure always has a diversity-2 when R=0.5. In other words, all bits in an information set $\mathcal{A}_h$ has $n_s=3$ when R=0.5. Also, the interleaver according to an embodiment of the disclosure has the maximum number $K_{max}$ of information bits in various shortening environments compared to the block interleaver or triangular interleaver, and thus may secure a high performance gain.

Figure 39:
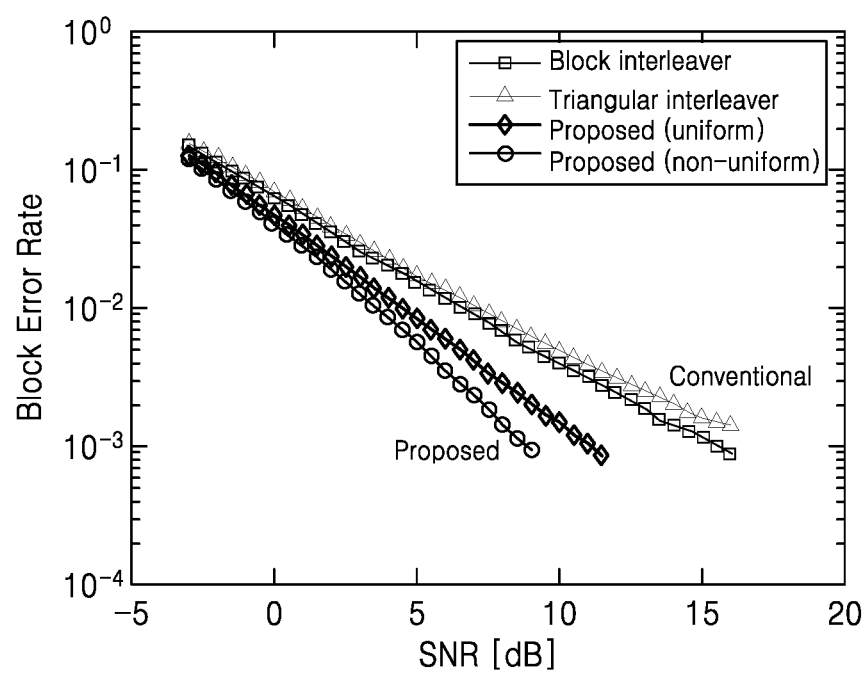
FIG. 39 is a graph for analyzing a shortening performance of a polar code according to an embodiment of the disclosure.

FIG. 39 is a graph for analyzing a shortening performance of a polar code according to an embodiment of the disclosure.

Referring to FIG. 39, a shortening performance of a (20,9) polar code is illustrated for N=32, | $\mathcal{X}_s$|=12, and it is identified that, compared to conventional techniques, an interleaver according to an embodiment of the disclosure has a diversity-2, and thus obtains a high performance gain.

Figure 40:
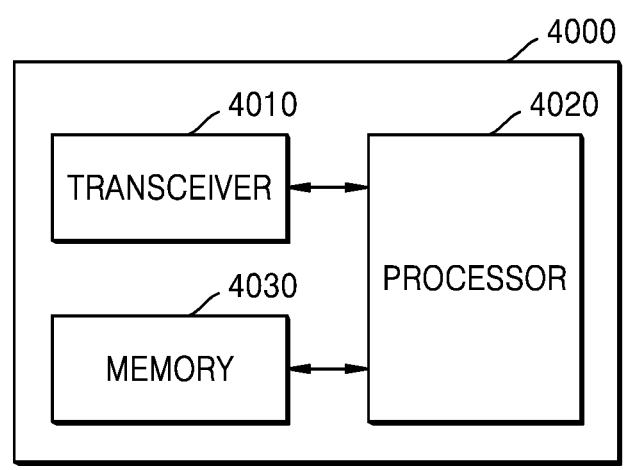
FIG. 40 is a block diagram of an electronic device for transmitting a signal to which an interleaving method is applied according to an embodiment of the disclosure.

FIG. 40 is a block diagram of an electronic device for transmitting a signal to which an interleaving method is applied according to an embodiment of the disclosure.

Referring to FIG. 40, an electronic device 4000 may include a transceiver 4010, a processor 4020, and a memory 4030. The transceiver 4010, processor 4020, and memory 4030 of the electronic device 4000 may operate according to a method by which the electronic device 4000 transmits a polar code, described above. However, the components of the electronic device 4000 are not limited thereto. For example, the electronic device 4000 may be implemented by more components or fewer components than those described above. According to an embodiment of the disclosure, the transceiver 4010, processor 4020, and the memory 4030 may be implemented as a single chip. Also, the processor 4020 may include one or more processors.

The transceiver 4010 is a collective term of a receiver of the electronic device 4000 and a transmitter of the electronic device 4000, and may transmit/receive a signal to/from another electronic device or a network entity. The signal transmitted/received to/from the other electronic device or network entity may include control information and data. In this regard, the transceiver 4010 may include a RF transmitter for up-converting and amplifying a frequency of a transmitted signal, and a RF receiver for amplifying low-noise and down-converting a frequency of a received signal. However, this is only an example of the transceiver 4010 and components of the transceiver 4010 are not limited to the RF transmitter and the RF receiver.

The transceiver 4010 may perform functions for transmitting or receiving a signal through a wireless channel. For example, the transceiver 4010 may receive a signal through a wireless channel and output the signal to the processor 4020, or transmit a signal output from the processor 4020 through a wireless channel.

The memory 4030 may store a program and data required for operations of the electronic device 4000. Also, the memory 4030 may store control information or data included in a signal obtained from the other electronic device or the network entity. The memory 4030 may be a storage medium, such as read-only memory (ROM), random-access memory (RAM), a hard disk, a CD-ROM, and a DVD, or a combination of storage media. Also, the memory 4030 may not be present separately but may be included in the processor 4020. The memory 4030 may be configured in a volatile memory, a nonvolatile memory, or a combination of a volatile memory and a nonvolatile memory. Also, the memory 4030 may provide the stored data upon request by the processor 4020.

The processor 4020 may control a series of processes such that the electronic device 4000 operates according to an embodiment of the disclosure described above.

The processor 4020 may identify BD symmetry for indexes of codeword bits configuring a polar code sequence. When indexes of the codeword bits satisfy the BD symmetry, the processor 4020 may perform interleaving on codewords ($x_0$, $x_1$, . . . , $x_{N-1}$) arranged in an index ascending order, based on reliability of source bits corresponding to the codeword bits. Here, to align a high diversity to information bits of an AWGN code, a method of evaluating diversities of source bits, based on Boolean approximation, is used first for fading events of blocks, and a BD-symmetric code sequence is used as an interleaver sequence such that the information bits have high diversities. The processor 4020 may allocate interleaved codeword bits to the blocks, respectively. The processor 4020 may transmit at least one symbol generated as a result of performing modulation on the interleaved codeword bits for each block, based on the allocation, on at least one resource block corresponding to each of the blocks.

The processor 4020 according to an embodiment may identify codeword bit pairs breaking the BD symmetry in each bit pattern, for codeword bit patterns allocated to a block 1 and a block 2. The processor 4020 may permutate the identified codeword bits with each other. Interleaving may be performed on a polar code sequence obtained by permutating the identified codeword bits with each other.

When puncturing or shortening is applied to the polar code sequence, the processor 4020 may determine candidate codeword bits movable from a first block to a second block from among the blocks. The processor 4020 may evaluate and identify a change in a diversity value for a case where each of the determined candidate codeword bits move. The processor 4020 may determine at least one codeword bit that is a moving target from among the candidate codeword bits, based on the identified change in the diversity value.

For example, the processor 4020 may obtain a diversity value during a depth-2 polarization process for a case where codeword bits included in the determined sequence each move. The processor 4020 may compare the obtained diversity value with a diversity value during a depth d (d=1,2, . . . , n) polarization process before each codeword bit included in the determined sequence moves. A bit in which a diversity value is increased or maintained during movement, from among the codeword bits included in the determined sequence, may be determined as a bit that is the moving target, based on a result of the comparing.

Also, the processor 4020 may obtain a diversity value during a depth d+1 polarization process when a bit in which a diversity value is increased or maintained during the movement is not identified during the depth d (d=1,2, . . . , n) polarization process.

The processor 4020 according to an embodiment of the disclosure may allocate the interleaved codeword bits to the blocks, respectively, based on an auxiliary sequence including the determined at least one codeword bit. The processor 4020 according to an embodiment of the disclosure may perform interleaving using a code sequence based on reliability of at least one codeword bit that is the moving target and source bits corresponding to the codeword bits.

Figure 41:
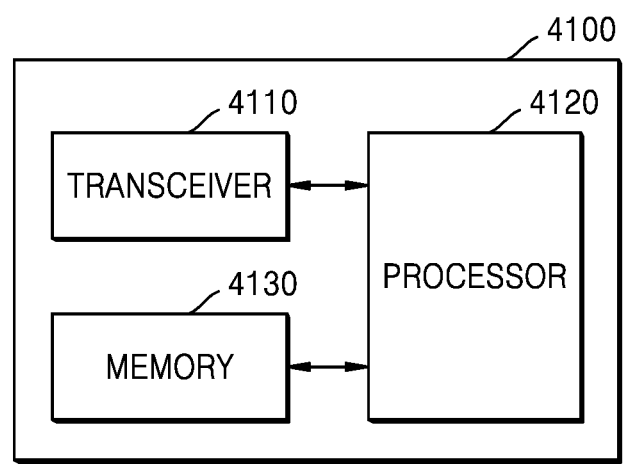
FIG. 41 is a block diagram of an electronic device for receiving a signal to which an interleaving method is applied according to an embodiment of the disclosure.

FIG. 41 is a block diagram of an electronic device for receiving a signal to which an interleaving method is applied according to an embodiment of the disclosure.

Referring to FIG. 41, an electronic device 4100 may include a transceiver 4110, a processor 4120, and a memory 4130. The transceiver 4110, processor 4120, and memory 4130 of the electronic device 4100 may operate according to a method by which the electronic device 4100 transmits a polar code, described above. However, the components of the electronic device 4100 are not limited thereto. For example, the electronic device 4100 may be implemented by more components or fewer components than those described above. According to an embodiment of the disclosure, the transceiver 4110, processor 4120, and the memory 4130 may be implemented as a single chip. Also, the processor 4120 may include one or more processors.

The transceiver 4110 is a collective term of a receiver of the electronic device 4100 and a transmitter of the electronic device 4100, and may transmit/receive a signal to/from another electronic device or a network entity. The signal transmitted/received to/from the other electronic device or network entity may include control information and data. In this regard, the transceiver 4110 may include a RF transmitter for up-converting and amplifying a frequency of a transmitted signal, and a RF receiver for amplifying low-noise and down-converting a frequency of a received signal. However, this is only an example of the transceiver 4110 and components of the transceiver 4110 are not limited to the RF transmitter and the RF receiver.

The transceiver 4110 may perform functions for transmitting or receiving a signal through a wireless channel. For example, the transceiver 4110 may receive a signal through a wireless channel and output the signal to the processor 4120, or transmit a signal output from the processor 4120 through a wireless channel.

The memory 4130 may store a program and data required for operations of the electronic device 4100. Also, the memory 4130 may store control information or data included in a signal obtained from the other electronic device or the network entity. The memory 4130 may be a storage medium, such as read-only memory (ROM), random-access memory (RAM), a hard disk, a CD-ROM, and a DVD, or a combination of storage media. Also, the memory 4130 may not be present separately but may be included in the processor 4120. The memory 4130 may be configured in a volatile memory, a nonvolatile memory, or a combination of a volatile memory and a nonvolatile memory. Also, the memory 4130 may provide the stored data upon request by the processor 4120.

The processor 4120 may control a series of processes such that the electronic device 4100 operates according to an embodiment of the disclosure described above.

The processor 4120 may obtain codeword bits by performing demodulation on a signal received on each of at least one resource block from another electronic device (e.g., the electronic device 4000).

The processor 4120 may perform deinterleaving on the obtained codeword bits, based on reliability of source bits corresponding to the obtained codeword bits. The processor 4120 may perform decoding on a polar code sequence including the deinterleaved codeword bits.

When puncturing or shortening is applied to the polar code sequence by the other electronic device (e.g., the electronic device 4000), the processor 4120 may identify at least one codeword bit determined as a moving target from among candidate codeword bits, based on a change in a diversity value for a case where each candidate codeword bit movable from a first block to a second block from among blocks moves. The processor 4120 may perform the deinterleaving on the codeword bits, based on the at least one identified codeword bit and the polar code sequence.

An interleaver according to an embodiment of the disclosure may supplement BICM structural vulnerability of a conventional 5G polar code, thereby obtaining a performance improvement effect according to a diversity effect of a block fading channel while maintaining a good performance in an AWGNC. Also, an interleaving method according to an embodiment of the disclosure may secure excellent performances not only for SC decoding, but also for various decoding methods, such as SCL decoding, CRC-aided SCL decoding, and the like. Also, the interleaving method according to an embodiment of the disclosure may secure an excellent performance when rate-matching is applied to not only a fading channel, but also an AWGNC.

A machine-readable storage medium may be provided in the form of a non-transitory storage medium. Here, the "non-transitory storage medium" only denotes a tangible device and does not contain a signal (for example, electromagnetic waves). This term does not distinguish a case where data is stored in the storage medium semi-permanently and a case where the data is stored in the storage medium temporarily. For example, the "non-transitory storage medium" may include a buffer where data is temporarily stored.

According to an embodiment of the disclosure, a method according to various embodiments of the disclosure in the disclosure may be provided by being included in a computer program product. The computer program products are products that can be traded between sellers and buyers. The computer program product may be distributed in a form of machine-readable storage medium (for example, a compact disc read-only memory (CD-ROM)), or distributed (for example, downloaded or uploaded) through an application store or directly or online between two user devices (for example, smart phones). In the case of online distribution, at least a part of the computer program product (for example, a downloadable application) may be at least temporarily generated or temporarily stored in a machine-readable storage medium, such as a server of a manufacturer, a server of an application store, or a memory of a relay server.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A method, performed by a first electronic device, of transmitting a polar code, the method comprising:
   performing interleaving on codeword bits of the polar code, using a polar code sequence based on a reliability of source bits corresponding to the codeword bits;
   allocating the interleaved codeword bits respectively to blocks; and
   transmitting at least one symbol generated by modulating the interleaved codeword bits allocated to the blocks, on at least one resource block corresponding to each of the blocks,
   wherein the reliability of the source bits are related with diversity values of the source bits, and
   wherein the diversity values of the source bits are determined based on stochastic variables of fading events of the blocks represented using a boolean function-based fading approximation.

2. The method of claim 1, further comprising:
   identifying codeword bits breaking binary domination (BD) symmetry between index patterns allocated to a first block and a second block, from among the codeword bits; and
   permutating the identified codeword bits with each other,
   wherein the performing of the interleaving on the codeword bits comprises performing the interleaving on the codeword bits obtained after the permutating, according to the polar code sequence.

3. The method of claim 1, further comprising:
   in case that code modification of puncturing or shortening is applied to the polar code sequence, determining candidate codeword bits movable from a first block to a second block from among the blocks;

identifying a change in a diversity value for a case where the determined candidate codeword bits each move; and determining at least one codeword bit that is a moving target from among the candidate codeword bits, based on the identified change in the diversity value.

4. The method of claim 3, wherein the allocating comprises allocating the interleaved codeword bits to different blocks, based on an auxiliary sequence including the determined at least one codeword bit.

5. The method of claim 3, wherein the performing of the interleaving comprises performing the interleaving, based on a pre-defined auxiliary sequence corresponding to the at least one codeword bit that is the moving target and the codeword bits, and wherein the pre-defined auxiliary sequence is generated by unifying the polar code sequence and an auxiliary sequence.

6. A method, performed by a second electronic device, of receiving a polar code, the method comprising:

receiving at least one symbol from a first electronic device on at least one resource block corresponding to each of blocks;

obtaining codeword bits allocated to the blocks, by performing demodulation on the at least one symbol;

performing deinterleaving on the codeword bits by using a polar code sequence based on a reliability of source bits corresponding to the codeword bits; and performing decoding on a sequence including the deinterleaved codeword bits, wherein the reliability of the source bits are related with diversity values of the source bits, and wherein the diversity values of the source bits are determined based on stochastic variables of fading events of the blocks represented using a boolean function-based fading approximation.

7. The method of claim 6, wherein, in case that the first electronic device has applied code modification of puncturing or shortening to the codeword bits, at least one codeword bit that is a moving target is determined from among candidate codeword bits movable from a first block to a second block from among the blocks, based on a change in a diversity value for a case where each of the candidate codeword bits moves, and wherein the codeword bits obtained as a result of the demodulation have been interleaved based on the polar code sequence and the determined at least one codeword bit.

8. The method of claim 7, wherein the performing of the deinterleaving comprises performing the deinterleaving on codeword bits allocated to different blocks, based on an auxiliary sequence including the determined at least one codeword bit.

9. The method of claim 7, wherein the performing of the deinterleaving comprises performing the deinterleaving on the codeword bits, based on a pre-defined auxiliary sequence corresponding to the at least one codeword bit that is the moving target and the codeword bits, and wherein the pre-defined auxiliary sequence is generated by unifying the polar code sequence and an auxiliary sequence.

10. A first electronic device for transmitting a polar code, the first electronic device comprising:

a transceiver; and at least one processor coupled with the transceiver and configured to:

perform interleaving on codeword bits of the polar code, using a polar code sequence based on a reliability of source bits corresponding to the codeword bits, allocate the interleaved codeword bits respectively to blocks, and transmit at least one symbol generated by modulating the interleaved codeword bits allocated to the blocks, on at least one resource block corresponding to each of the blocks, wherein the reliability of the source bits are related with diversity values of the source bits, and wherein the diversity values of the source bits are determined based on stochastic variables of fading events of the blocks represented using a boolean function-based fading approximation.

11. The first electronic device of claim 10, wherein the at least one processor is further configured to:

identify codeword bits breaking binary domination (BD) symmetry between index patterns allocated to a first block and a second block;

permutate the identified codeword bits with each other; and perform the interleaving on codeword bits obtained as a result of permutating the identified codeword bits with each other, according to the polar code sequence.

12. The first electronic device of claim 10, wherein the at least one processor is further configured to:

in case that code modification of puncturing or shortening is applied to the polar code sequence, determine candidate codeword bits movable from a first block to a second block from among the blocks;

identify a change in a diversity value for a case where the determined candidate codeword bits each move; and determine at least one codeword bit that is a moving target from among the candidate codeword bits, based on the identified change in the diversity value.

13. The first electronic device of claim 12, wherein the at least one processor is further configured to allocate the interleaved codeword bits to different blocks, based on an auxiliary sequence including the determined at least one codeword bit.

14. The first electronic device of claim 12, wherein the at least one processor is further configured to perform the interleaving, based on a pre-defined auxiliary sequence corresponding to the at least one codeword bit that is the moving target and the codeword bits, and wherein the pre-defined auxiliary sequence is generated by unifying the polar code sequence and an auxiliary sequence.

15. The first electronic device of claim 12, wherein the at least one processor is further configured to:

obtain a diversity value during a depth-2 polarization process for a case where each of the codeword bits move;

compare the obtained diversity value with a diversity value during a depth d polarization process before the codeword bits included in the determined sequence each move; and determine, as a bit that is the moving target, a bit in which a diversity value is increased or maintained during movement, from among the codeword bits included in the determined sequence, based on a result of the comparison.

16. The first electronic device of claim 15, wherein the at least one processor is further configured to, in case that the bit in which a diversity value is increased or maintained during movement is not identified during the depth d polarization process, obtain a diversity value during a depth d+1 polarization process.

17. A second electronic device for receiving a polar code, the second electronic device comprising:
a transceiver; and
at least one processor connected to the transceiver and configured to:
receive at least one symbol from a first electronic device on at least one resource block corresponding to each of blocks,
obtain codeword bits allocated to the blocks, by performing demodulation on the at least one symbol,
perform deinterleaving on the codeword bits by using a polar code sequence based on a reliability of source bits corresponding to the codeword bits, and
perform decoding on a sequence including the deinterleaved codeword bits,
wherein the reliability of the source bits are related with diversity values of the source bits, and
wherein the diversity values of the source bits are determined based on stochastic variables of fading events of the blocks represented using a Boolean function-based fading approximation.

18. The second electronic device of claim 17,
wherein, in case that the first electronic device has applied code modification of puncturing or shortening to the codeword bits, at least one codeword bit that is a moving target is determined from among candidate codeword bits movable from a first block to a second block from among the blocks, based on a change in a diversity value for a case where each of the candidate codeword bits moves, and
wherein the codeword bits obtained as a result of the demodulation have been interleaved based on the polar code sequence and the determined at least one codeword bit.

19. The second electronic device of claim 18, wherein the at least one processor is further configured to perform the deinterleaving on codeword bits allocated to different blocks, based on an auxiliary sequence including the determined at least one codeword bit.

20. The second electronic device of claim 18,
wherein the at least one processor is further configured to perform the deinterleaving on the codeword bits, based on a pre-defined auxiliary sequence corresponding to the at least one codeword bit that is the moving target and the codeword bits, and
wherein the pre-defined auxiliary sequence is generated by unifying the polar code sequence and an auxiliary sequence.

* * * * *